United States Patent
Toda

(10) Patent No.: US 8,959,415 B2
(45) Date of Patent: Feb. 17, 2015

(54) MEMORY SYSTEM AND MEMORY CONTROLLER

(75) Inventor: Haruki Toda, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 461 days.

(21) Appl. No.: 13/237,418

(22) Filed: Sep. 20, 2011

(65) Prior Publication Data

US 2012/0151123 A1    Jun. 14, 2012

(30) Foreign Application Priority Data

Dec. 8, 2010 (JP) ................................ P2010-273311

(51) Int. Cl.
*G11C 29/00* (2006.01)
*G06F 11/10* (2006.01)
*G11C 11/56* (2006.01)

(52) U.S. Cl.
CPC ............ *G06F 11/1072* (2013.01); *G11C 11/56* (2013.01)
USPC .......................................................... 714/763

(58) Field of Classification Search
CPC . G06F 13/387; G06F 11/1072; G06K 19/067; G06K 19/077; G06K 19/07741; G11C 11/56; G11C 11/5671; G11C 11/5642; G11C 16/0475; G11C 16/24; G11C 16/3404; G11C 2211/5641; G11C 2211/5643; G11C 5/145; G11C 7/02; G11C 7/1012; G11C 7/18; G11C 8/14
USPC .................... 714/763, 777, 746, 721; 711/103
See application file for complete search history.

(56) References Cited

U.S. PATENT DOCUMENTS

| 7,962,838 | B2 | 6/2011 | Toda | |
|---|---|---|---|---|
| 2009/0198881 | A1 | 8/2009 | Toda | |
| 2009/0287975 | A1* | 11/2009 | Kim et al. | ...................... 714/746 |
| 2010/0107039 | A1 | 4/2010 | Toda | |
| 2010/0165730 | A1 | 7/2010 | Sommer et al. | |
| 2010/0211856 | A1* | 8/2010 | Weingarten | ................... 714/777 |
| 2011/0202815 | A1 | 8/2011 | Toda | |
| 2011/0239091 | A1 | 9/2011 | Toda | |

OTHER PUBLICATIONS

U.S. Appl. No. 13/232,312, filed Sep. 14, 2011, Toda.

* cited by examiner

*Primary Examiner* — Guy Lamarre
(74) *Attorney, Agent, or Firm* — Oblon, Spivak, McClelland, Maier & Neustadt, L.L.P.

(57) ABSTRACT

A memory system according to the embodiment comprises a memory device including plural memory cells capable of storing d bits of data and operative to read/write data at every page; and a memory controller operative to control the memory device. The memory controller includes a page buffer operative to hold page data to be read from/written in a page of the memory device and send/receive the page data to/from the memory device, a data processing unit operative to detect and correct an error in the page data by processing target data in a finite field Zp modulo p generated based on the page data (p is a prime that satisfies $2<p<2^d$), and a mapping unit operative to execute mapping of the target data from the data processing unit as page data within the page buffer.

6 Claims, 55 Drawing Sheets

FIG. 3

| L | a:13[16] | b:13[16] | c:13[16] | d:13[16] | e:16 |
|---|---|---|---|---|---|
| p | 13 | 13 | 13 | 13 | - |
| h | 4 | 4 | 4 | 4 | 4(page) |
| M | 36 | 32 | 28 | 24 | 512byte ×4 |
| ε | 1 | 2 | 3 | 4 | 315×4 |
| δ | 9 | 8 | 7 | 6 | 512byte |
| n (= Number of Cells) | 12 | 12 | 12 | 12 | 8191 |
| M/n | 3 | 2.67 | 2.333 | 2 | 2 |
| $\log_2 L$ | 3.7[4] | 3.7[4] | 3.7[4] | 3.7[4] | 4 |
| code(=nh)/M | 1.33 | 1.5 | 1.71 | 2 | 2 |
| ε/n | 0.083 | 0.17 | 0.25 | 0.333 | 0.154 |
| (M/n)/$\log_2 L$ | 0.81[0.75] | 0.72[0.67] | 0.63[0.58] | 0.54[0.5] | 0.5 |

FIG. 4

| L | a:7[8] | b:7[8] | c:7[8] | d:8 |
|---|---|---|---|---|
| p | 7 | 7 | 7 | - |
| h | 3 | 3 | 3 | 3page |
| M | 9 | 6 | 3 | 512byte ×3 |
| ε | 1 | 2 | 3 | 315×3 |
| δ | 3 | 2 | 1 | 512byte |
| n (= Number of Cells) | 6 | 6 | 6 | 8191 |
| M/n | 1.5 | 1 | 0.5 | 1.5 |
| $\log_2 L$ | 2.8[3] | 2.8[3] | 2.8[3] | 3 |
| code(=nh)/M | 2 | 3 | 6 | 2 |
| ε/n | 0.17 | 0.33 | 0.5 | 0.116 |
| (M/n)/$\log_2 L$ | 0.54[0.5] | 0.36[0.33] | 0.18[0.17] | 0.5 |

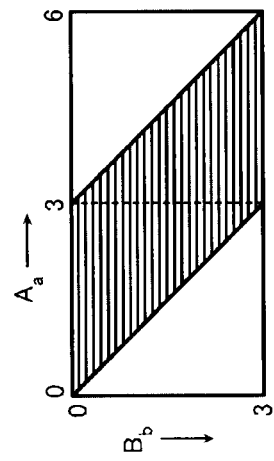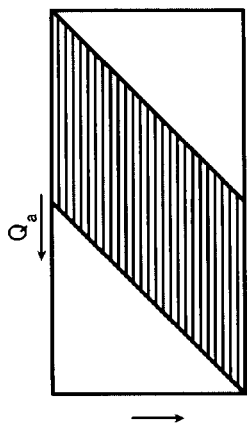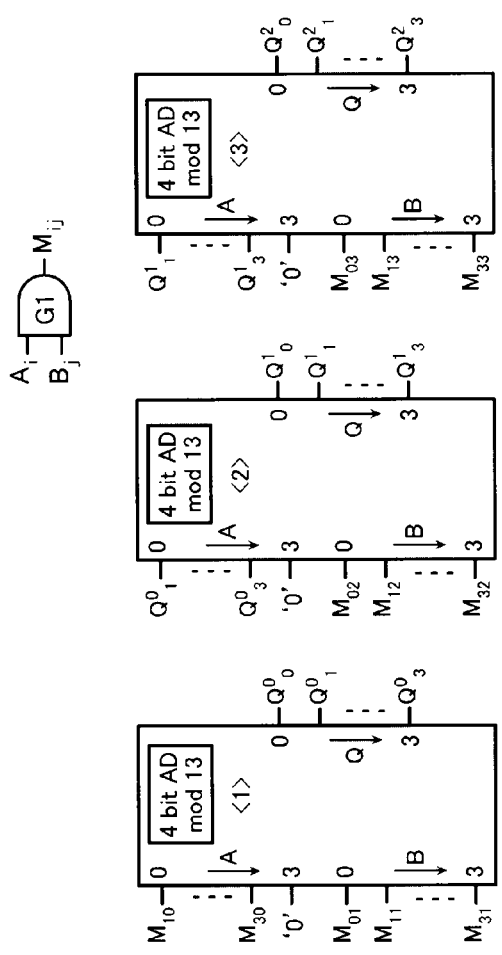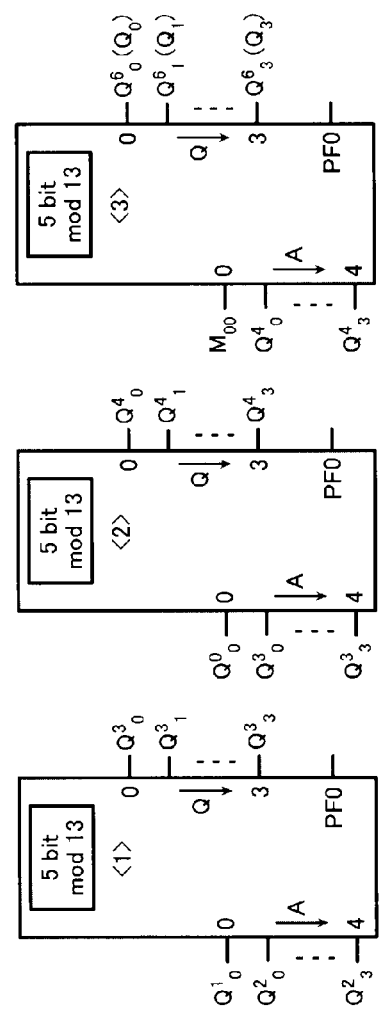
FIG. 41A  FIG. 41B  FIG. 41C

| j | $j^{-1}(p=13)$ |
|---|---|
| 1 | 1 |
| 2 | 7 |
| 3 | 9 |
| 4 | 10 |
| 5 | 8 |
| 6 | 11 |
| 7 | 2 |
| 8 | 5 |
| 9 | 3 |
| 10 | 4 |
| 11 | 6 |
| 12 | 12 |
| (0) | (0) |

Set $j^{-1} = 0$ when $j = 0$

MEMORY SYSTEM AND MEMORY CONTROLLER

CROSS-REFERENCE TO RELATED APPLICATIONS

This application is based upon and claims the benefit of priority from the prior Japanese Patent Application No. 2010-273311, filed on Dec. 8, 2010, the entire contents of which are incorporated herein by reference.

FIELD

The embodiment relates to a memory system and memory controller.

BACKGROUND

As the memory capable of storing mass data for use, variable resistance memories (ReRAM) and so forth have received attention because they can be easily formed in 3 dimensions. Even though any types of memory cells are used, however, a trump card, which requires no development of new process technologies for mass storage, is how to put many bits in a single memory cell by multi-leveling the state of the memory cell, of which examples can be found in NAND flash memories. If the memory cell is multi-leveled, though, the instability of setting the state causes failed read/write easily. This has a tradeoff with the increase in the number of physical quantity levels of the memory cell. In the case of the NAND flash memory, the number of physical quantity levels per cell is equal to 8 levels or 16 levels at most and a complicated association is caused between the data bit information and the physical quantity level.

BRIEF DESCRIPTION OF THE DRAWINGS

FIG. 3 shows a table of comparisons among ECC efficiencies when 16-level MLCs are used in the memory system according to the present embodiment.

FIG. 4 shows a table of comparisons among ECC efficiencies when 8-level MLCs are used in the memory system according to the present embodiment.

FIG. 41A is a block diagram of the "X Zp" circuit block in the memory controller according to the present embodiment.

FIGS. 41B and 41C are diagrams schematically showing operational processing at the "X Zp" circuit block in the memory controller according to the present embodiment.

DETAILED DESCRIPTION

Figure 1:
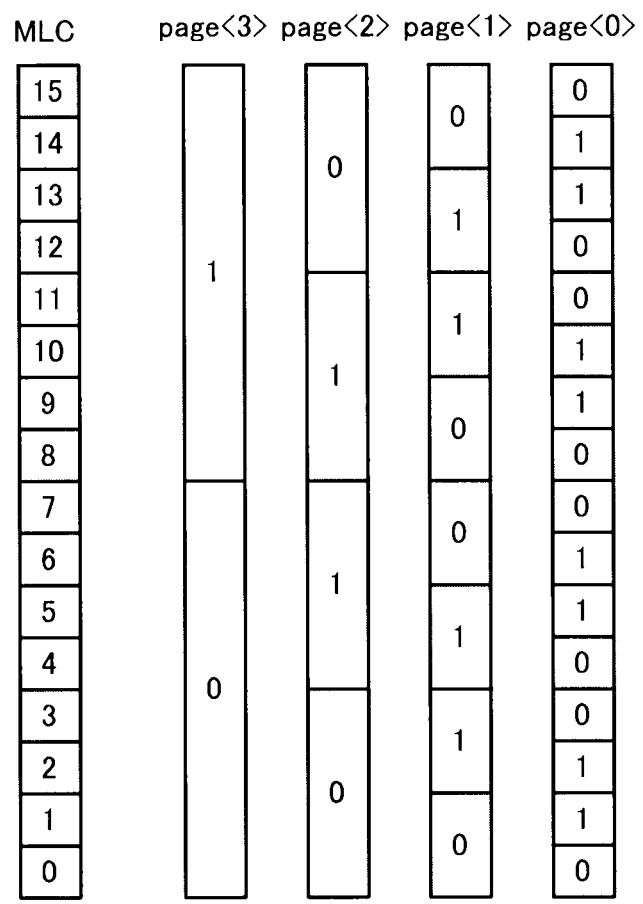
FIG. 1 is a diagram showing an example of the correspondence between the level of 1 MLC (Multi-Level Cell) and 1 bit of a page buffer in a memory system according to a first embodiment.

A memory system according to the embodiment comprises a memory device including plural memory cells capable of storing d bits of data (d is an integer of 2 or more) in accordance with plural physical quantity levels and operative to read/write data at every page composed of specific bits in certain ones of the plural memory cells; and a memory controller operative to control the memory device. The memory controller includes a page buffer operative to hold page data to be read from/written in a page of the memory device and send/receive the page data to/from the memory device, a data processing unit operative to detect and correct an error in the page data by processing target data in a finite field Zp modulo p generated based on the page data (p is a prime that satisfies $2<p<2^d$), and a mapping unit operative to execute mapping of the target data from the data processing unit as page data within the page buffer.

Memory systems and memory controllers for use therein according to the embodiments will now be described below with reference to the drawings.

[Overview of Embodiment]

A memory system realizes a higher-density storage capacity by finely fabricating a cell array, forming the cell array and so forth in 3-dimensional structures, and thinking physical phenomena for use in memory cells. If the memory system is further required to have a higher density after completion of stable process steps, multi-leveling of memory cells is effective means.

In particular, as for NAND flash memories, multi-leveling proceeds promptly and 3-bit cells capable of storing 8 levels per cell become practical. Much higher multi-leveling of memory cells associates with a sharp deterioration of reliability, however, and a single-bit increase per cell suffers a 2 or more exponent increase of error rate at least. Thus, from the problem on the reliability and production yield, the progression of multi-leveling of memory cells has a difficult problem even though it is expected as means for realizing high-capacity file memories.

If the problem on multi-leveling of memory cells can be overcome to achieve effective use, NAND flash memories can be attained to have a higher-density storage capacity while utilizing stable process steps on NAND flash memories for longer terms.

Therefore, under the following gist, memory controllers using a Lee metric code and memory systems utilizing such the memory controllers are proposed. Hereinafter, the multilevel memory cell may also be referred to as a "MLC" (Multi Level Cell). In addition, the NAND flash memory utilizing the MLCs may also be referred to as a "MLC NAND flash memory".

(1) An error in a MLC, in many cases, may be caused by writing to an adjacent physical quantity level (hereinafter simply referred to as a "level") in the MLC and reading from an adjacent level in the MLC. Even in such the case, the assignment of binary bits to the conventional MLC may cause a larger error quantity. Therefore, the memory controller according to the embodiment described below simplifies the assignment of values to the MLC levels to improve the reliability. At the same time, it is made possible to utilize the presently existing MLC NAND flash memory as it is, thereby improving the productivity additionally.

(2) The ECC (Error Correcting Code) utilized in the conventional MLC NAND flash memory can correspond to every error. Therefore, it is possible to correct failed MLC-level identification that occurs at an extremely lower possibility, regarding it as an error in a bit contained in a page. This is to say, in other words, that the ECC excessively corresponds to the types of error occurrences. Therefore, it is intended to generally correspond to the error caused most between adjacent levels, thereby suppressing the excessive increase in check bit and constructing an efficient ECC.

(3) Under the above gist, and for the purpose of representing the MLC levels, it is intended to propose mapping of plural pages of binary data belonging to the same memory cell assigned to the p-adic elements in Zp.

First, an example of the MLC NAND flash memory including 16-level MLCs is used to describe the relation between multi-levels and binary data.

The use of 16-level MLCs allows storage of 4 bits of data per cell. The 4 bits of data may correspond to the MLC levels in various patterns as can be considered. The utilization of Gray code is considered here. Such the utilization of Gray code allows the MLC levels to correspond to the binary data such that the variation between adjacent levels just contains a variation in only 1 bit of 4 bits. The 4 bits of binary data can form different respective pages <0>-<3> as sets of data. If the MLC levels are numbered 0 to 15 in order from the lowermost level, the bits in each page corresponding to the MLC levels are as shown in FIG. 1.

A bit p0 in page <0>, a bit p1 in page <1>, a bit p2 in page <2>, and a bit p3 in page <3> can be determined by respective binary functions P0, P1, P2, P3 of digits $B_0, B_1, B_2, B_3$ when the value L of the MLC level is represented by a binary number as shown in Expression 1.

$$L = B_0 2^0 \pm B_1 2^1 + B_2 2^2 + B_3 2^3$$

$$p0 = P_0(B_0, B_1, B_2, B_3)$$

$$p1 = P_1(B_0, B_1, B_2, B_3)$$

$$p2 = P_2(B_0, B_1, B_2, B_3)$$

$$p3 = P_3(B_0, B_1, B_2, B_3) \quad \text{[Expression 1]}$$

In particular, Gary code is so coded that any one of p0, p1, p2 and p3 varies in response to the variation in L by 1. In general, any variation in L can be represented by the variation in a bit p0-p3 in each page. Therefore, if 1-bit error detection/correction is possible in each of 4 pages <0>-<3>, with regard to 1 cell, it is possible to deal errors on all level variations in the MLC. Further, if the variation in the MLC level is just 1, the use of Gray code makes it possible to correct the error by a correction of 1 bit to any one page. Therefore, if 1 bit can be corrected independently in each page, it is possible to correct errors in 4 independent MLCs.

Thus, the method of associating the MLC levels with the binary data using pages and then correcting a bit error at every page is extremely strong and is possible to deal any errors in the MLC.

In consideration of the fact that most of the errors arise between adjacent levels in the MLC, the error detecting and correcting method as described above excessively corresponds to errors and, by the amount, deals a larger amount of information that is not required usually in error detection/correction.

Next, the usually-not-required information is described.

Figure 2:
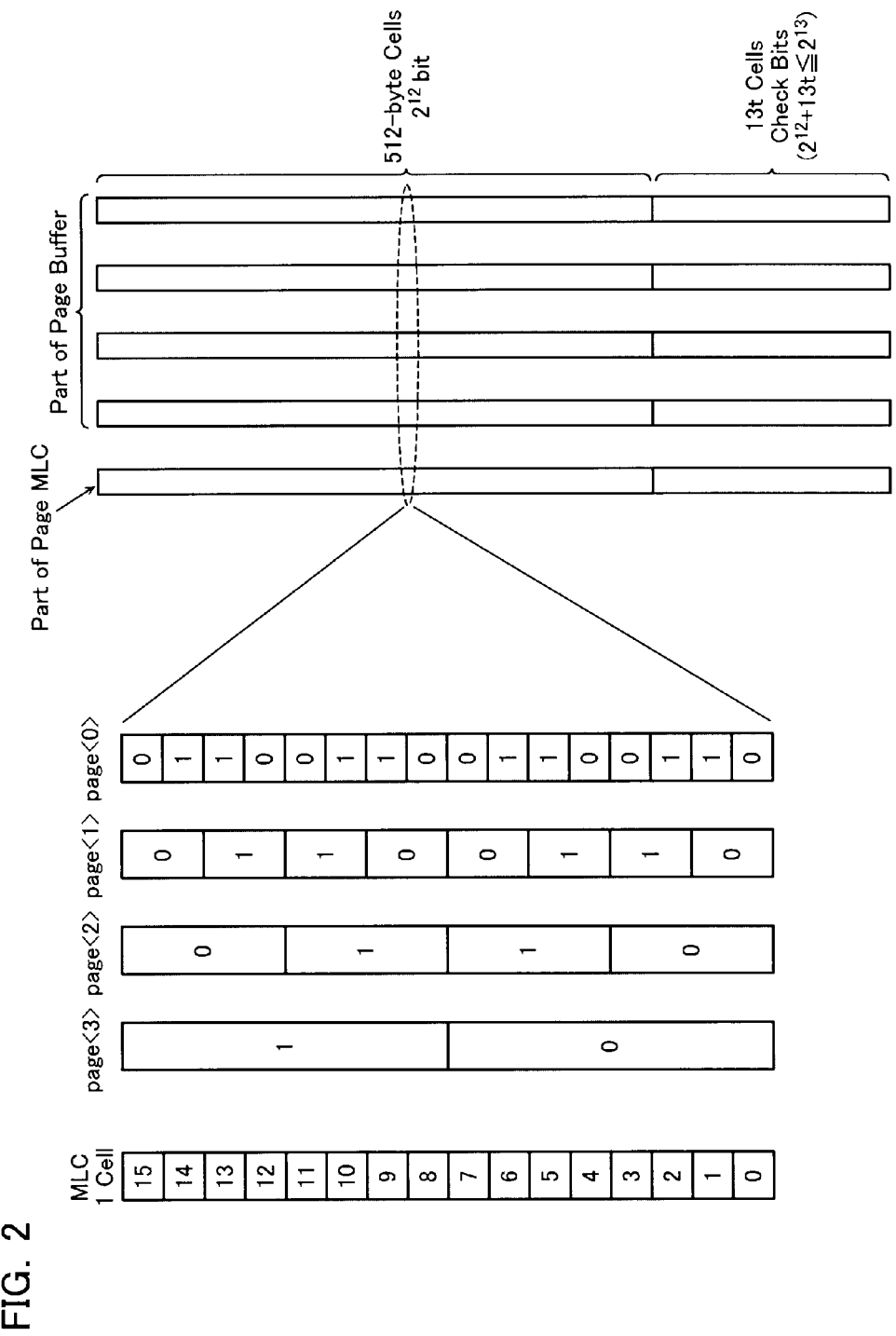
FIG. 2 is a diagram illustrative of an ECC when a binary representation (Gray code) is used.

FIG. 2 provides an example showing a part of MLCs configuring page data and the corresponding part of a page buffer. The correspondence between the levels of 1 MLC and the bits in a page are shown in FIG. 1 and also shown enlarged in FIG. 2. The part of the page buffer shown in the figure corresponds to the so-called sector, which is a part that serves as a set for data processing. In this example, 1 page includes 512-byte MLCs.

This example corresponds to 16-level MLCs and therefore provides 512-byte MLCs with 4 series of page buffers. These 4 series of page buffers comprise 512-byte memory cells in total.

A consideration is given, for such the configuration, to a system that can be easily extended from the conventional ECC system and mounted on the memory system.

As 512 bytes include $2^{12}$ bits, the ECC system using binary data utilizes a Galois field $GF(2^{13})$. In this case, check bits required for 1-bit error correction include 13 bits. The number of bits per page buffer required for t-bit error correction (t is an integer of 1 or more) is equal to the sum of 512 bytes of data and 13t bytes of check bits. Therefore, if 512 bytes of data can be dealt, the easily extendable number, t, of correctable bits is required to satisfy an inequality, $2^{12}+13t \leq 2^{13}$. With such the configuration, and on the assumption that only the error between adjacent levels arises in the MLC, the use of Gray code makes it possible to correct 4t pieces of MLCs among (512 bytes+13t) pieces. The example shown in FIG. 2, though, is configured to further correct any errors caused in additional t pieces of MLCs. As described above, however, when focusing attention on the fact that most of the errors arise between adjacent levels in the MLC, such the configuration as shown in FIG. 2 can be considered an excessive guarantee to errors.

The following description is given to the system efficiency on construction of a Lee metric code-utilizing ECC system using 16-level MLCs in comparison with that on construction of the conventional binary-utilizing ECC system.

FIG. 3 provides a table of the associated quantities grouped in the case of the error-correctable Lee metric $\epsilon$=1-4 when the system utilizes a Lee metric code using the maximum prime p=13 lower than 16. In FIG. 3 the columns a-d show the associated quantities in the case of $\epsilon$=1-4, respectively, when the system utilizes a Lee metric code. In FIG. 3 the column e shows the associated quantities corresponding to a 16-level MLC. The associated quantities are described below in order.

L: The number of MLC levels required for the ECC system. When a Lee metric code is utilized, the number of elements in the Lee metric code, that is, 13 is selected for use from 16 MLC levels as shown on the columns a-d in FIG. 3. On the other hand, in the case of a binary system, the binary, that is, 16 is used directly as shown on the column e in the figure.

p: A prime for use in a Lee metric code. When the Lee metric code is utilized, the prime comes to p=13 as shown on the columns a-d in FIG. 3. On the other hand, in the case of the binary system, no corresponding prime p exists except 2.

h: The number of bits required for representing L. When a Lee metric code is utilized, the number comes to h=4 because it is sufficient to represent just 16 levels of 0 to 15 as shown on the columns a-d in FIG. 3. On the other hand, in the case of a binary system, h corresponds to the number of pages as shown on the column f.

M: The quantity of information data dealt in batch in ECC processing, which is represented by the number of bits. M varies in accordance with the later-described error-correctable quantity $\epsilon$. When a Lee metric code is utilized, as the error-correctable quantity $\epsilon$ increases 1 by 1, for example, M decreases from 36 bits to 24 bits 4-bit by 4-bit as shown on the columns a-d in FIG. 3. On the other hand, in the case of a binary system, it is more efficient to deal as large quantity of data as possible in batch. Therefore, as the extension of the conventional method, it is intended to deal data bits that can be saved in 512-byte pieces of MLCs for use in storage of 512 bytes of sector data, that is, 4 sectors of data, in batch, as shown on the column e in FIG. 3.

$\epsilon$: The error-correctable quantity. When a Lee metric code is utilized, it is possible to correct errors caused in 12 MLCs for use in code storage if they have the total sum of Lee metrics equal to $\epsilon$ or below. In the case of the error in the MLC between adjacent levels, that is, in the case of the error when the Lee metric is equal to 1, $\epsilon$ indicates the number of correctable cells of 12 MLCs. On the other hand, in the case of a binary system, 315 is selected as the maximum t that satisfies the inequality, $2^{12}+13t \leq 2^{13}$, as shown on the column e, and the number of cells 4 times larger than that is made correctable among 4×512 bytes.

$\delta$: The number of digits when M is regarded as sets of h bits. It is the number of digits when M is represented by a $2^h$-adic number. In the case of a binary system, it is equal to the number of cells for use in storage of information data contained in a sector as shown on the column e.

n: The number of cells required for storage of information data after it is coded. When a Lee metric code is utilized, the number comes to n=12 as shown on the columns a-d in FIG. 3 because n=p−1. On the other hand, in the case of a binary system, the number comes to 8191 that is equal to $2^{12}+13t$ as shown on the column e.

M/n: The number of information bits storable per MLC, that is, the quantity indicative of the number of effective bits in the code stored in the MLC. An increased error-correctable quantity $\epsilon$ makes the code redundant and accordingly decreases M/n. Note that, in the case of a binary system, a 4-bit MLC is used, as shown on the column e, while the need for providing check bits just allows storage of only 2 bits of information data.

$\log_2 L$: The number of bits storable when the most of the utilized MLC levels are used. The brackets on the columns a-d in FIG. 3 contain values in relation to the number of MLC levels actually settable even if the Lee metric code is used. This value is equal to 4 when a 16-level MLC is used, of course.

code/M: The redundancy of the code contained in the ECC. It is a ratio between the number of bits in the code (=nh) and the number of bits in the quantity M of information data contained therein, which is the quantity indicative of how many times the number of bits in the code is larger than the number of bits in the quantity M of information data. Note that when a Lee metric code is utilized, code/M increases little by little as $\epsilon$ increases as shown on the columns a-d in FIG. 3, and that the code in the case of the binary system is double the quantity of information data as shown on the column e in FIG. 3.

$\epsilon$/n: A proportion between the number of cells required for storage of 1 code and the maximum number of error-correctable cells among those. The $\epsilon$/n provides an index indicative of how many error-caused MLCs of the code storing MLCs are allowed to exist to restore the code. In the case of the binary system, the efficiency is poorer than that when a Lee metric code is utilized as shown on the column e in FIG. 3 as can be found.

(M/n)/log$_2$L: The utilization efficiency of the MLC levels. It shows a proportion of those utilized as multi-levels when an ECC is incorporated. The brackets on the columns a-d in FIG. 3 contain values in relation to 16 levels when the Lee metric code is used.

The binary system is possible to correct any errors caused in 1 cell in the case of the use of 16-level MLCs and the ECC of 1-bit per page, and thus possible to correct errors in 4 cells at the maximum over the memory cells of the page length. A consideration is given to an ECC system capable of correcting errors in 3 cells of 12 cells corresponding to the use of a Lee metric code of $\epsilon$=3. In this case, it is required to correct almost 512 bytes when the page length includes 2 k bytes, which correspond to 128 bytes of 512 bytes of MLCs such that BCH in GF($2^{13}$) shown on the column e in FIG. 3 can deal it utmost while the efficiency is extremely poor, resulting in an enormous quantity of computations. This is because the used ECC is stronger than required with regard to one MLC and accordingly it is not the optimal method in consideration of the trend of error occurrences.

A specific example of the memory controller and memory system according to the present embodiment is described mainly assuming the ECC system shown on the column b in FIG. 3 applied with a double circle.

The following description is given to the system efficiency on construction of a Lee metric code-utilizing ECC system using 8-level MLCs in comparison with that on construction of the conventional binary code-utilizing ECC system.

In the case of the 8-level MLC, the system utilizing the Lee metric code decreases its advantage compared to the 16-level MLC over the binary system though it can achieve the system efficiency more than that of the binary system if the error tolerance is required 15% or more.

FIG. 4 provides a table of the associated quantities grouped in the case of the error-correctable Lee metric $\epsilon$=1-3 when the system utilizes a Lee metric code using the maximum prime p=7 lower than 8. In FIG. 4 the columns a-c show the associated quantities in the case of $\epsilon$=1-3, respectively, when the system utilizes a Lee metric code. In FIG. 4 the column d shows the associated quantities corresponding to an 8-level MLC. The associated quantities are described below in order.

L: When a Lee metric code is utilized, the number of elements in the Lee metric code, that is, 7 is selected for use from 8 MLC levels as shown on the columns a-c in FIG. 4. On the other hand, in the case of a binary system, the binary, that is, 8 is used directly as shown on the column d in FIG. 4.

p: When the Lee metric code is utilized, the prime comes to p=7 as shown on the columns a-c in FIG. 4. On the other hand, in the case of the binary system, no corresponding prime p exists except 2.

h: When a Lee metric code is utilized, the number comes to h=3 because it is sufficient to represent just 8 levels of 0 to 7 as shown on the columns a-c in FIG. 4. On the other hand, in the case of a binary system, h corresponds to the number of pages as shown on the column d in FIG. 4.

M: When a Lee metric code is utilized, as the error-correctable quantity c increases 1 by 1, for example, M decreases from 9 bits to 3 bits 3-bit by 3-bit as shown on the columns a-c in FIG. 4. On the other hand, in the case of a binary system, as the extension of the conventional method, it is intended to deal data bits that can be saved in 512-byte pieces of MLCs for use in storage of 512 bytes of sector data, that is, 3 sectors of data, in batch, as shown on the column d in FIG. 4.

$\epsilon$: When a Lee metric code is utilized, it is possible to correct errors caused in 6 MLCs for use in code storage if they have the total sum of Lee metrics equal to $\epsilon$ or below. In the case of the error in the MLC between adjacent levels, $\epsilon$ indicates the number of correctable cells of 6 MLCs. On the other hand, in the case of a binary system, 315 is selected as the maximum t that satisfies the inequality, $2^{12}+13t \leq 2^{13}$, as shown on the column d in FIG. 4, and the number of cells 3 times larger than that is made correctable.

$\delta$: In the case of a binary system, it is equal to the number of cells for use in storage of information data contained in a sector as shown on the column d in FIG. 4.

n: When a Lee metric code is utilized, the number comes to n=6 as shown on the columns a-c in FIG. 4. On the other hand, in the case of a binary system, the number comes to 8191 that is equal to $2^{12}+13t$ as shown on the column d in FIG. 4.

M/n: Note that, in the case of a binary system, a 3-bit MLC is used, as shown on the column d in FIG. 4, while the need for providing check bits just allows storage of only 15 bits of information data.

log$_2$L: The brackets on the columns a-c in FIG. 4 contain values in relation to the number of MLC levels actually settable even if the Lee metric code is used. This value is equal to 3 when an 8-level MLC is used, of course.

code/M: Note that when a Lee metric code is utilized, code/M increases little by little as c increases as shown on the columns a-c in FIG. 4, and that the code in the case of the binary system is double the quantity of information data as shown on the column d in FIG. 4.

$\epsilon$/n: In the case of the binary system, the efficiency is poorer than that when a Lee metric code is utilized as shown on the column d in FIG. 4 as can be found.

(M/n)/log$_2$L: The brackets on the columns a-c in FIG. 4 contain values in relation to 8 levels when the Lee metric code is used.

The binary system is possible to correct any errors caused in 1 cell in the case of the use of 8-level MLCs and the ECC of 1-bit per page, and thus possible to correct errors in 3 cells at the maximum over the memory cells of the page length. A consideration is given to an ECC system capable of correcting an error in 1 cell of 6 cells corresponding to the use of a Lee metric code of $\epsilon$=1. In this case, it is required to correct almost 341 bytes when the page length includes 2 k bytes, which correspond to 85 bytes of 512 bytes of MLCs such that BCH in GF($2^{13}$) shown on the column d in FIG. 4 can deal it utmost while the efficiency is extremely poor, resulting in an enormous quantity of computations. With this regard, the utilization of the Lee metric code makes it possible to achieve the same or higher error correction efficiency.

[Memory Controller and Memory System]

<General Configuration>

As described with reference to FIGS. 3 and 4, the utilization of the Lee metric code makes it possible to construct an extremely stronger ECC than that in the conventional MLC NAND flash memory as can be found. Therefore, the following description is given to a method of realizing a memory controller according to the embodiment for use in control of the memory device such as the conventional MLC NAND flash memory, concentrating on the memory controller though the memory controller can be combined with the memory device into a memory system.

Figure 5:
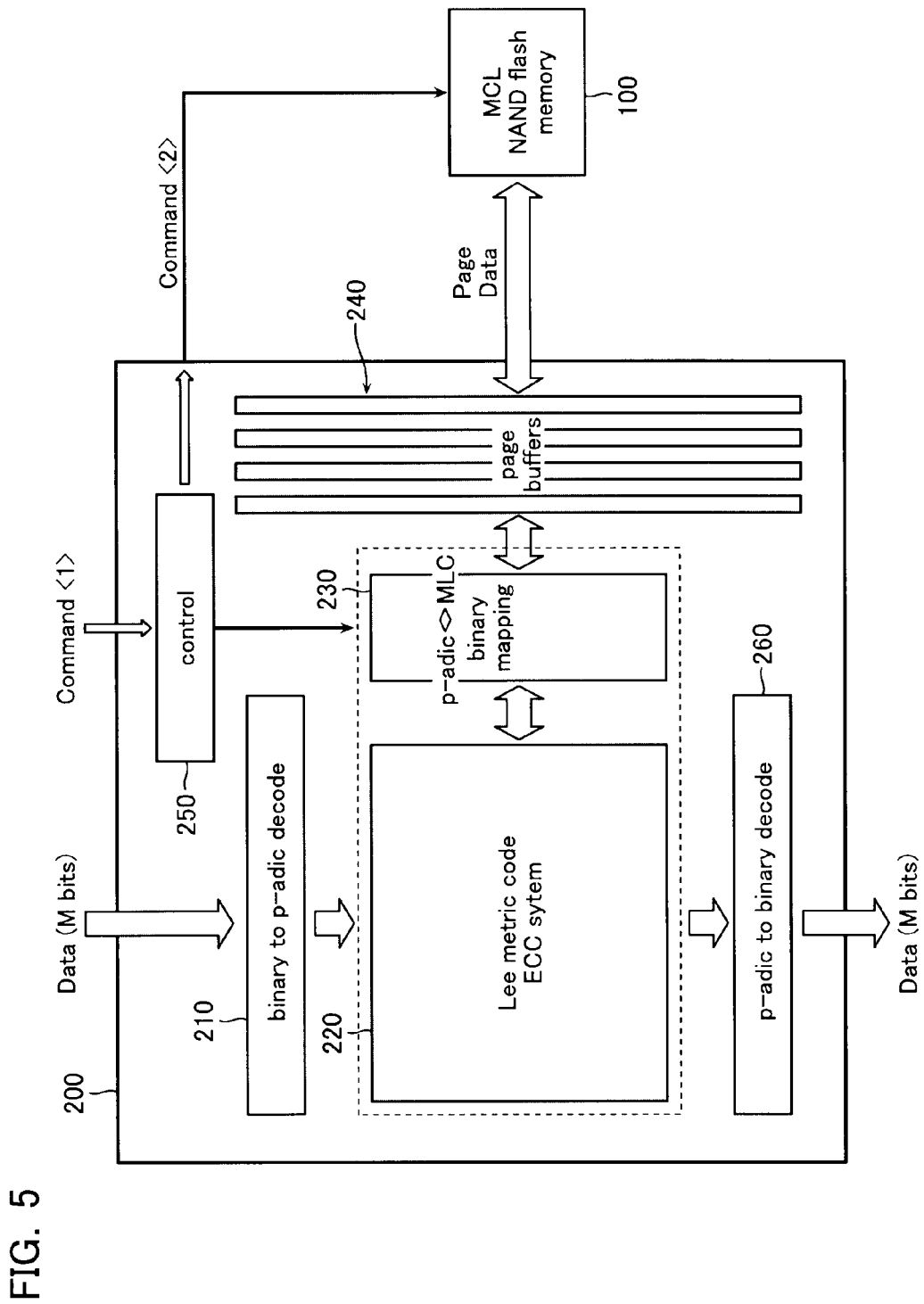
FIG. 5 is a block diagram of the memory system according to the present embodiment.

FIG. 5 is a block diagram of a memory system including the memory controller according to the embodiment.

The memory system according to the present embodiment comprises a memory device 100, and a memory controller 200 operative to control the memory device 100.

The use of the memory controller 200 makes it possible to construct a memory system including a Lee metric code-utilizing ECC system and having a higher error correction efficiency, using the existing memory device 100. The following example uses a MLC NAND flash memory as the existing memory device 100.

Binary data input to the memory controller 200 is converted to the quantity in a finite field Zp modulo a prime p, which is the data processing system in the memory controller 200. The binary data is processed at every M bits in the memory controller 200. The binary data input to the memory controller 200 is first fed to a "binary to p-adic decode" circuit block 210. The "binary top-adic decode" circuit block 210 converts binary data to p-adic data.

The p-adic data is fed to a "Lee metric code ECC system" circuit block 220 (data processing unit). The "Lee metric code ECC system" circuit block 220 uses the numerals in Zp on digits of the p-adic data to generate a Lee metric code (target data).

The Lee metric code is fed to a "p-adic < > MLC binary mapping" circuit block 230 (mapping unit). The "p-adic < > MLC binary mapping" circuit block 230 associates the numerals in Zp on digits of the Lee metric code with the MLC levels for conversion so as to establish the correspondence between the Lee metrics in Zp and the distances between MLC levels. In accordance with the "p-adic < > MLC binary mapping" circuit block 230, the numerals in Zp are converted to the cell levels having bit components composed of page data in the MLC, and held in page buffers 240.

When 16-level MLCs are used, the page buffers 240 are required in 4 series. The page buffers 240 are required to reflect the relation between the MLC levels and the pages in the memory device 100. When these page buffers 240 are filled with pieces of data, these pieces of data are transferred from the controller 200 to the memory device 100. This data transfer makes it possible to store the numerals in Zp as the MLC levels in the memory device 100.

The memory device 100 programs the data transferred from the controller 200 in turn at every page. Such operation of the memory device 100 is executed based on a command <2> supplied from a "control" circuit block 250 in the memory controller 200. The command <2> is generated at the "control" circuit block 250 in accordance with a command <1> fed to the controller 200.

On reading data from the memory system, the command <2> from the "control" circuit block 250 is applied first to the memory device 100 to readout therefrom a series of data capable of representing the levels of 1 MLC. The series of data are transferred to and held in the page buffer 240 in the memory controller 200 in turn from the memory device 100.

Subsequently, the data held in the page buffer 240 is processed in the "p-adic < > MLC binary mapping" circuit block 230. The "p-adic < > MLC binary mapping" circuit block 230 converts the data held in the page buffer 240 to the numeral in Zp, that is, the quantity representative of the MLC level.

Subsequently, the data represented by the numeral in Zp is fed to the "Lee metric code ECC system" circuit block 220. The "Lee metric code ECC system" circuit block 220 applies error correction to the data to restore the correct Lee metric code and then converts the Lee metric code to p-adic data.

Finally, the p-adic data is fed to a "p-adic to binary decode" circuit block 260. The "p-adic to binary decode" circuit block 260 restores the p-adic data to M bits of binary data and then provides them to the outside of the memory controller 260.

The following description is given to the block configuration seen from the flow of data processing at the data transfer system in the memory controller 200.

Hereinafter, the environment for processing data in binary such as the memory device 100 is referred to as a "binary world". In contrast, the environment for processing data in numerals in Zp such as the memory controller 200 is referred to as a "p-adic Zp world". In this case, the "binary world" may also be referred to as a "p-adic $Z_2$ world".

Figure 6:
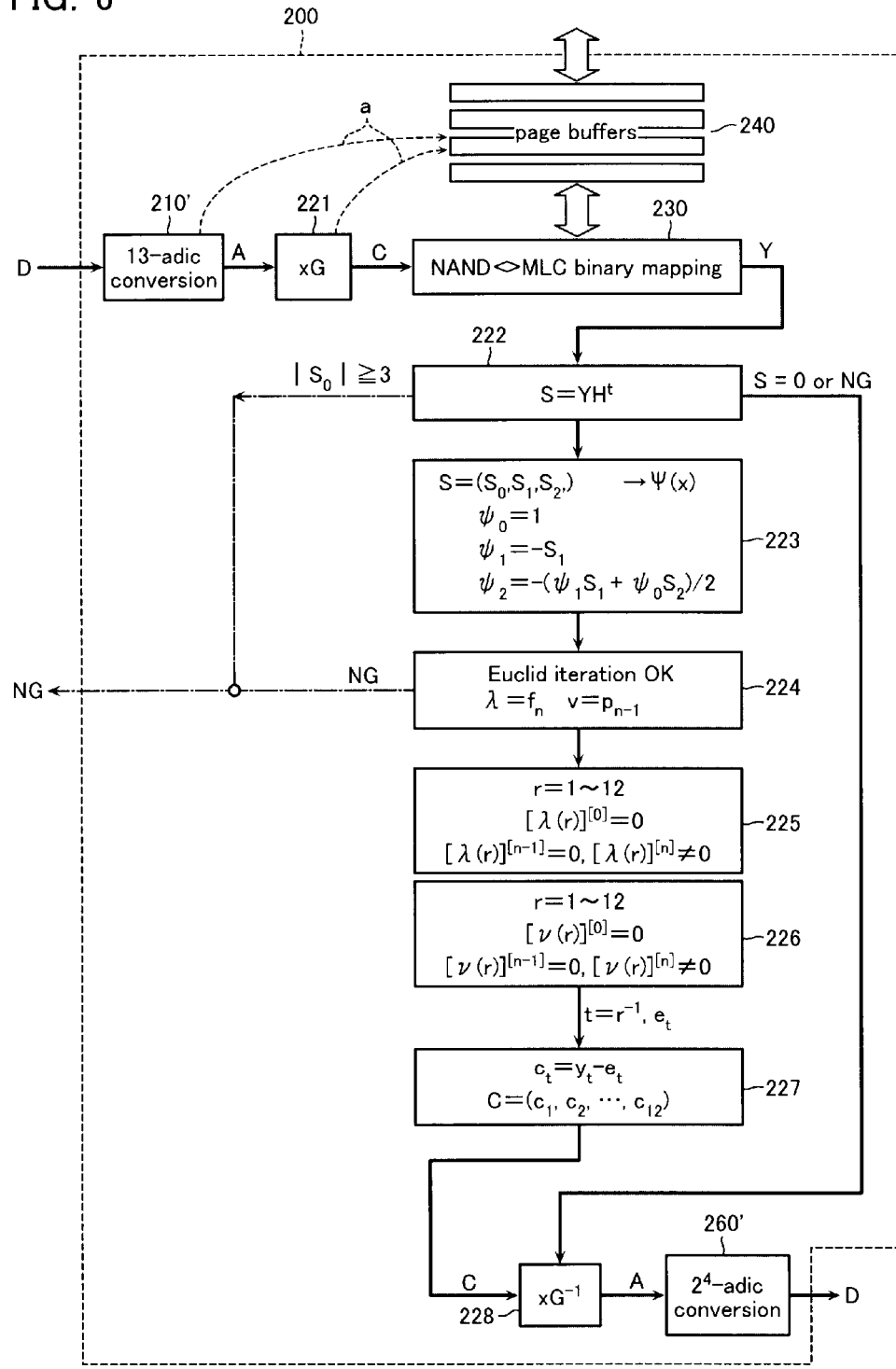
FIG. 6 is a block diagram of a data transfer system in a memory controller according to the present embodiment.

FIG. 6 is a block diagram of the memory controller 200 in the case of $\epsilon=2$, p=13 with a Euclidean iterative method used in ECC processing.

The memory controller 200 comprises a 13-adic converter unit 210', an encoder unit 221, a "p-adic < > MLC binary mapping" circuit block 230, page buffers 240, a syndrome generator unit 222, a solution searching polynomial generator unit 223, a Euclidean iteration processing unit 224, a first Hasse differential polynomial generator unit 225, a second Hasse differential polynomial generator unit 226, a code restorer unit 227, a decoder unit 228, and a $2^4$-adic converter unit 260'.

Among those, the 13-adic converter unit 210' is contained in the "binary to p-adic decode" circuit block 210. The encoder unit 221, the syndrome generator unit 222, the solution searching polynomial generator unit 223, the Euclidean iteration processing unit 224, the first Hasse differential polynomial generator unit 225, the second Hasse differential polynomial generator unit 226, the code restorer unit 227 and the decoder unit 228 are contained in the "Lee metric code ECC system" circuit block 220. The $2^4$-adic converter unit 260' is contained in the "p-adic to binary decode" circuit block 260.

Binary data D input, as sets of 32 bits (M=32), to the memory controller 200 is first fed to the 13-adic converter unit 210'.

The 13-adic converter unit 210' converts the input binary data D to a 13-adic number, thereby generating data A having digits represented by the elements in Zp. The data A is sent to the encoder unit 221.

The encoder unit 221 applies a generator matrix G to the input data A, thereby generating a Lee metric code C from the data A. This code C is sent to the "p-adic < > MLC binary mapping" circuit block 230.

The "p-adic < > MLC binary mapping" circuit block 230 uses the input Lee metric code C to generate data to be transferred to the memory device 100, which is then fed to the page buffer 240.

Thereafter, the data held in the page buffer 240 is transferred to the memory device 100 and programmed in MLCs.

Subsequently, the pieces of data programmed in the memory device 100 are read out as a series of page data to the page buffers 240. The data is turned at the "p-adic < > MLC binary mapping" circuit block 230 to a code Y that contains an error due to failed MLC-level identification. Subsequent processing includes restoration of an errorless Lee metric code C from the code Y.

The code Y output from the "NAND < > MLC binary mapping" circuit block 230 is provided to the syndrome generator unit 222.

The syndrome generator unit 222 executes operational processing, $S=YH^t$, to the input code Y to generate a syndrome S. If $S_0$ obtained through the operation has a Lee metric of 3 or more ($|S_0|\geq 3$), the sum of individual error code components always becomes equal to 3 or more. In a word, a key to solution with $\epsilon=2$ may not be possible to correct an error in the code Y. Therefore, NG signal is provided to the outside of the memory controller 200, and the code Y before error correction is directly fed to the decoder unit 228. If S=0, no error occurs in the code Y, and accordingly the code Y is fed to the decoder unit 228 not through error correction. In the case of other syndromes, the generated syndrome S is sent to the solution searching polynomial generator unit 223.

The solution searching polynomial generator unit 223 uses the input syndrome $S=(S_0, S_1, S_2)$ to generate a polynomial $\Psi(x)$. The polynomial $\Psi(x)$ has coefficients $\phi_0$, $\phi_1$ and $\phi_2$, which are as shown in Expression 2. The polynomial $\Psi(x)$ is given to the Euclidean iteration processing unit 224.

$$\psi_0 = 1$$
$$\psi_1 = -S_1$$
$$\psi_2 = -(\psi_1 S_1 + \psi_0 S_2)/2 \qquad \text{[Expression 2]}$$

The Euclidean iteration processing unit 224 uses the input polynomial $\Psi(x)$ and $x^3$ to try the generation of polynomials $\lambda(x)$ and $\nu(x)$ through the Euclidean iterative method. Unless the polynomials $\lambda(x)$ and $\nu(x)$ can be generated, NG signal is provided to the outside of the memory controller 200, and the code Y before error correction is directly fed to the decoder unit 228. On the other hand, if the polynomials $\lambda(x)$ and $\nu(x)$ can be generated, the flow shifts processing to the first Hasse differential polynomial generator unit 225 and the second Hasse differential polynomial generator unit 226.

The first Hasse differential polynomial generator unit 225 generates a Hasse differential polynomial from the polynomial $\lambda(x)$ and substitutes r=1-12 into the Hasse differential polynomial to extract a root r that satisfies $[\lambda(r)]^{[0]}=0$. Subsequently, it uses the extracted root r to derive the multiplicity n that satisfies $[\lambda(r)]^{[n-1]}=0$ and $[\lambda(r)]^{[n]}\neq 0$. Then, the position $t=r^{-1}$ and the error $e_t=n$ based on these root r and multiplicity n are provided to the decoder unit 227.

Similarly, the second Hasse differential polynomial generator unit 226 generates a Hasse differential polynomial from the polynomial $\nu(x)$ and substitutes r=1-12 into the Hasse differential polynomial to extract a root r that satisfies $[\nu(r)]^{[0]}=0$. Subsequently, it uses the extracted root r to derive the multiplicity n that satisfies $[\nu(r)]^{[n-1]}=0$ and $[\nu(r)]^{[n]}\neq 0$. Then, the position $t=r^{-1}$ and the error $e_t=13-n$ based on these root r and multiplicity n are provided to the code restorer unit 227.

The code restorer unit 227 uses the input position t and error $e_t$ to restore the error-corrected Lee metric code $C=(c_1, c_2, \ldots, c_3)$ from $c_t=y_t-e_t$. The Lee metric code C is fed to the decoder unit 228.

The decoder unit 228 applies an inverse conversion of the generator matrix G to the input Lee metric code C, thereby generating p-adic data A having digits represented by the elements in Zp. The p-adic data A is fed to the $2^4$-adic converter unit 260'.

The $2^4$-adic converter unit 260' converts the input p-adic data A to binary data, that is, $2^4$-adic binary data D. The binary data D is provided to the outside of the memory controller 200.

The page buffer 240 is used only in data communications with the memory device 100 in FIG. 6 while the page buffer 240 can be used in multiple during the process of data processing as shown with the dotted arrows a in FIG. 6. In this case, the circuit scale of the memory controller 200 can be reduced. The method of using the page buffer 240 in multiple is described later.

<Mapping Unit and Page Buffer>

The mapping unit, that is, the "p-adic < > MLC binary mapping" circuit block 230 is described on the function thereof in detail in the case of, for example, p=13 and the number of MLC levels equal to 16.

Mapping is executed by determining the correspondence between 16 levels of the MLC and a finite field Zp modulo p=13 first. The following description is given to 2 cases.

Figure 7:
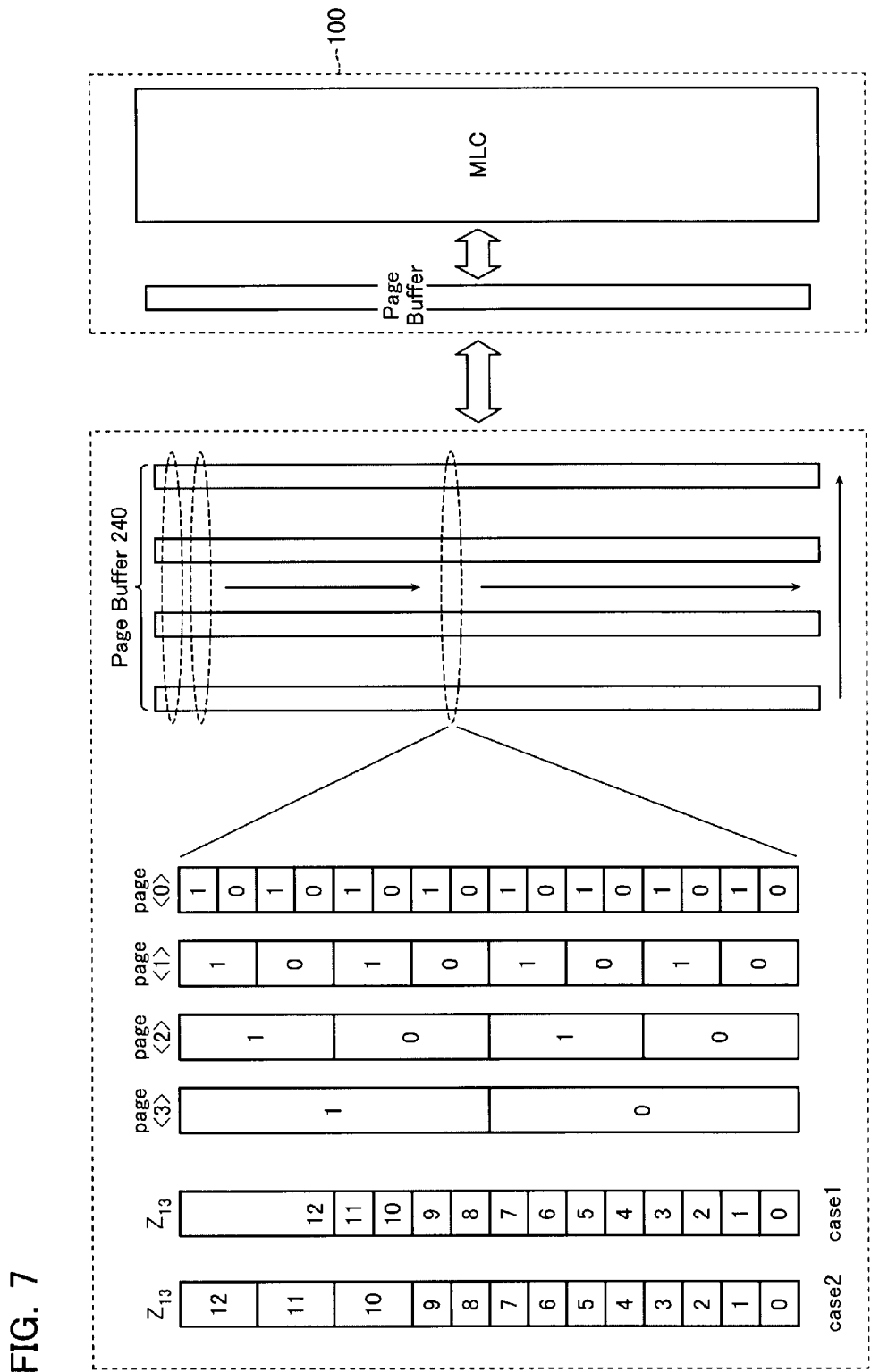
FIG. 7 is a diagram showing an example of the correspondence between a p-adic number and the MLC levels in the memory system according to the present embodiment.

FIG. 7 is a diagram showing an example of the correspondence between a p-adic number and the MLC levels.

The case 1 relates to a method of assigning the elements in Zp to the MLC levels in turn from the lower level. In the case of FIG. 7, the elements 0 to 12 in Zp are assigned to the MLC levels in turn from the lower level and the element 12 in Zp is assigned to the remaining upper 3 mLC levels. The case 1 is effective to suppress the amplitude of the voltage pulse applied to the word line in programming the NAND flash memory, thereby reducing the capacitive coupling between the word line and memory cells adjacent to the word line to suppress the disturbance. In a word, the case 1 provides an assigning method expectable to reduce occurrences of errors in memory cells as can be said.

The case 2 relates to an assigning method of setting larger level intervals to higher levels of the MLC levels. In the case of FIG. 7, the elements 0 to 12 in Zp are assigned to the MLC levels in turn from the lower level while the elements 10 to 12 in Zp of those are assigned at 2-level intervals. The case 2 provides an assigning method capable of executing rough programming to higher levels having larger threshold variations from the erasure level, and expectable to reduce the burden on programming as can be said.

Thus, standing on the characteristics of the 16-level NAND memory, it is preferred to determine the above-described assigning method in the case 1 or the case 2 by limiting the purpose, for example, to that for suppressing error occurrences or reducing the programming time. It is also desirable for the memory controller 100 to set any assigning method at any time in accordance with the situation of the memory device 200. In the cases 1 and 2 the elements in Zp are assigned to the MLC levels in turn from the lower level while the elements in Zp can be assigned to the MLC levels in turn from the upper level as well.

Subsequently, the correspondence between the MLC levels and the bits in a page is described with reference to FIG. 7. FIG. 7 shows an example of the use of Gray code in determining the correspondence between the bits in each page and the MLC levels. The bits in a page may vary from product to product though, in such the case, they may be preferably determined in accordance with the used memory device 100.

Once the correspondence between the elements in Zp and the MLC levels is determined in this way, the elements in Zp are decoded based on 4 bits in the pages <0>-<3> corresponding to the MLC levels and then held in the page buffers 240.

Therefore, the page buffers 240 are arranged in 4 series in parallel such that the 4 bits of data decoded through the above-described mapping can be held in respective series of the page buffers 240 in turn.

One series of page buffers 240 in the memory controller 200 corresponds to the page buffer contained in the memory device 100. When the page buffers 240 in the memory controller 200 are completely filled with data, the data is transferred series by series in turn to the page buffer in the memory device 100. The data in 4 series of page buffers 240 is programmed continuously in the MLCs at the memory device 100. Through such the data write procedure, the elements in Zp obtained at the memory controller 200 can be stored as the MLC levels in the memory device 100.

Reading data from the MLC in the memory device 100 is executed through the opposite procedure to the above-described data write procedure. In a word, 4 pages of data in the same MLC are read out in turn and these pages of data are transferred to the 4 series of page buffers 240 in the memory controller 200. The data transferred to the 4 series of page buffers 240 is decoded to obtain the numerals in Zp indicative of the MLC levels.

The multiple use of the page buffers 240 during the process of data processing is described next with reference to FIGS. 8-10 in the case of the memory system using 16-level MLCs and $\epsilon$=4, 3, 2.

The memory controller 200 described herein is determined to have an I/O data transfer rate of 1 byte/cycle. 1 sector data is transferred to the page buffers 240 in 512 cycles. Processing at every certain-bit data is referred to as a process and, to distinguish it from the general process, it is represented by a "PROCESS".

A first description is given to the case where $\epsilon$=4, that is, errors in 4 cells of 12 cells are correctable at the maximum.

Figure 8:
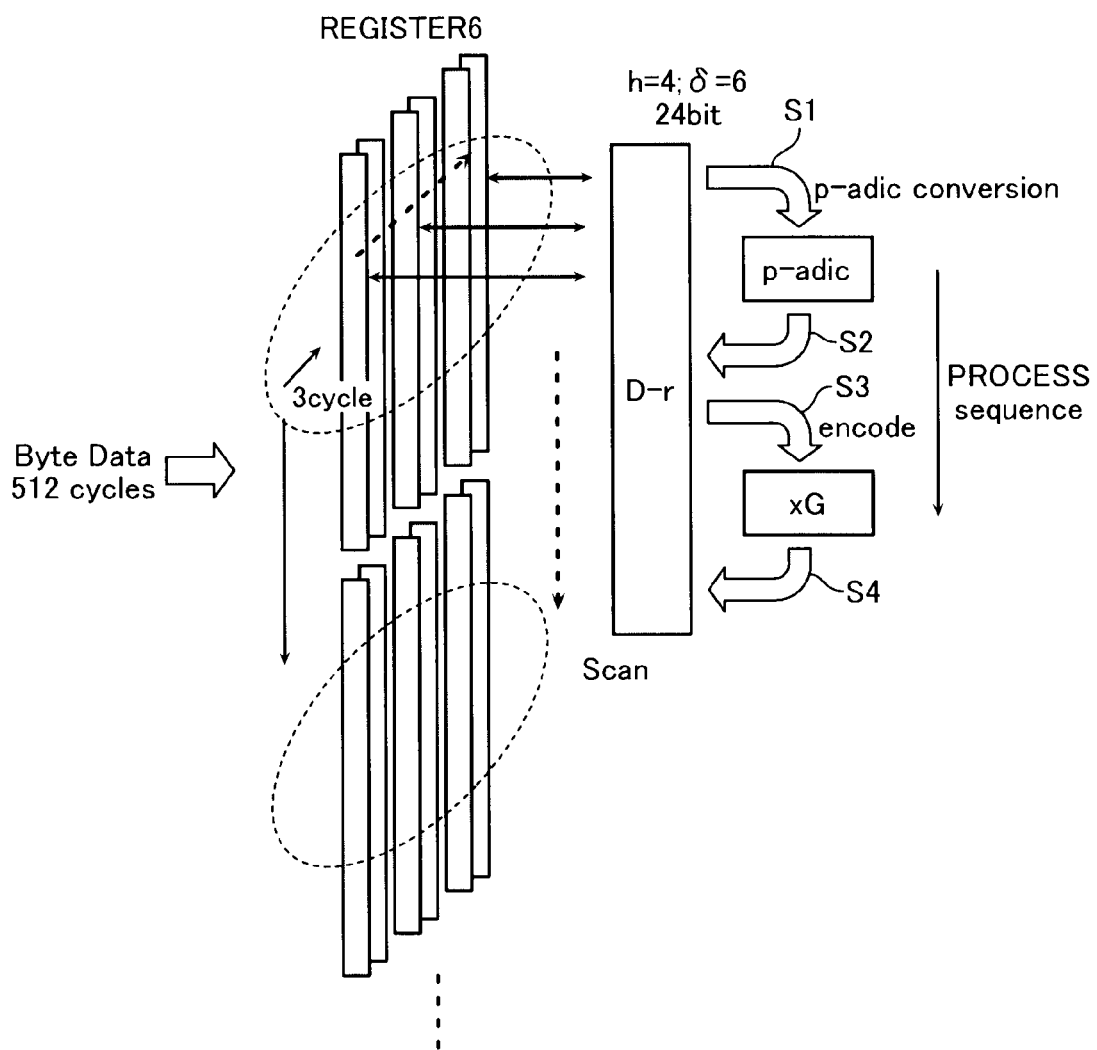
FIG. 8 is a diagram showing an example of the configuration of a register in the case of 4 cells correction/12 cells in the memory controller according to the present embodiment.

In this case, as shown in FIG. 8, the page buffers 240 can be configured conceptually on the basis of a 6-column byte register (hereinafter referred to as a "REGISTER6"). The byte register herein referred is a register capable of storing 1-byte data per cycle. Hereinafter, the byte registers on the 1st column to the n-th column are represented as the "registers <1:n>". For example, the byte registers on the 1st column to the 6th column are referred to as the "registers <1:6>".

Data processing in the case of $\epsilon$=4 is executed to deal M=24 bits at every PROCESS as shown on the column d in FIG. 3. In a word, in the case of the memory controller 200, the data transfer rate is 1 byte/cycle and accordingly it is possible to accumulate 1-PROCESS data at every 3 cycles. Therefore, it is possible execute processing of 1 PROCESS at every 3 cycles.

If 24 bits of data are processed in 1 PROCESS, processing of data in 1 sector (512 bytes) requires 171 PROCESS. Though, 171-PROCESS data includes 171×24=4104 bits (513 bytes) more than the data in 1 sector, that is, 4096 bits (512 bytes). Therefore, it is required to add 8 dummy bits. The dummy bits may be fixed data generated in a circuit.

The external input binary data D in the case of $\epsilon$=4 is held in the registers <1:3> of REGISTER6. The binary data D held in the registers <1:3> is processed at the following steps S1-S4.

First, at step S1, the binary data D is processed in 171 PROCESS and converted to 13-adic data A. Through this conversion, 24 bits of 1-PROCESS data ($\delta$=6) in the "binary data" are converted to 28 bits of data ($\delta$=7) in the "p-adic Zp world", containing additional 4 bits corresponding to 1 digit of p-adic number. Therefore, the 13-adic data A generated through 171 PROCESS includes 171 PROCESS×28 bits=4788 bits. The 4788 bits of data correspond to the capacity of byte registers on 3.5 columns.

Subsequently, at step S2, the 13-adic data A, having a data quantity corresponding to the byte registers on 3.5 columns, is held in the registers <1:4> of REGISTER6. Therefore, the area in REGISTER6 used to hold the external input binary data D is overwritten with the 13-adic data A.

Subsequently, at step S3, the 13-adic data A is processed in 171 PROCESS and converted to a Lee metric code C. Through this conversion, 28 bits of 1-PROCESS, 13-adic data A are used to generate a 48-bit code in Zp composed of p−1=12 components. Therefore, the Lee metric code C generated through 171 PROCESS includes 171 PROCESS×48 bits=8208 bits (1026 bytes). The 1026 bytes of data correspond to the capacity of byte registers on 6 columns.

Subsequently, at step S4, the Lee metric code C is held in REGISTER6. Therefore, the area in REGISTER6 used to hold the 13-adic data A is overwritten. All the registers <1:6> are used at step S4.

Thus, the binary data D input from the "binary world" in the case of $\epsilon$=4 is held in the registers <1:3> of REGISTER6. The remaining registers <4:6> are used and overwritten until the stage of holding the final data processing result, that is, the Lee metric code C, together with the register <1:3>.

Data processing at steps S1-S4 includes converting the binary data D to the 13-adic converted data A (steps S1 and S2), then converting the 13-adic data A to the Lee metric code C (steps S3 and S4), and scanning this, as shown in FIG. 8, which can be imagined as a virtual data register D-r.

In the case of data processing shown in FIG. 8, 4096 bits of data in 1 sector are subject to the process of generating 12-cell data at every PROCESS repeatedly over 171 PROCESS. Therefore, the substantial number of bits per cell comes to 4096/(171×12)=1.996.

The following description is given to the case where $\epsilon$=3, that is, errors in 3 cells of 12 cells are correctable at the maximum.

Figure 9:
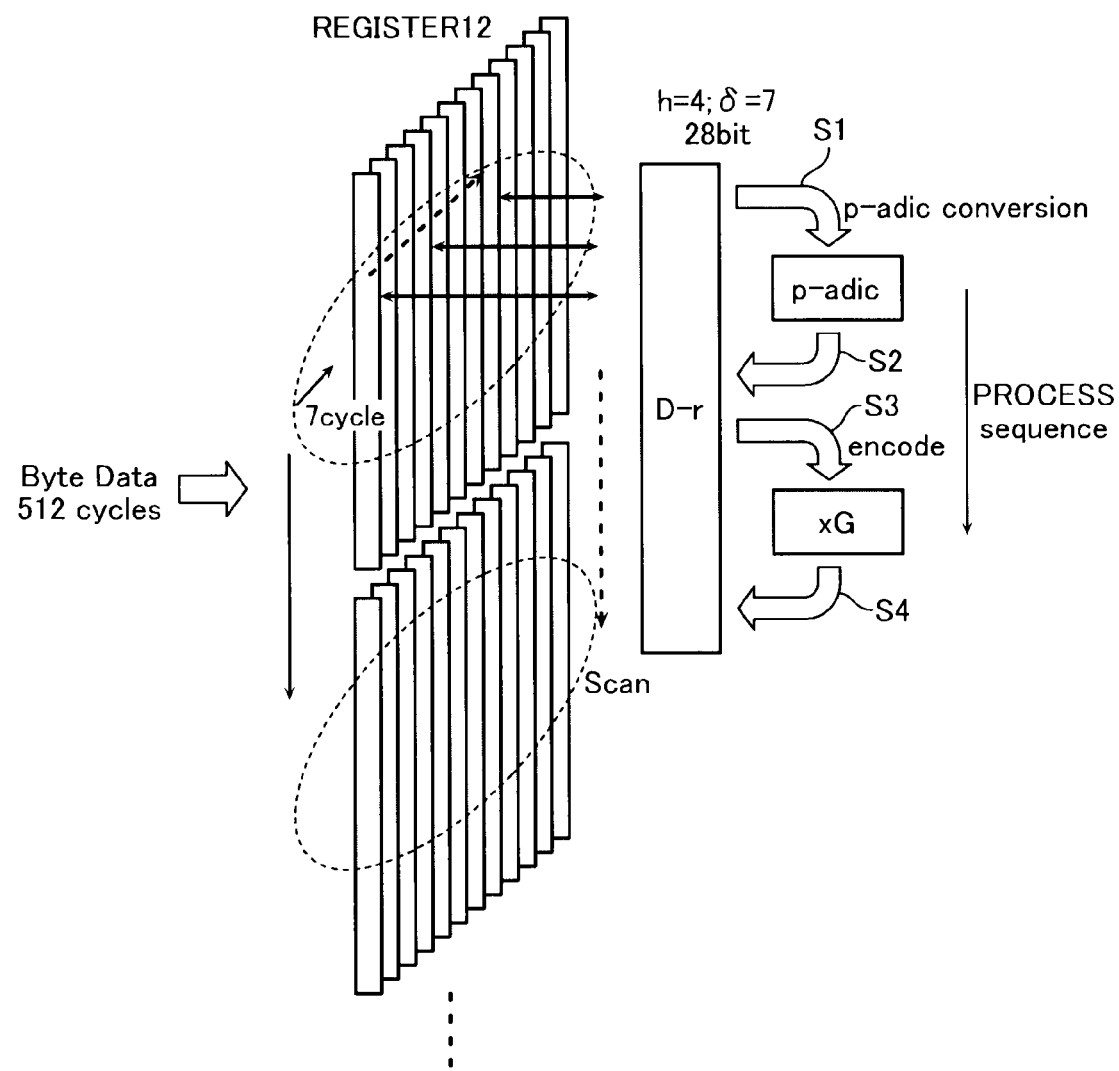
FIG. 9 is a diagram showing an example of the configuration of a register in the case of 3 cells correction/12 cells in the memory controller according to the present embodiment.

In this case, as shown in FIG. 9, the page buffers 240 can be configured conceptually on the basis of a 12-column byte register (hereinafter referred to as a "REGISTER12").

Data processing in the case of $\epsilon$=3 is executed to deal M=28 bits at every PROCESS as shown on the column c in FIG. 3. In a word, in the case of the memory controller 200, the data transfer rate is 1 byte/cycle and accordingly it is possible to accumulate 2-PROCESS data at every 7 cycles. Therefore, it is possible to execute processing of 2 PROCESS at every 7 cycles.

If 28 bits of data are processed in 1 PROCESS, processing of data in 1 sector (512 bytes) requires 147 PROCESS. Though, 147-PROCESS data includes 147×28=4116 bits more than the data in 1 sector, that is, 4096 bits (512 bytes). Therefore, it is required to add 20 dummy bits. The dummy bits may be fixed data generated in a circuit.

The external input binary data D in the case of $\epsilon$=3 is held in the registers <1:7> of the registers <1:12>. The binary data D held in the registers <1:7> is processed at the following steps S1-S4.

First, at step S1, the binary data D is processed in 147 PROCESS and converted to 13-adic data A. Through this conversion, 28 bits of 1-PROCESS data ($\delta$=6) in the "binary world" are converted to 32 bits of data ($\delta$=7) in the "p-adic Zp world", containing additional 4 bits corresponding to 1 digit of p-adic number. Therefore, the 13-adic data A generated through 147 PROCESS includes 147 PROCESS×32 bits=4704 bits. The 4704 bits of data correspond to the capacity of byte registers on 8 columns.

Subsequently, at step S2, the 13-adic data A is held in the registers <1:8> of REGISTER12. Therefore, the area in REGISTER12 used to hold the external input binary data D is overwritten with the 13-adic data A.

Subsequently, at step S3, the 13-adic data A is processed in 147 PROCESS and converted to a Lee metric code C. Through this conversion, (32×2) bits of 2-PROCESS, 13-adic data A are used to generate a (48×2)-bit code in Zp composed of p−1=12 components. Therefore, the Lee metric code C generated through 147 PROCESS includes 147 PROCESS× 48 bits=7056 bits (882 bytes). The 882 bytes of data correspond to the capacity of byte registers on 12 columns.

Subsequently, at step S4, the Lee metric code C is held in the registers <1:12>. Therefore, the area in REGISTER12 used to hold the 13-adic data A is overwritten. All the registers <1:12> are used at step S4.

Thus, the binary data D input from the "binary world" in the case of $\epsilon$=3 is held in the registers <1:7> of REGISTER12. The remaining registers <8:12> are used and overwritten until the stage of holding the final data processing result, that is, the Lee metric code C, together with the registers <1:7>.

Data processing at steps S1-S4 includes converting the binary data D to the 13-adic converted data A (steps S1 and S2), then converting the 13-adic data A to the Lee metric code C (steps S3 and S4), and scanning this, as shown in FIG. 9, which can be imagined as a virtual data register D-r.

In the case of data processing shown in FIG. 9, 4096 bits of data in 1 sector are subject to the process of generating 12-cell data at every PROCESS repeatedly over 147 PROCESS. Therefore, the substantial number of bits per cell comes to 4096/(147×12)=2.322.

The following description is given to the case where $\epsilon$=2, that is, errors in 2 cells of 12 cells are correctable at the maximum.

Figure 10:
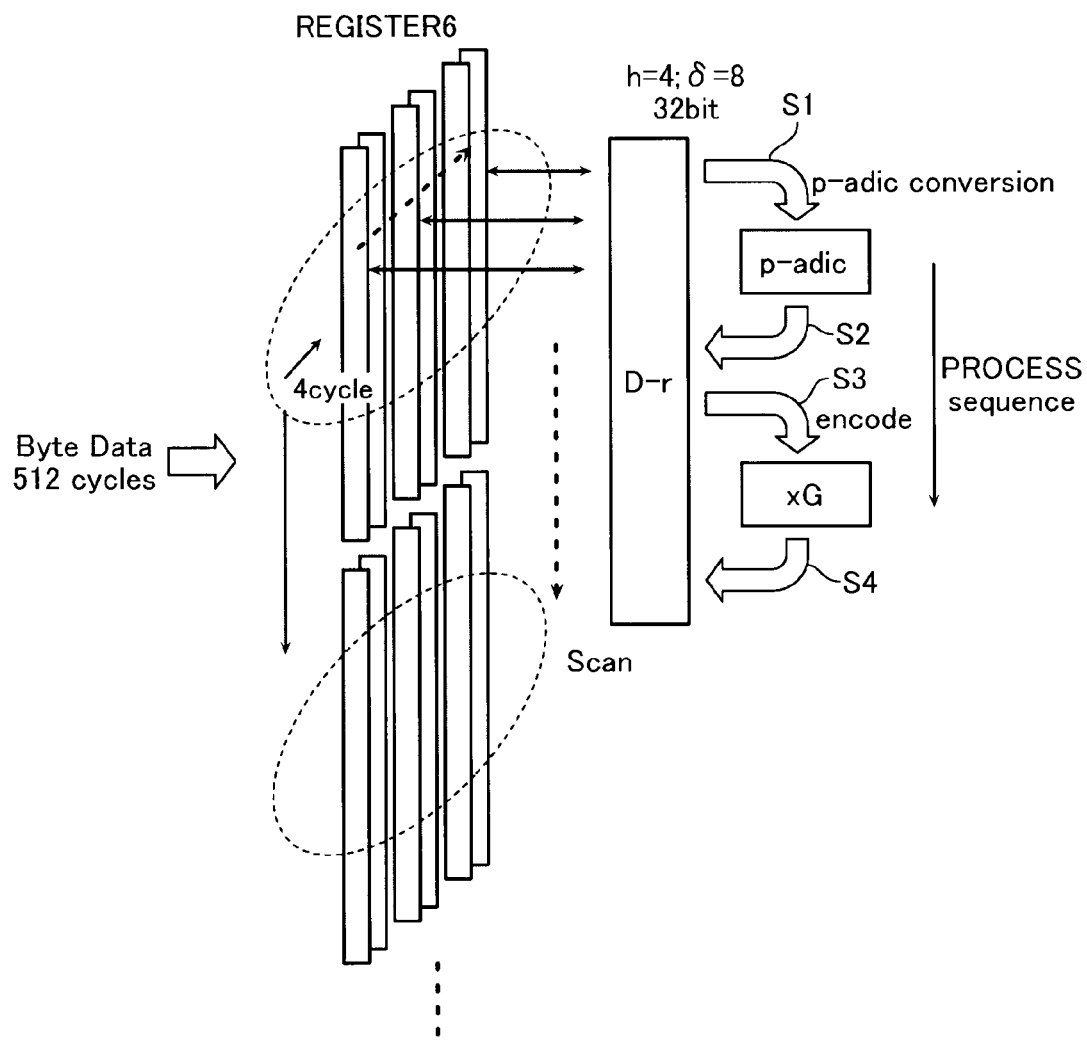
FIG. 10 is a diagram showing an example of the configuration of a register in the case of 2 cells correction/12 cells in the memory controller according to the present embodiment.

In this case, as shown in FIG. 10, the page buffers 240 can be configured conceptually on the basis of a 6-column byte register (hereinafter referred to as a "REGISTER6").

Data processing in the case of $\epsilon$=2 is executed to deal M=32 bits at every PROCESS as shown on the column b in FIG. 3. In a word, in the case of the memory controller 200, the data transfer rate is 1 byte/cycle and accordingly it is possible to accumulate 1-PROCESS data at every 4 cycles. Therefore, it is possible execute processing of 1 PROCESS at every 4 cycles.

If 32 bits of data are processed in 1 PROCESS, processing of data in 1 sector (512 bytes) requires 128 PROCESS. Though, 128-PROCESS data includes 128×32=4096 bits (512 bytes) just the same as the data in 1 sector, that is, 4096 bits (512 bytes). The addition of dummy bits as in the case of $\epsilon$=4, 3 is not required.

The external input binary data D in the case of $\epsilon$=2 is held in the registers <1:4> of REGISTER6. The binary data D held in the registers <1:4> is processed at the following steps S1-S4.

First, at step S1, the binary data D is processed in 128 PROCESS and converted to 13-adic data A. Through this conversion, 32 bits of 1-PROCESS data ($\delta$=6) in the "binary data" are converted to 36 bits of data ($\delta$=7) in the "p-adic Zp world", containing additional 4 bits corresponding to 1 digit. Therefore, the 13-adic data A generated through 128 PROCESS includes 128 PROCESS×36 bits=4608 bits. The 4608 bits of data correspond to the capacity of byte registers on 4.5 columns.

Subsequently, at step S2, the 13-adic data A, having a data quantity corresponding to the byte registers on 4.5 columns, is held in the registers <1:5> of REGISTER6. Therefore, the area in REGISTER6 used to hold the external input binary data D is overwritten with the 13-adic data A.

Subsequently, at step S3, the 13-adic data A is processed in 128 PROCESS and converted to a Lee metric code C. Through this conversion, 36 bits of 1-PROCESS, 13-adic data A are used to generate a 48-bit code in Zp composed of p−1=12 components. Therefore, the Lee metric code C generated through 128 PROCESS includes 128 PROCESS×48 bits=6144 bits (768 bytes). The 768 bytes of data correspond to the capacity of byte registers on 6 columns.

Subsequently, at step S4, the Lee metric code C is held in the registers <1:6>. Therefore, the area in REGISTER6 used to hold the 13-adic data A is overwritten. All the registers <1:6> are used at step S4.

Thus, the binary data D input from the "binary world" in the case of $\epsilon$=2 is held in the registers <1:4> of REGISTER6. The remaining registers <5:6> are used and overwritten until the stage of holding the final data processing result, that is, the Lee metric code C, together with the register <1:4>.

Data processing at steps S1-S4 includes converting the binary data D to the 13-adic converted data A (steps S1 and S2), then converting the 13-adic data A to the Lee metric code C (steps S3 and S4), and scanning this, as shown in FIG. 10, which can be imagined as a virtual data register D-r.

In the case of data processing shown in FIG. 10, 4096 bits of data in 1 sector are subject to the process of generating 12-cell data at every PROCESS repeatedly over 128 PROCESS. Therefore, the substantial number of bits per cell comes to 4096/(128×12)=2.667.

Figure 11:
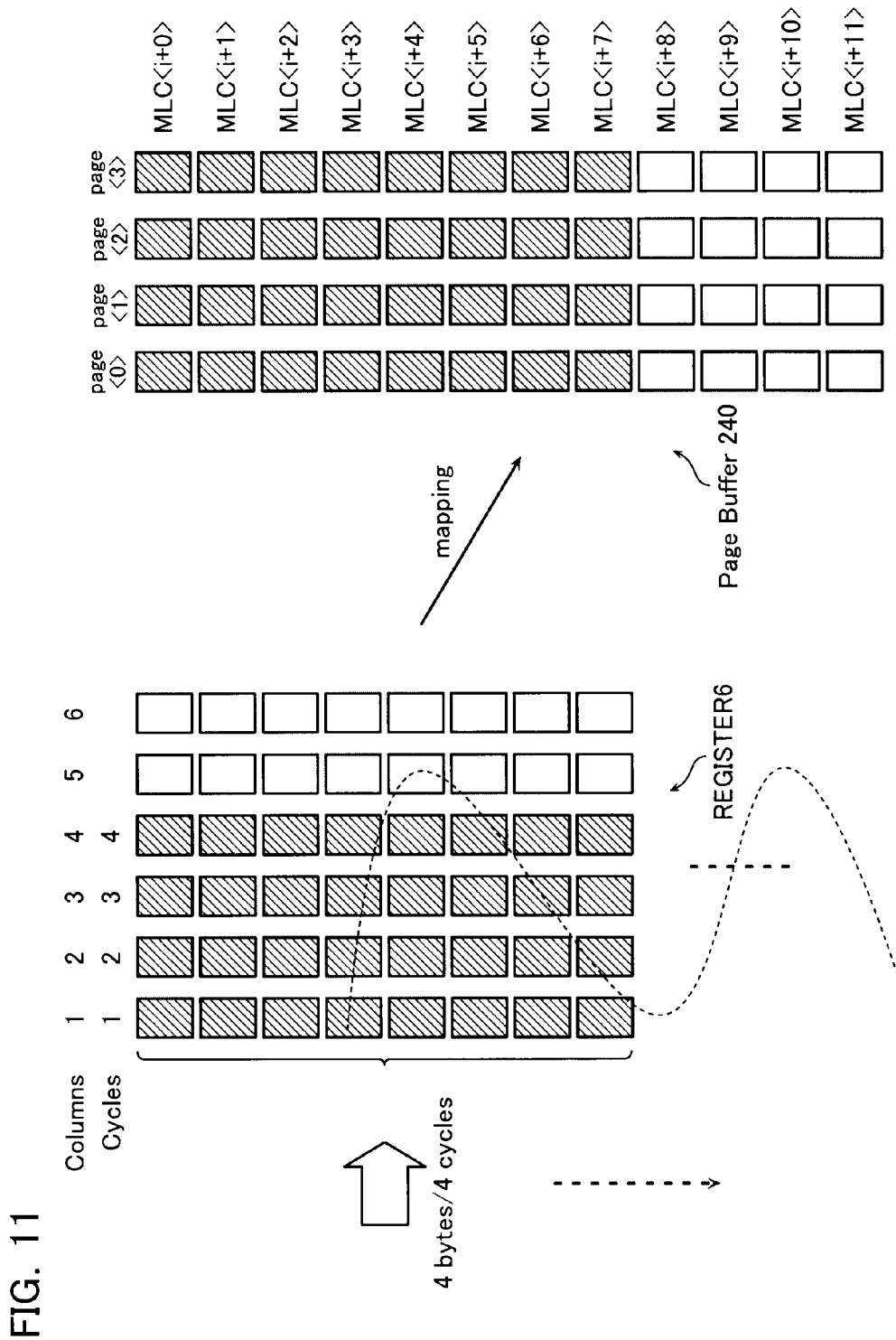
FIG. 11 is a diagram showing an example of the relation between the register and the page buffer in the memory system according to the present embodiment.

Next, in the case of $\epsilon$=2, an example is described on the relation between REGISTER6 and the page buffers with reference to FIG. 11. The hatched part shown in FIG. 11 indicates the area filled with 32 bits of binary data D given in 4 cycles from the "binary world".

REGISTER6 is a group of 8-row, 6-column registers. When this is viewed as the page buffers 240 in the memory controller 200, it turns to a group of 12-row, 4-column registers as shown in FIG. 11. The columns of the 12-row, 4-column register group correspond to the pages <0>-<4>, respectively.

With regard to a certain i-th PROCESS, the input binary data D is held in 8 MLCs <i+0> to <i+7> of 12 MLCs <i+0> to <i+11> first as shown in FIG. 11, and then the MLCs containing the remaining MLCs <i+8> to <i+11> are overwritten in turn with data during the process of data processing as can be considered imaginarily.

As described above, the memory controller 200 according to the present embodiment uses the page buffers 240 in multiple during the process of data processing.

Next, in the case of $\epsilon$=2, the process of processing sector data in REGISTER6 at the time of data writing is described with reference to FIG. 12.

Figure 12:
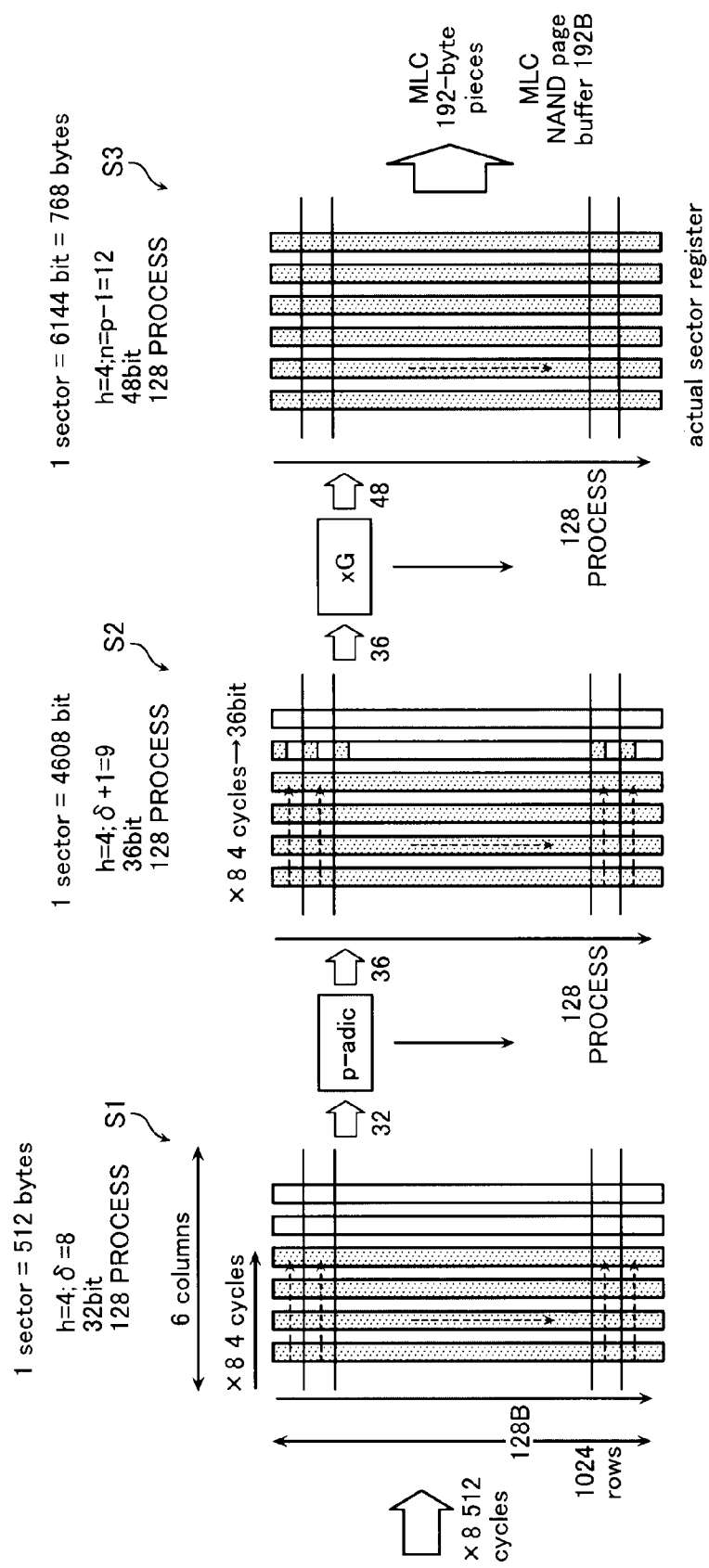
FIG. 12 is a diagram illustrative of write processing at every sector in the memory controller according to the present embodiment.

FIG. 12 shows, sequentially from the left, the state of REGISTER6 at the time of burst transfer of binary data (S1 in FIG. 12), the state of REGISTER6 after the p-adic conversion (S2 in FIG. 12), and the state of REGISTER6 after the Lee metric code conversion (S3 in FIG. 12). The solid line passing through the registers in FIG. 12 indicates the boundary of a byte register at every 8 bits.

The sector register, or REGISTER6, is configured to include 1024 registers aligned in 6 columns and has a receiving portion of 1024 rows for 768-byte data transfer. Of 6 columns, No. 1-4 columns are used in data transfer and the remaining No. 5-6 columns are used in holding the target data after data transfer.

At S1 in FIG. 12, the transferred binary data is stored in order byte by byte in the registers on No. 1-4 columns at every 4 cycles in the row direction. This operation is repeated 128 times. As a result, the registers store 128 bytes of binary data on every column. The total number of cycles in a series of operations is equal to 512 cycles.

Thus, the sector register stores 128-PROCESS, 32-bit binary data corresponding to h=4, δ=8 of a 10-digit, $2^4$-adic number.

At S2 in FIG. 12, 32-bit binary data is converted to a 9-digit, p-adic number (p=13), that is, 36-bit data and overwritten in the sector register. This PROCESS is executed to registers at every 8 rows. The original register block is configured in 1024 rows by 6 columns and is filled at every 8 rows per PROCESS in a total of 128 PROCESS. Until now, the transition from the "binary world" to the "p-adic Zp world" in 1 sector is completed.

At S3 in FIG. 12, the p-adic data is converted to a Lee metric code.

The Lee metric code is data having components that correspond to (p−1) (=12) elements in Zp. A Lee metric code by 1 PROCESS is 48-bit data resulted from 36-bit, p-adic data multiplied by a G matrix. The 1-PROCESS Lee metric code is overwritten and stored in one 8-row, 6-column register block. In this case, 1 sector register is entirely filled with the Lee metric code in 128 PROCESS. Thus, the sector register can hold the data to be written in 192-byte pieces of MLCs.

Thus, processing in 3 stages shown at S1-S3 in FIG. 12 sequentially advances at every 8-row, 6-column register block.

In the memory controller 200, the sector register is overwritten with data twice: at the time of conversion from 512-byte binary data to p-adic data; and at the time of conversion from the p-adic data to a Lee metric code, which is written in 192-byte pieces of MLCs.

For example, if the memory device 100, that is, the MLC NAND flash memory has a page configuration of 8 sectors each composed of (512+16) bytes, 4 pages contain data for ((512++16) bytes×8) pieces of MLCs. Accordingly, the levels of 192-byte pieces of MLCs correspond to 22 sector registers herein described. Therefore, the page buffers 240 in the memory controller 200 comprise 22 sector registers and the data in the page buffers 240 are transferred as 4 pages of data to the MLC NAND flash memory.

If the memory device 100, that is, the MLC NAND flash memory has a page configuration of 4 sectors each composed of (512+16) bytes, 4 pages contain data for ((512+16) bytes× 4) pieces of MLCs. Accordingly, the levels of 192-byte pieces of MLCs correspond to 11 sector registers herein described. Therefore, the page buffers 240 in the memory controller 200 comprise 11 sector registers and the data in the page buffers 240 are transferred as 4 pages of data to the MLC NAND flash memory.

Next, the process of data processing in the sector register at the time of data read is described with reference to FIG. 13.

Figure 13:
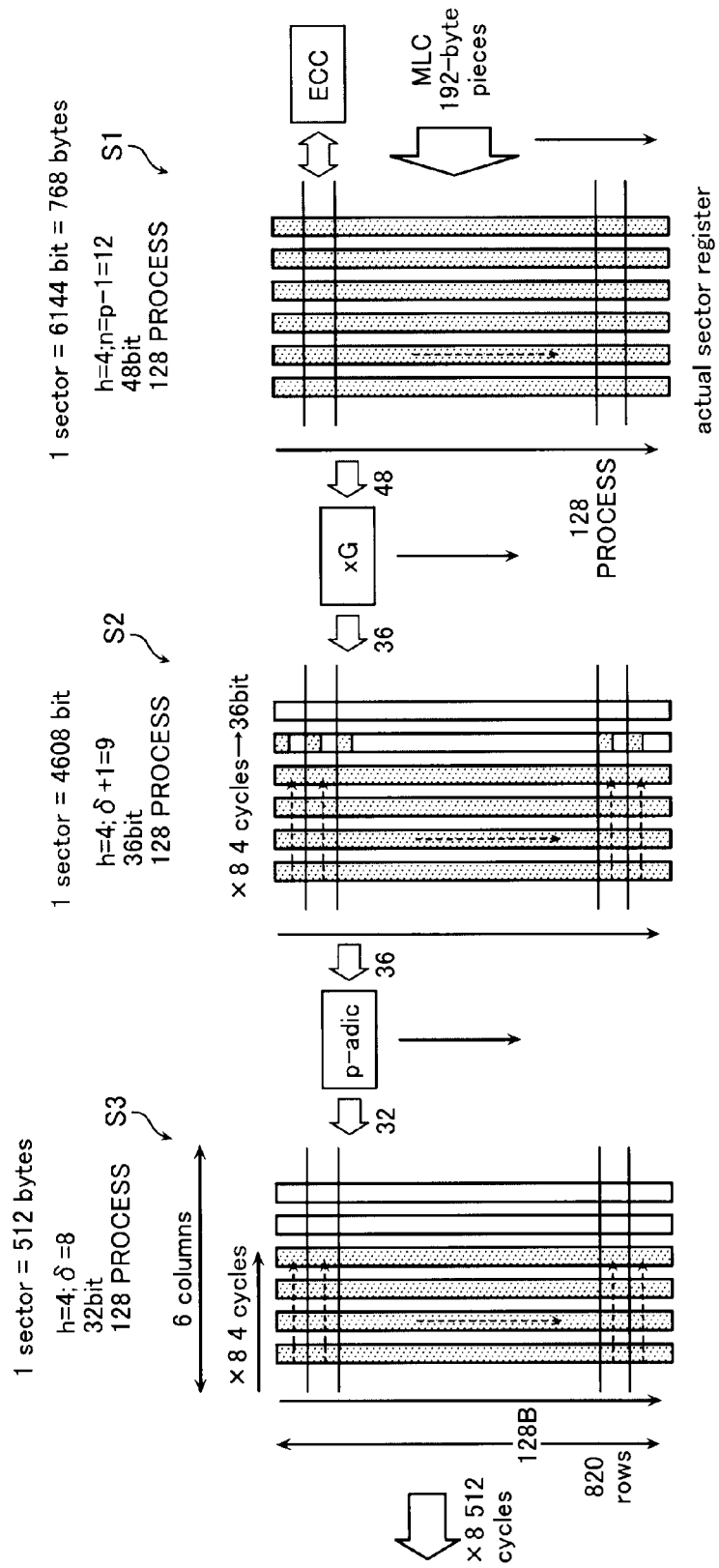
FIG. 13 is a diagram illustrative of read processing at every sector in the memory controller according to the present embodiment.

At S1 in FIG. 13, 4 pages of data in the MLC NAND flash memory are transferred collectively at every data stored in 192-byte pieces of MLCs to the page buffers 240 in the memory controller 200.

The 128-PROCESS, 768-byte data stored in the sector register is subject to computation processing by ECC, at every 1-PROCESS data stored in an 8-row, 6-column register block, beginning from the sector register end, then error-corrected if enable, and left as it is if unable. Then, 128 PROCESS can be applied to complete ECC processing over all data in 1 sector to restore the Lee metric code.

At S2 in FIG. 13, the Lee metric code restored at S1 in FIG. 13 is converted to 13-adic data sequentially. Here, the Lee metric code corresponding to 1 sector is subject to an inverse conversion of the generator matrix G at every 48 bits corresponding to 1 PROCESS such that it is converted to 4-bit, 9-digit-represented 13-adic data and then overwritten in each register block.

At S3 in FIG. 13, the 13-adic data generated at S2 in FIG. 13 is converted to $2^4$-adic binary data. The "p-adic to binary decode" circuit block 260 converts the 1-PROCESS, 13-adic data to 4-bit, 8-digit, 32-bit binary data and then overwrites the binary data at every 8-row, 6-column register block.

Thereafter, the binary data is read out at every 8-row, 5-column register group in column order at a rate of 1 byte/cycle and provided as 1-sector data.

Thus, in the memory controller 200, the sector register is overwritten with data twice: at the time of conversion from the Lee metric code to p-adic data executed after ECC processing; and at the time of conversion from the p-adic data to binary data.

A specific example is described next on the important part of the specification of the memory controller, that is, the method of using the page buffers 240, and data transfer processing. The characteristics are grouped here in the case where the number of levels of MLCs used in the memory device 100 is equal to 16 and 8.

The number of MLC levels determines the prime p for use, thereby determining the number of cells required for coding accordingly. The use of 16-level MLCs requires p=13 and accordingly 12 (=p−1) MLCs are used to hold coded data. Therefore, in the case of ϵ=2, it is possible to correct errors in 2 MLCs of 12 MLCs at the maximum.

On the other hand, the use of 8-level MLCs requires p=7 and accordingly 6 (=p−1) MLCs are used to hold coded data. Therefore, in the case of ϵ=1, it is possible to correct an error in 1 MLC of 6 MLCs at the maximum.

Even if either 16-level or 8-level MLCs are used, it is possible to remedy 2 or 1 mLC at every small number of MLCs. Accordingly, the memory controller 200 has higher remedy efficiency over errors in MLCs as can be said.

If it is intended to attain the error remedy efficiency equivalent to that in the memory controller 200 through the conventional ECC method, for example, with the use of a binary BCH code, a wider memory redundant area and an enormous circuit area are required.

Subsequently, the configuration of the memory controller 200 is shown below.

In the case of p=13, ϵ=2: A data interface is configured at every×8 1-byte. The data interface operates in sync with clocks. Data transfer is executed at every sector of 512 bytes.

As shown on the column b in FIG. 3, 1 PROCESS is executed at every 32 bits of binary data. Therefore, 1 sector is converted to data in the "p-adic Zp world" in 128 PROCESS.

The NAND flash memory has a page size of 4 sectors or 8 sectors while the data transfer from the memory controller 200 to the memory device 100 is executed continuously over 4 pages. Therefore, the memory controller 200 forms a page with a larger number of sectors than that in the memory device 100. For example, the previous example forms a page with 11 sectors or 22 sectors while the number of sectors contained in a page is not specified here because it varies in accordance with the application field of the memory system.

The sectors contained in a page are accessed at random.

Access from the memory controller 200 to 16-level MLCs in the memory device 100 is executed at every 4 pages.

In the case of p=7, ϵ=1: A data interface is configured at every×8 1-byte. The data interface operates in sync with clocks. Data transfer is executed at every sector of 512 bytes.

As shown on the column a in FIG. 4, 1 PROCESS is executed at every 9 bits of binary data. Therefore, 1 sector is converted to data in the "p-adic Zp world" in 456 PROCESS.

The NAND flash memory has a page size of 4 sectors or 8 sectors while the data transfer from the memory controller 200 to the memory device 100 is executed continuously over 3 pages. Therefore, the memory controller 200 forms a page with a larger number of sectors than that in the memory device 100. The number of sectors contained in a page is not specified in the specification skeleton because it varies in accordance with the application field of the memory system.

The sectors contained in a page are accessed at random.

Access from the memory controller 200 to 16-level MLCs in the memory device 100 is executed at every 3 pages.

<13-adic Converter Unit>

A specific example is described below on a circuit that applies data processing at the memory controller 200.

The following description is given to a binary/p-adic (13-adic) converter circuit required at the entrance and the exit of the memory controller 200.

Figure 14:
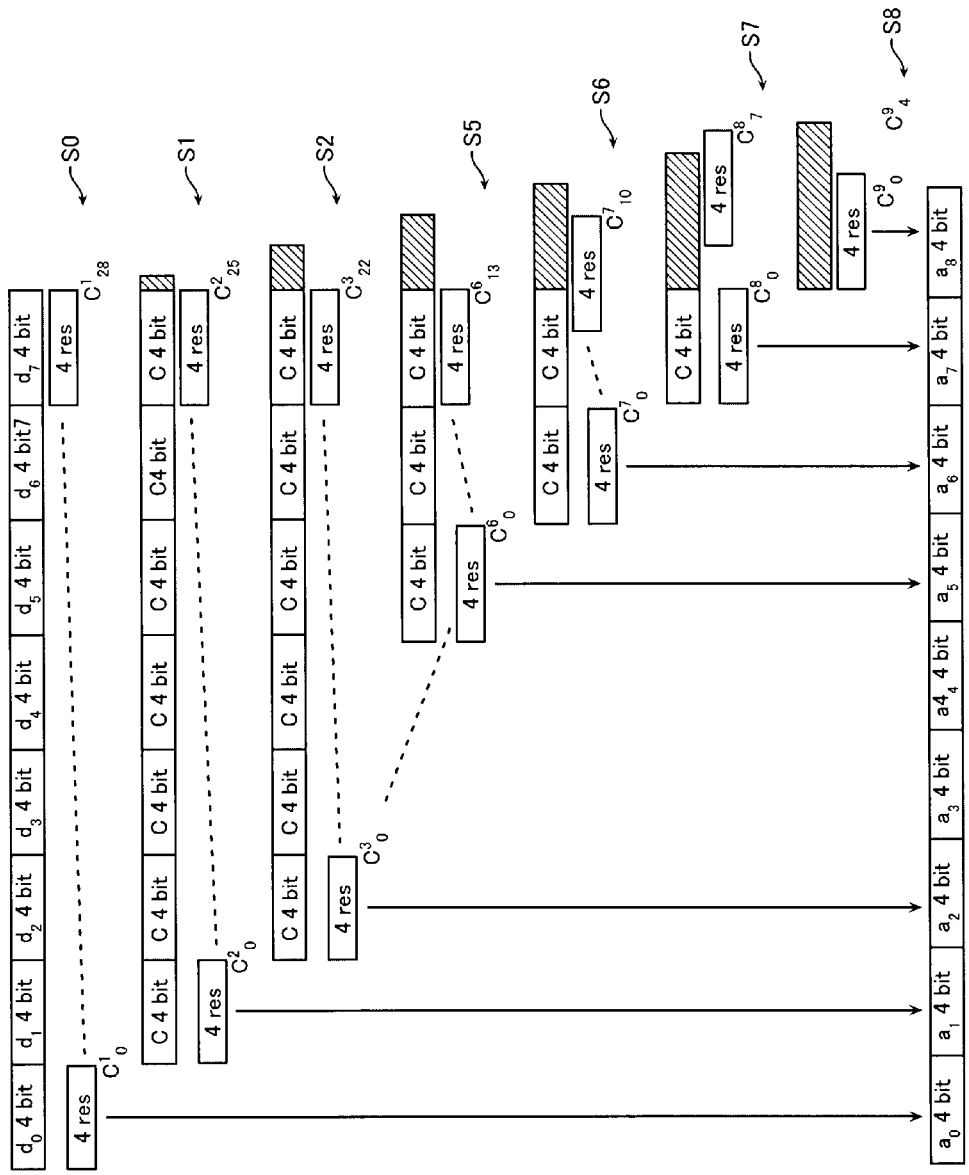
FIG. 14 is a diagram illustrative of the configuration of a to-13-adic converter unit in the memory controller according to the present embodiment.

FIG. 14 is a diagram schematically showing the configuration of the process of conversion computation from a $\delta$-digit, $2^h$-adic number D ($d_0, d_1, \ldots, d_{\delta-1}$) in the "binary world" to a ($\delta$+1)-digit, p-adic number A ($a_0, a_1, \ldots, a_{\delta-1}, a_\delta$) in the "p-adic Zp world" in the case of p=13. The hatched part shown in FIG. 14 indicates data after completion of processing.

A square shown with "4 res" in FIG. 14 indicates an operating circuit operative to derive a quotient and the residue from the input binary data divided by 13. The input to the operating circuit is 5-bit binary data and the output therefrom is the residue derived from the binary data divided by 13. If the input binary data is larger than 13, then the quotient is output as a carry C. Hereinafter, the operating circuit element is referred to as a "4 res" circuit block.

At the start, at the 0-th step (S0 in FIG. 14), 8-digit, $2^4$-adic data D ($d_0, d_1, \ldots, d_7$) is subject to numeration from $d_7$ on the rightmost side. Here, with respect to $d_7$, the flow directly generates the residue and a quotient or carry $C^1_{28}$ by substituting 0 for the most significant bit of 5-bit binary data input to the "4 res" circuit block and dividing $d_7$ by 13.

Subsequently, 5-bit binary data, of which No. 4-1 bits are the outputs from the previous "4 res" circuit block (the residue represented by 4 bits) and No. 0 bit (the least significant bit) is the most significant bit $D^6_3$ ($=D_{27}$) of $d_6$, is input to the next "4 res" circuit block, which generates the residue and a quotient or carry $C^1_{27}$ derived from the input binary data divided by 13.

Thereafter, until No. 0 bit of 5-bit binary data input to the "4 res" circuit block reaches the least significant bit $D^0_0$ ($=D_0$) of $d_0$, 29 "4 res" circuit blocks are used to generate carries $C^1_0$-$C^1_{28}$. Binary data expressed by these generated carries $C^1_0$-$C^1_{28}$ indicates the number of 13s contained in the data D.

The output from the "4 res" circuit block having the input of $d_0$ has a binary representation of $a_0$ in a 9-digit, 13-adic number D ($a_0, a_1, \ldots, a_8$).

Subsequently, at the 1st step (S1 in FIG. 14), over the number of 13s contained in the data D obtained at the 0-th step, a further computation is executed to determine how many 13s are contained to seek the number of $13^2$s, thereby obtaining a binary of a coefficient $a_1$ on a digit with a weight of $13^1$ in the 13-adic number D.

At the 1st step, numeration of 13 is executed to the carries $C^1_0$-$C^1_{28}$ from $C^1_{28}$ on the rightmost side. At the time of the numeration of 13 executed to the carries $C^1_{25}$-$C^1_{28}$, the flow directly generates the residue and a carry $C^2_{25}$ by substituting 0 for the most significant bit of 5-bit input binary data and dividing the input binary data by 13.

Subsequently, 5-bit binary data, of which No. 4-1 bits are the outputs from the previous "4 res" circuit block (the residue represented by 4 bits) and No. 0 bit (the least significant bit) is $C^1_{24}$, is input to the next "4 res" circuit block, which generates the residue and a quotient or carry $C^2_{24}$ derived from the input binary data divided by 13.

Thereafter, until No. 0 bit of 5-bit binary data input to the "4 res" circuit block reaches the least significant bit $C^1_0$ of $C^1_i$, 26 "4 res" circuit blocks are used to generate carries $C^2_0$-$C^2_{25}$. Binary data expressed by these generated carries $C^2_0$-$C^2_{25}$ indicates the number of primes $13^2$s contained in the data D.

The output from the "4 res" circuit block having the input of $C^1_0$ has a binary of $a_1$ in a 9-digit, 13-adic number D ($a_0, a_1, \ldots, a_8$).

At the subsequent 2nd step (S2 in FIG. 14), over the number of $13^2$s contained in the data D obtained at the 1st step, a further computation is executed to determine how many primes 13 are contained to seek the number of $13^3$s, thereby obtaining a binary of a coefficient $a_2$ on a digit with a weight of $13^2$ in the 13-adic number D.

Thereafter, the flow advances up to the 8th step (S8 in FIG. 14) similarly to obtain a binary representation of a coefficient $a_8$ on a digit with a weight of $13^8$ in the 13-adic number.

The carries $C^9_0$-$C^9_4$ at the 8th step are not used in computation.

A consideration is given next to the configuration of the 13-adic converter unit 210' using "5 bit mod 13" circuit blocks. The "5 bit mod 13" circuit block is a circuit that compares an input A or 5-bit binary data with a prime 13, then provides PF0='1' if A is equal to or higher than 13 and provides the residue Q of A by the prime 13. The details are described later.

Figure 15:
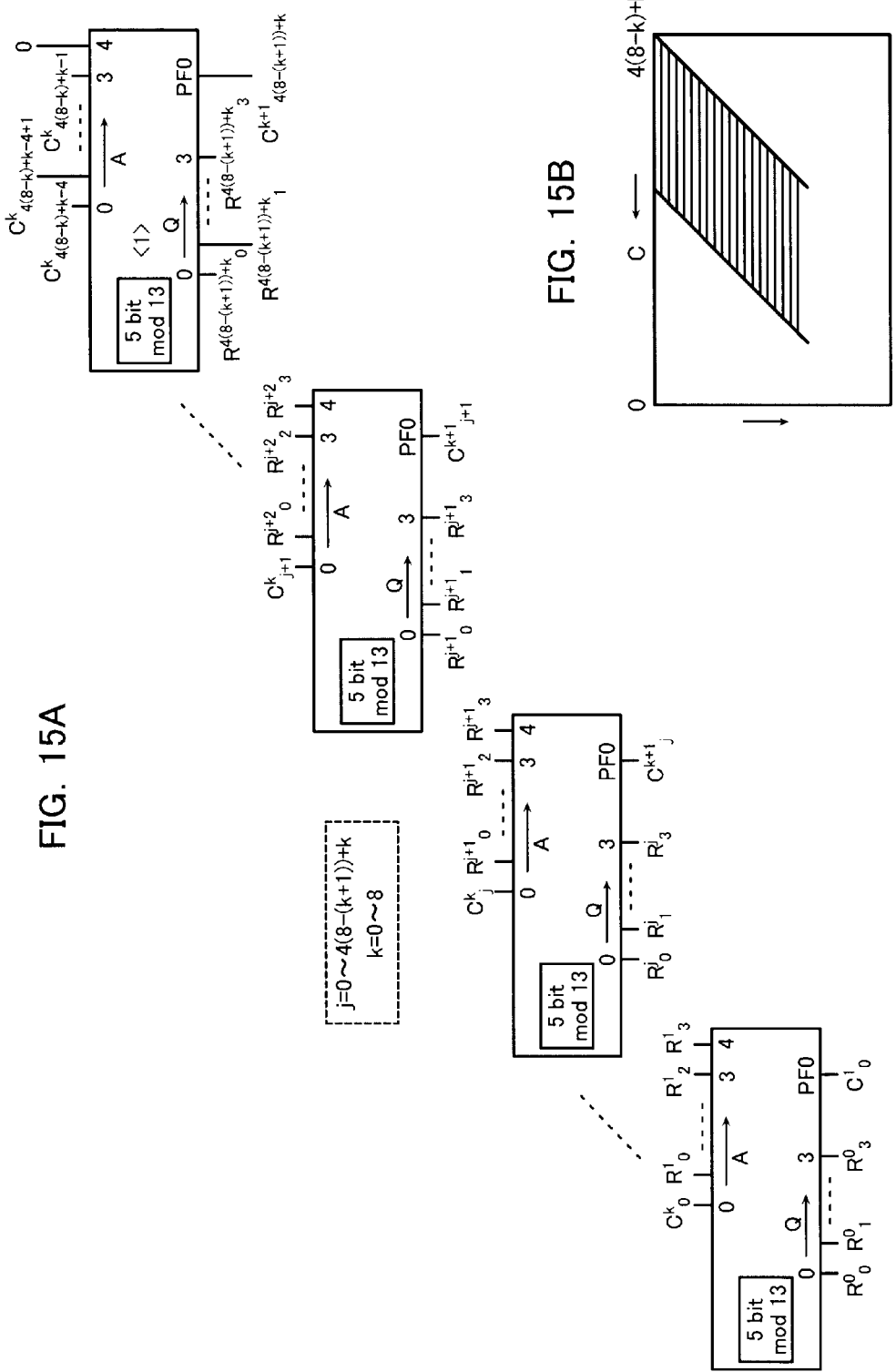
FIG. 15A is a block diagram of a to-13-adic converter circuit corresponding to 1 step ("X to p" circuit block) in the memory controller according to the present embodiment.
FIG. 15B is a schematic diagram showing the execution order of the "X to p" circuit block, on conversion from a binary to a 13-adic number, in the memory controller according to the present embodiment.

FIG. 15A shows a circuit at the k-th step in the 13-adic converter unit 210', which is configured with "5 bit mod 13" circuit blocks.

Here, the j-th digit is denoted with $d_j$ when data is subject to an 8-digit, $2^4$-adic expression. In this case, $d_j$ can be indicated in 4-bit binary though the coefficient D of the indication is expressed in common with the coefficient D of other d. For that purpose, sub-indexes are used as shown in Expression 3.

$$d_j = D^j_0 + D^j_1 2 + D^j_2 2^2 + D^j_3 2^3$$

$$d_j(2^4)^j = D_{4j} 2^{4j} + D_{4j+1} 2^{4j+1} + D_{4j+2} 2^{4j+2} + D_{4(j+1)-1} 2^{4(j+1)-1}$$

[Expression 3]

The input to the operation at the k-th step, that is, the carry at the previous step (the (k−1)-th step) is $C^k_0$-$C^k_{4(8-k)+k-1}$, which is the coefficient as a binary including the sub-index as an exponential of 2, and the numeral expressed by this binary indicates the number of $13^k$s contained in the data.

At the k-th step, the input includes 4(8−k)+k pieces of binaries (carries $C^k_0$-$C^k_{4(8-k)+k-1}$) as shown in FIG. 15A, which are received at 4(8−(k+1))+k+1 pieces of "5 bit mod 13" circuit blocks.

The 1st "5 bit mod 13" circuit block <1> receives $C^k_{4(8-k)+k-4}$ to $C^k_{4(8-k)+k-1}$ and 0 on the input binary $A_0$-$A_3$, $A_4$, and provides $R^{4(8-(k+1))+k}_0$ to $R^{4(8-(k+1))+k}_3$ and $C^{k+1}_{4(8-(k+1))+k}$ from the outputs $Q_0$-$Q_3$ and the carry PF0, respectively.

The 2nd "5 bit mod 13" circuit block <2>, not shown, receives a carry $C^k_{4(8-(k+1))+k-1}$ and the outputs $R^{4(8-(k+1))+k}_0$ to $R^{4((8-(k+1))+k}_3$ from the 1st "5 bit mod 13" circuit block <1> on the input binary $A_0, A_1$-$A_4$, and provides $R^{4(8-(k+1))+k-1}_0$ to $R^{4(8-(k+1))+k-1}_3$ and $C^{k+1}_{4(8-(k+1))+k-1}$ from the outputs $Q_0$-$Q_3$ and the carry PF0, respectively.

Thereafter, as shown in FIG. 15A, "5 bit mod 13" circuit blocks having the similar input/output are aligned 4(8−(k+1))+k+1 pieces in total, and the carries $C^{k+1}_0$ to $C^{k+1}_{4(8-(k+1))+k}$ output from the "5 bit mod 13" circuit blocks turn to the inputs at the next step, that is, the (k+1)-th step.

Thus, the conversion of a binary to a 13-adic number is executed sequentially from the most significant bit of the carry C as in the schematic diagram shown in FIG. 15B.

FIG. 15A shows the circuitry related to the k-th step. The circuitry shown in FIG. 15A can be used over steps if the steps are processed in time division. In this case, for the purpose of using simple on/off for control of the inputs/outputs of the "5 bit mod 13" circuit blocks, the circuitry at the 0-th step having the maximum number of required "5 bit mod 13" circuit blocks is additionally provided with 8 "5 bit mod 13" circuit blocks.

Figure 16:
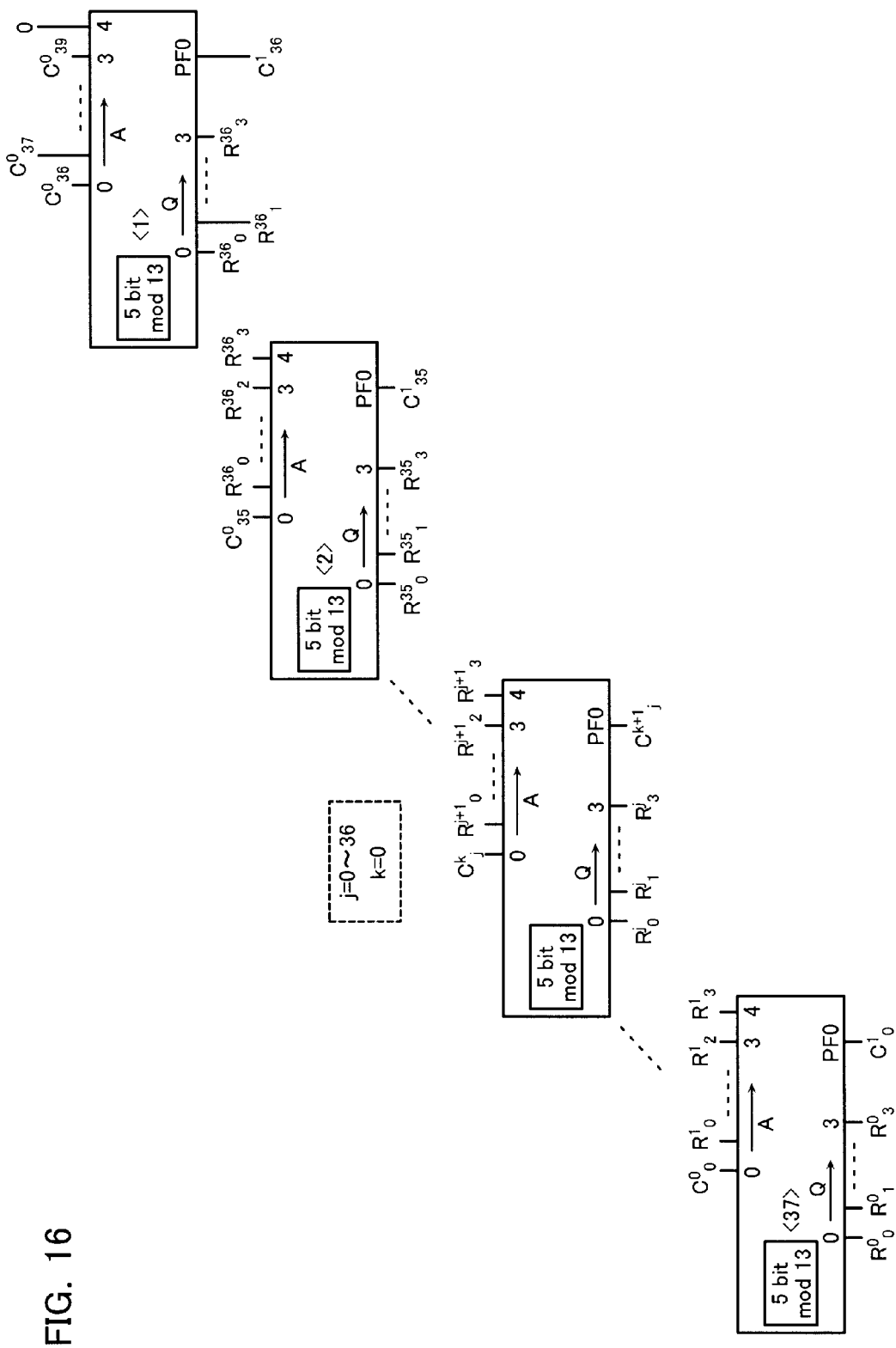
FIG. 16 is a block diagram of the "X to p" circuit block in the memory controller according to the present embodiment.

A circuit including 37 "5 bit mod 13" circuit blocks thus configured is shown in FIG. 16. Hereinafter, this circuit is referred to as an "X to p" circuit block.

Figure 17:
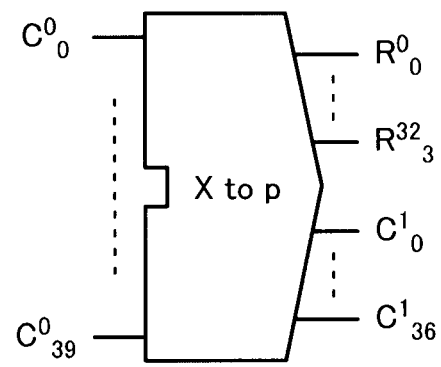
FIG. 17 is a diagram showing a circuit symbol of the "X to p" circuit block in the memory controller according to the present embodiment.

As shown in FIG. 17, the inputs to the "X to p" circuit block include $C^0_0$-$C^0_{39}$, 40 pieces in total, 8 pieces more than those in the case of k=0 in FIG. 15A. The outputs therefrom include 9 4-bit binaries $R^0_0$-$R^0_3$, $R^4_0$-$R^4_3$, ..., $R^{28}_0$-$R^{28}_3$, $R^{32}_0$-$R^{32}_3$ output from every 4 "5 bit mod 13" circuit blocks, and 37 carries $C^1_0$-$C^1_{36}$, which are used as the inputs at the next step.

Next, the "5 res" circuit block shown in FIG. 14, that is, the "5 bit mod 13" circuit block is described specifically.

Figure 18:
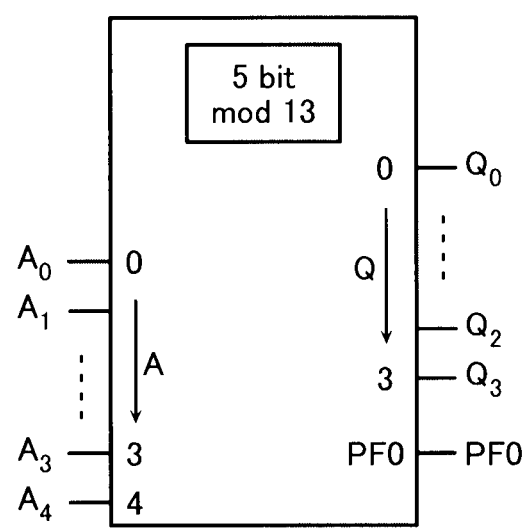
FIG. 18 is a diagram showing a circuit symbol of an operating circuit element for deriving elements in Zp ("5 bit mod 13" circuit block) in the memory controller according to the present embodiment.

FIG. 18 is a diagram showing a circuit symbol of the "5 bit mod 13" circuit block. The "5 bit mod 13" circuit block receives a 5-bit binary $A_0$-$A_4$ and provides a 4-bit binary $Q_0$-$Q_3$ and a carry PF0.

The "5 bit mod 13" circuit block provides the residue Q of the input binary A by the prime 13, and provides '1' from PF0 if the input binary A is equal to or more than 13 and '0' from PF0 if it is lower than 13.

In the case of h=4, p=13, relations shown in Expression 4 can establish among the binary A, the binary Q and the prime p.

$$a = A_0 + A_1 2 + A_2 2^2 + A_3 2^3 + A_4 2^4$$

$$Q \equiv a (\bmod p)(a = Q + PF0 \times p)$$

$$Q = Q_0 + Q_1 2 + Q_2 2^2 + Q_3 2^3 \quad \text{[Expression 4]}$$

Figure 19:
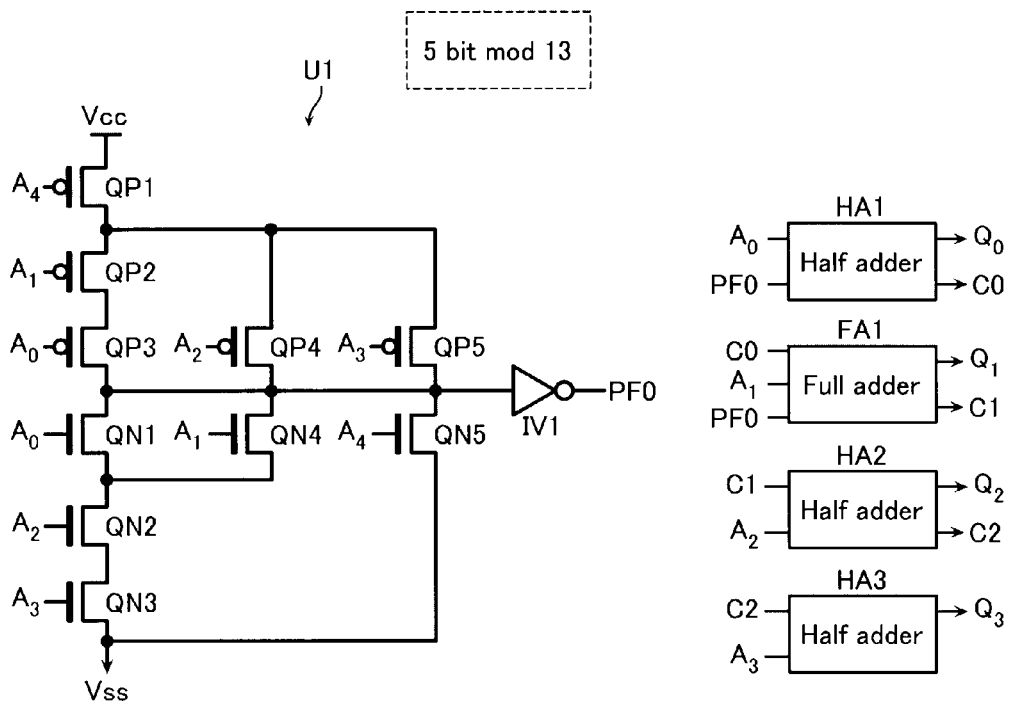
FIG. 19 is a block diagram of the "5 bit mod 13" circuit block in the memory controller according to the present embodiment.

FIG. 19 is a block diagram of the "5 bit mod 13" circuit block.

The "5 bit mod 13" circuit block comprises a PF0 generator unit U1, 2 half adders HA1-HA3, and a full adder FA1.

The PF0 generator unit U1 includes serially connected PMOS transistors QP1-QP3 and NMOS transistors QN1-QN3 between the Vcc terminal supplied with a certain voltage and the Vss terminal supplied with the ground voltage. These transistors QP1, QP2, QP3, QN1, QN2 and QN3 are controlled by $A_4$, $A_1$, $A_0$, $A_0$, $A_2$ and $A_3$, respectively.

The PF0 generator unit U1 also includes 2 PMOS transistors QP4, QP5, 2 NMOS transistors QN4, QN5, and an inverter IV1.

The transistors QP4, QP5 are connected between the source of the transistor QP2 and the drain of the transistor QP3 in parallel. The transistor QN4 is connected between the source and drain of the transistor QN1 in parallel. The transistor QN5 is connected between the source of the transistor QN1 and the drain of the transistor QN3 (Vss terminal) in parallel. These transistors QP4, QP5, QN4 and QN5 are controlled by $A_2$, $A_3$, $A_1$ and $A_4$, respectively.

The inverter IV1 has an input connected to the sources of transistors QN1, QN4 and QN5. The output from the inverter IV1 provides the carry PF0.

The half adder HA1 has inputs $A_0$ and PF0, an output $Q_0$, and a carry output C0. The full adder FA1 has inputs C0 and $A_1$, a carry input PF0, an output $Q_1$, and a carry output C1. The half adder HA2 has inputs C1 and $A_2$, an output $Q_2$, and a carry output C2. The half adder HA3 has inputs C2 and $A_3$, an output $Q_3$.

In accordance with the above configuration, the PF0 generator unit U1 decides if the binary A input to the "5 bit mod 13" circuit block is equal to or more than 13, and provides the result from PF0. If the binary A is equal to or more than 13, the half adders HA1-HA3 and the full adder FA1 are used to add 3, a complement of the 5-bit binary 13, to the binary A in order to subtract 13 from the binary A.

The following description is given to the core part of the 13-adic converter unit 210', that is, the p-adic" circuit block.

Figure 20:
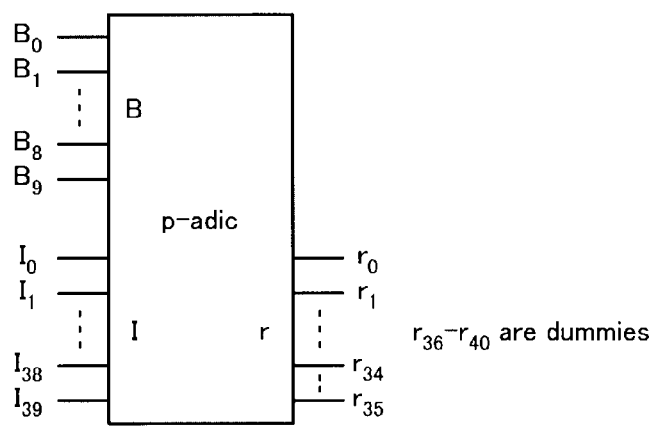
FIG. 20 is a diagram showing a circuit symbol of a to-13-adic conversion core ("p-adic" circuit block) in the memory controller according to the present embodiment.

FIG. 20 is a diagram showing a circuit symbol of the "p-adic" circuit block.

The "p-adic" circuit block receives $B_0$-$B_9$, $I_0$-$I_{39}$, and provides $r_0$-$r_{35}$ as shown in FIG. 20.

Figure 21:
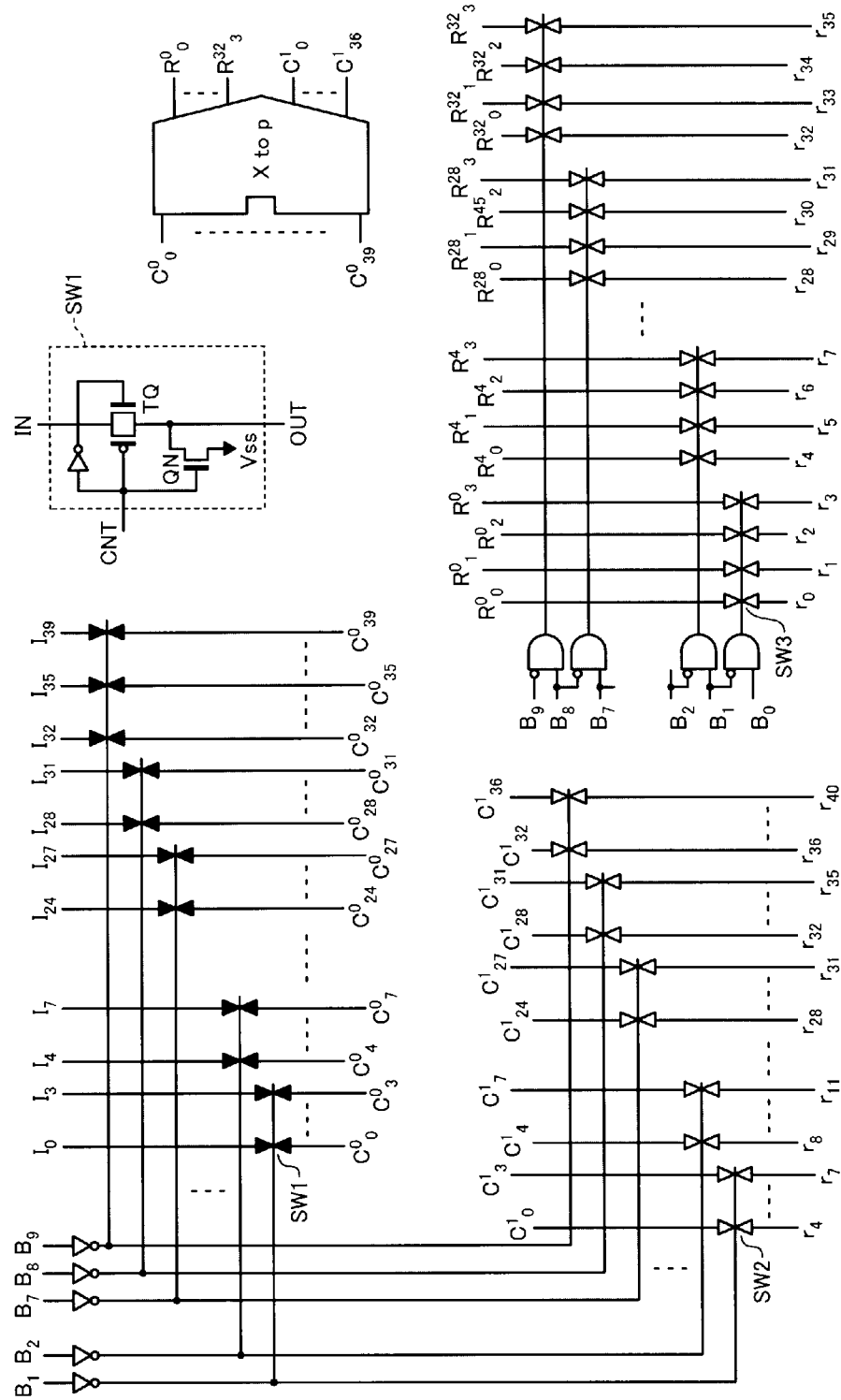
FIG. 21 is a block diagram of the "p-adic" circuit block in the memory controller according to the present embodiment.

FIG. 21 is a block diagram of the "p-adic" circuit block. The "p-adic" circuit block includes an "X to p" circuit block in the 1-step circuitry, and additional control switches SW for controlling the input/output of the "X to p" circuit block.

Specifically, the inputs $I_0$-$I_3$, $I_4$-$I_7$, ..., $I_{35}$-$I_{39}$ are fed via the control switches SW1 to the "X to p" circuit block as $C^0_0$-$C^0_3$, $C^0_4$-$C^0_7$, ..., $C^0_{35}$-$C^0_{39}$, respectively. These control switches SW1 are controlled by the inputs $B_1$-$B_9$, respectively.

One control switch SW1 includes a transfer transistor TQ operative to connect the input IN with the output OUT, and an NMOS transistor QN operative to pull down the output OUT to the ground voltage. The transfer transistor TQ turns on when the control signal is CNT='0' while the transistor QN turns on when the control signal is CNT='1'.

In the case of the control switches SW1, the control signals CNT include /$B_1$-/$B_9$. Therefore, $I_0$-$I_{39}$ are provided directly as $C^0_0$-$C^0_{39}$ if B='1', and the output turns to '0' independent of the input if B='0'. This is effective to prevent the input to the "X to p" circuit block from becoming infinite even if the inputs $I_0$-$I_{39}$ to the "p-adic" circuit block are infinite.

The "X to p" circuit block on receipt of $C^0_0$-$C^0_{39}$ provides $R^0_0$-$R^{32}_3$, $C^1_0$-$C^1_{36}$ as described before.

The outputs $C^1_0$-$C^1_{36}$ from the "X to p" circuit block pass through the control switches SW2 and turn to $r_4$-$r_{40}$, that is, the outputs from the "p-adic" circuit block. These control switches SW2 are controlled by the inputs /$B_1$-/$B_9$. Therefore, these control switches SW2 directly pass $C^1_0$-$C^1_{36}$ as $r_4$-$r_{40}$ if B='1'.

The outputs $R^0_0$-$R^{32}_3$ from the "X to p" circuit block pass through the control switches SW3 and turn to $r_0$-$r_{35}$, that is, the outputs from the "p-adic" circuit block. These control switches SW3 are controlled by $B_0$□/$B_1$ to $B_8$□/$B_9$, respectively. Therefore, the control switch SW3 located between $R^0_0$ and $r_0$, for example, directly provides $R^0_0$ as $r_0$ only if $B_0$='0' or $B_1$='1'.

$B_0$-$B_9$ for use in control of the control switches SW are timing signals, which are signals that rise sequentially. In sync therewith, the paths for the inputs I open at every 4 bits from the lower bit side and the paths for the outputs r switch to the paths for the outputs R.

In order to provide the result at the present step until the flow enters the computation process at the next step, R corresponding to a coefficient A on each digit of a 13-adic number is provided to the later-described external "D-r" register via the control switches SW3, which are on/off-controlled by the signals resulted from the logical operation with the adjacent timing signals B.

The following description is given to the 13-adic converter unit 210' including the above-described circuits grouped together.

Figure 22:
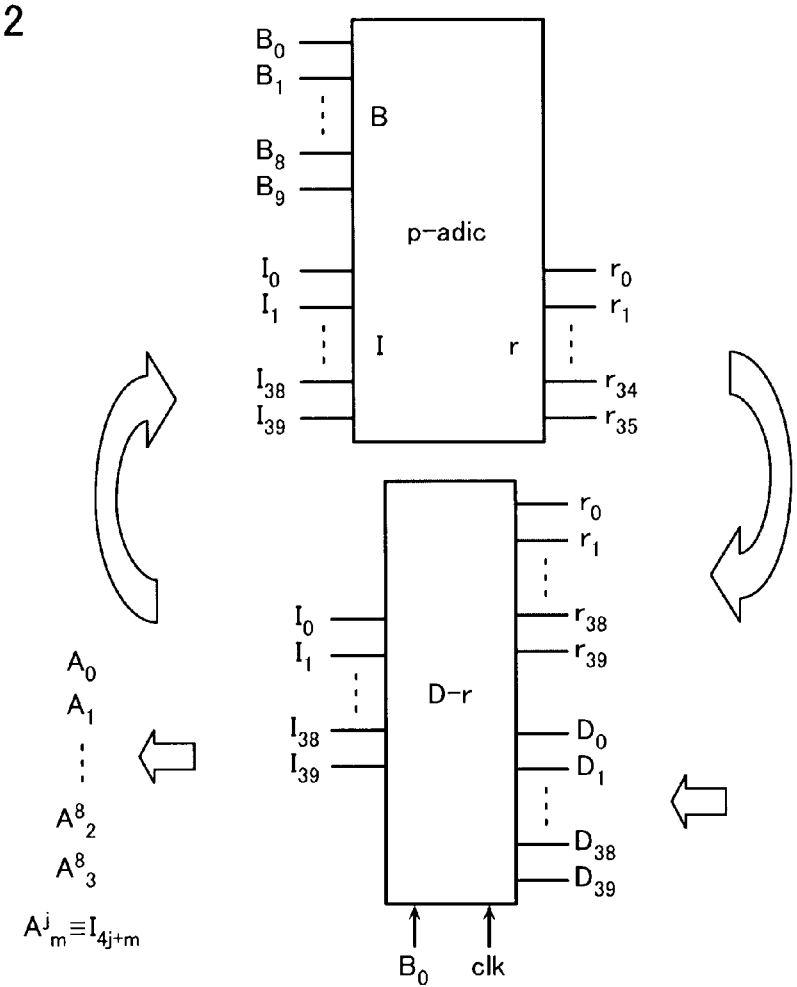
FIG. 22 is a block diagram of the to-13-adic converter circuit in the memory controller according to the present embodiment.

FIG. 22 is a block diagram of the 13-adic converter unit 210'. The 13-adic converter unit 210' includes the "p-adic" circuit block and the "D-r" register coupled thereto.

The "D-r" register is a register controlled by the timing signal B and the clock clk as shown in FIG. 22. It has the inputs $r_0$-$r_{39}$, $D_0$-$D_{39}$ and the outputs $I_0$-$I_{39}$.

Figure 23:
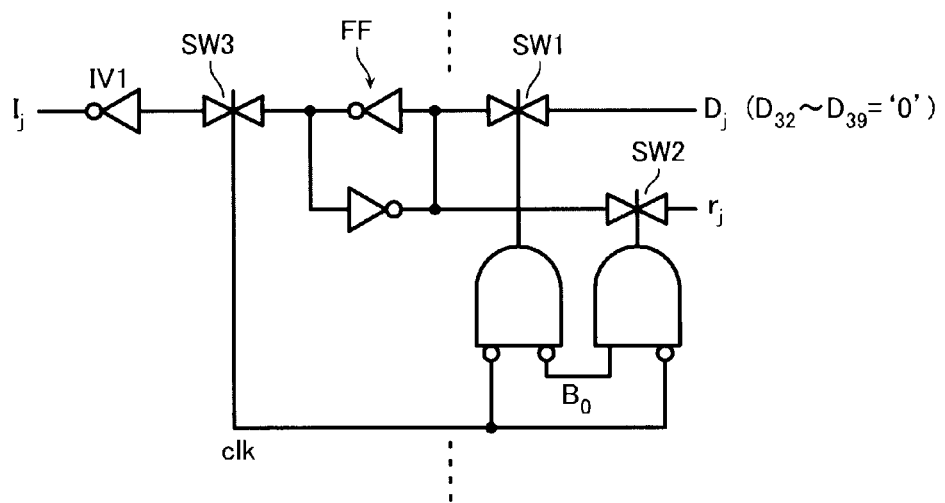
FIG. 23 is a circuit diagram of a "D-r" register in the memory controller according to the present embodiment.

FIG. 23 is a circuit diagram of the "D-r" register.

The "D-r" register includes a flip-flop FF composed of 2 inverters at every bit. The flip-flop FF receives $D_j$ (j=0-39) via the control switch SW1 and receives $r_j$ via the control switch SW2. On the other hand, the flip-flop FF is connected at the output side thereof to an inverter IV1 via the control switch SW3. The output from the inverter IV1 provides $I_j$.

The control switches SW1-SW3 are controlled by the timing signal $B_0$ and the clock clk. Specifically, the control switch SW1 turns on if /clk □/$B_0$='1', the control switch SW2 if /clk□ $B_0$='1', and the control switch SW3 if clk='1', respectively.

$D_{32}$-$D_{39}$ not contained in the data input to the "D-r" register are held at '0'.

In the initial state of the "D-r" register, a binary $D_0$-$D_{31}$ is set, and the rest is filled with '0'. Thereafter, when $B_0$ rises, data $r_j$ is taken in sync with the fall of clk, and the taken $r_j$ is provided as $I_j$ in sync with the rise of clk.

Figure 24:
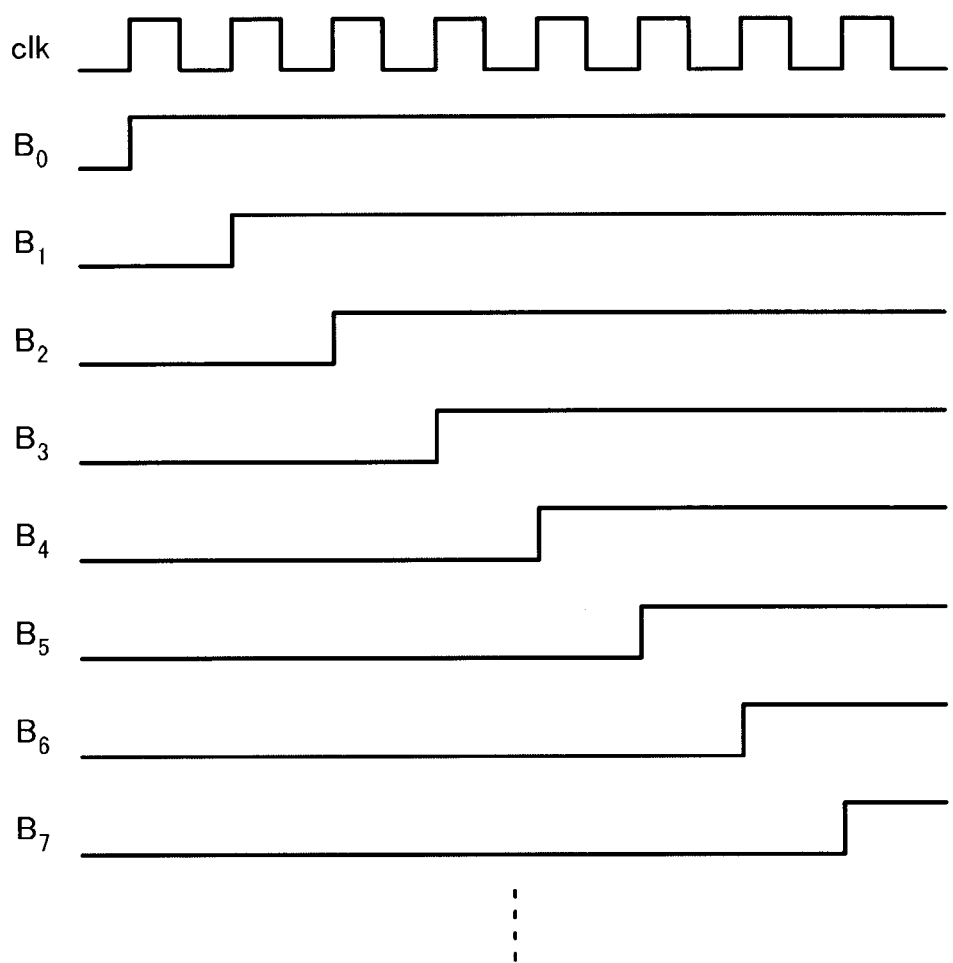
FIG. 24 is a timing chart of timing signals for use in control of the to-13-adic converter circuit in the memory controller according to the present embodiment.

The "D-r" register couples with the "p-adic" circuit block to advance the computation step at every timing signal $B_j$. The state of variations in each clock is shown in FIG. 24. The timing signals $B_j$ are signals that rise from 'L' to 'H' at every rise of the clock clk in order as in $B_0$, $B_1$, $B_2$, . . . as shown in FIG. 24.

At each computation step, each digit $A_j$ of a 13-adic number is obtained as the output r from the lower side, and this is held at the same timing as that for taking $I_j$ in the second half of the timing signal $B_j$.

After completion of all the computation steps, the "D-r" register holds the coefficients $A^j_m$ on the digits when the coefficients a on the digits of 13-adic data D are converted to binaries.

In the case of p=13, the number of computation steps is equal to 10, and the number of "5 bit mod 13" circuit blocks contained in the "p-adic" circuit block is equal to 37.

<$2^4$-adic Converter Unit>

Figure 25:
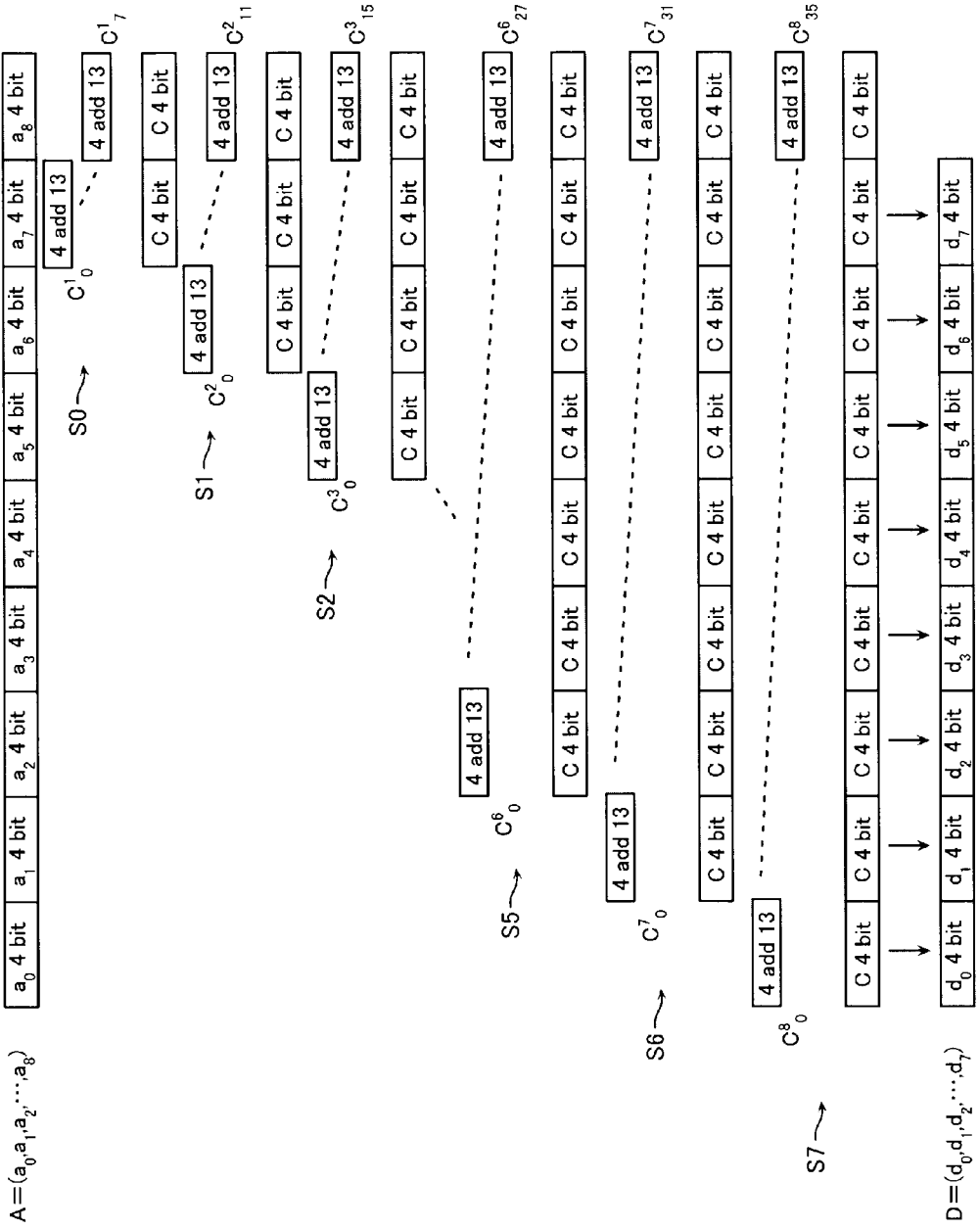
FIG. 25 is a diagram illustrative of the configuration of a to-$2^4$-adic converter circuit in the memory controller according to the present embodiment.

FIG. 25 is a diagram schematically showing the configuration of a circuit for converting a 9-digit, 13-adic number D ($a_0$, $a_1$, . . . , $a_7$, $a_8$) in the "p-adic Zp world" to an 8-digit, $2^4$-adic number D ($d_0$, $d_1$, . . . , $d_7$) in the "binary world".

A square shown with "4 add 13" in FIG. 25 indicates an operating circuit operative to add 13 to the input 4-bit data in accordance with the input carry C to provide a 5-bit binary. Hereinafter, this circuit is referred to as a "4 add 13" circuit block.

At the start, at the 0-th step (S0 in FIG. 25), the computation described before is executed to a binary representation of the digit at the 7th degree of the 13-adic number with a binary representation of the digit at the 8th degree used as a carry, that is, a binary representation of the number of $13^8$s, thereby obtaining 8 bits of a carry $C^1_0$-$C^1_7$ as the number of $13^7$s. This carry $C^1_0$-$C^1_7$ turns to the input at the next 1st step.

Subsequently, at the 1st step (S1 in FIG. 25), the computation described before is executed to a binary representation of the digit at the 6th degree of the 13-adic number with the carry $C^1_0$-$C^1_7$ obtained at the 0-th step used as a binary representation of the number of $13^7$s, thereby obtaining 12 bits of a carry $C^2_0$-$C^2_{11}$ as the number of $13^7$s. This carry $C^2_0$-$C^2_{11}$ turns to the input at the next 2nd step (S2 in FIG. 25).

Thereafter, the same steps as the 0-th step and the 1st step are repeated and, at the 8th step (S8 in FIG. 25), the computation described before is executed to a binary representation of the digit at the 0-th degree of the 13-adic representation with a carry $C^7_0$-$C^8_{31}$ obtained at the previous 7th step (S7 in FIG. 25) used as a binary representation of the number of 13, thereby obtaining 36 bits of a carry $C^8_0$-$C^8_{35}$ as the number of $13^0$s, that is, a binary representation of D. In this case, the upper 4 bits are held at zero in accordance with the setting of the 13-adic number and the $2^4$-adic number associated with D. When $C^8_{32}$-$C^8_{35}$ are excluded from the carry $C^8_0$-$C^8_{35}$ and the remaining $C^8_0$-$C^8_{31}$ are grouped at every 4 bits, a binary representation of D, that is, D ($d_0$, $d_1$, . . . , $d_7$) can be obtained.

A consideration is given next to the configuration of the $2^4$-adic converter unit 260'.

Figure 26A:
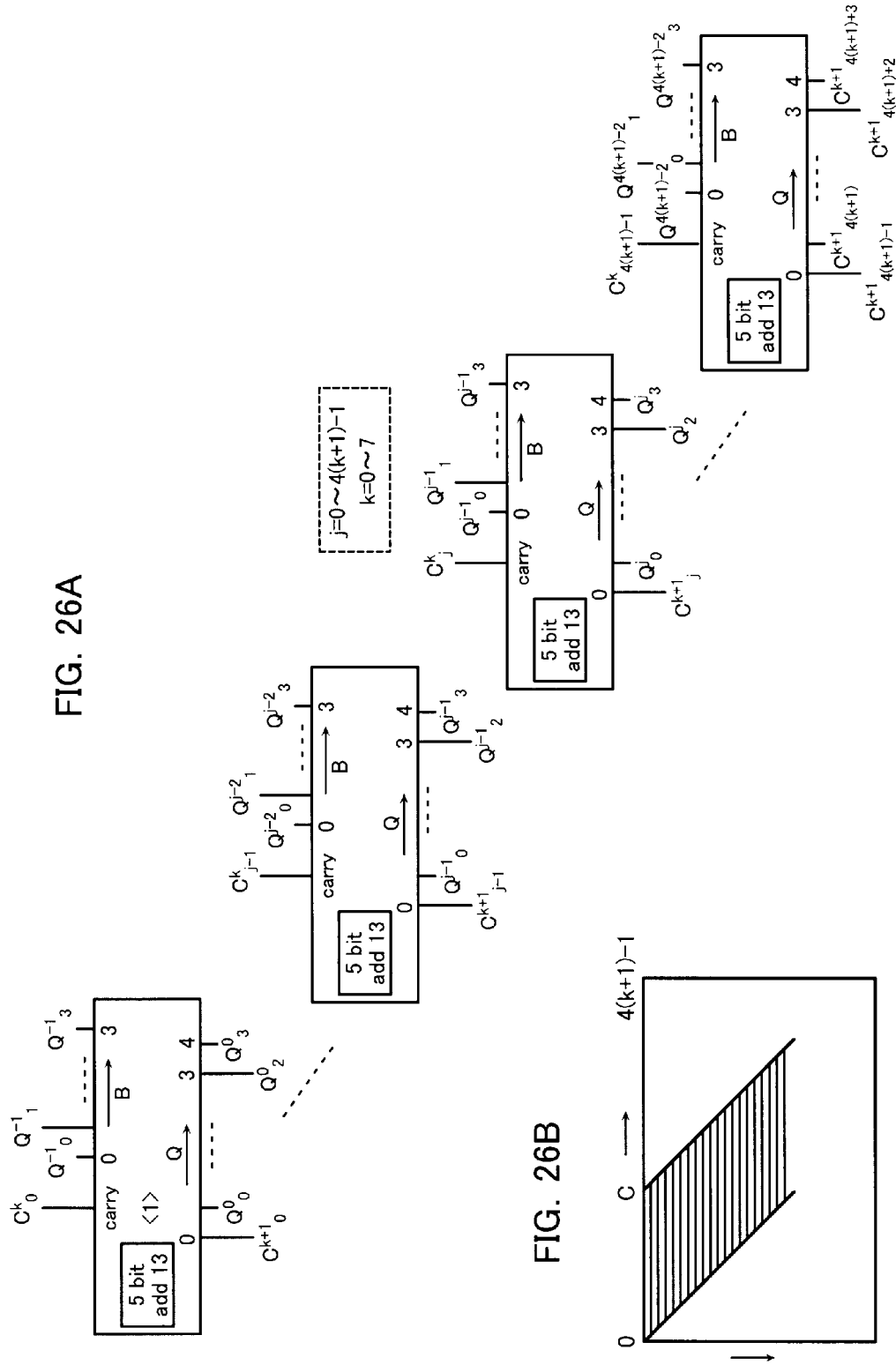
FIG. 26A is a block diagram of a to-$2^4$-adic converter circuit corresponding to 1 step ("a to X" circuit block) in the memory controller according to the present embodiment.

FIG. 26A shows the circuitry at the k-th step in the $2^4$-adic converter unit 260' configured using "5 bit add 13" circuit blocks. The "5 bit add 13" circuit block is a circuit operative to add a prime 13 to 4-bit binary data, that is, the input B, and provides the result as binary data Q. The details are described later.

It is possible to express a coefficient $a_j$ on the digit at the j-th degree of a 9-digit, 13-adic representation, in 5-bit binary. For the purpose of bringing the coefficient A in this binary representation into a representation in common with coefficients a on other digits, sub-indexes are used as shown in Expression 5.

$$a_j = A^j_0 + A^j_1 2 + A^j_2 2^2 + A^j_3 2^3$$

$$a_j(2^4)^j = A_{4j} 2^{4j} + A_{4j+1} 2^{4j+1} + A_{4j+2} 2^{4j+2} + A_{4(j+1)-1} 2^{4(j+1)-1} \text{ [Expression 5]}$$

The input to the operation at the k-th step, that is, the carry at the previous step (the (k−1)-th step) includes $C^k_0$-$C^k_{4(k+1)-1}$, of which sub-index is a coefficient in the form of a binary of an exponent of 2. The number expressed by this binary indicates the number of $13^{8-k}$s contained in the data.

At the k-th step, 4 (k+1) pieces of "5 bit add 13" circuit blocks are used in processing as shown in FIG. 26A. Each "5 bit add 13" circuit block receives 1 carry, and 4 binaries indicative of a coefficient on 1 digit of a 13-adic representation.

The 1st "5 bit add 13" circuit block <1> receives $C^k_0$, $Q^{-1}_0$-$Q^{-1}_3$ at the carry and the inputs $B_0$-$B_3$, and provides $C^{k+1}_0$, $Q^0_0$-$Q^0_3$ from $Q_0$, $Q_1$-$Q_4$, respectively.

The 2nd "5 bit add 13" circuit block <2>, not shown, receives $C^k_1$, $Q^0_0$-$Q^0_3$ at the carry and the inputs $B_0$-$B_3$, and provides $C^{k+1}_1$, $Q^1_0$-$Q^1_3$ from $Q_0$, $Q_1$-$Q_4$, respectively.

Thereafter, the "5 bit add 13" circuit blocks having the similar inputs and outputs are aligned 4 (k+1) pieces in total as shown in FIG. 26A, and a carry $C^{k+1}_0$ to $C^{k+1}_{4(k+2)-1}$ (=$C^{k+1}_{4(k+1)+3}$) output from each "5 bit add 13" circuit block turns to the input at the next step, that is, the (k+1)-th step.

Figure 26B:
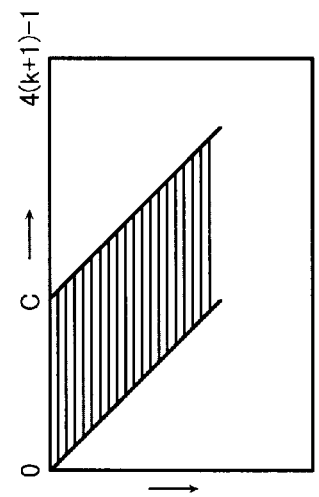
FIG. 26B is a schematic diagram showing the execution order of the "a to X" circuit block, on conversion from a 13-adic number to a binary, in the memory controller according to the present embodiment.

Thus, the conversion of a 13-adic number to a binary is executed sequentially from the least significant bit of a carry C as in a schematic diagram shown in FIG. 26B.

Figure 27:
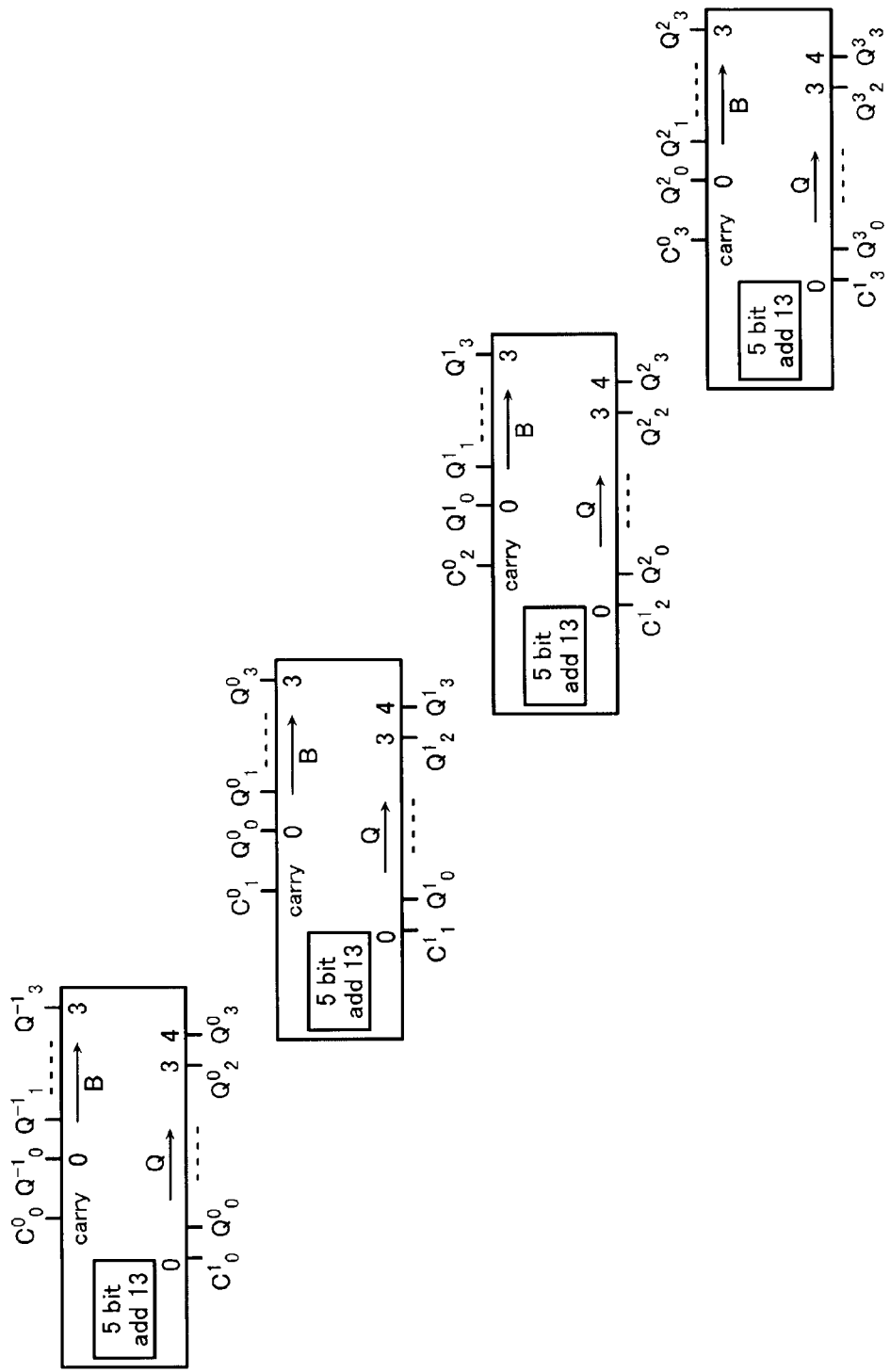
FIG. 27 is a block diagram of the "a to X" circuit block in the memory controller according to the present embodiment.

FIG. 26A shows the circuitry related to the k-th step as described above. The circuitry shown in FIG. 26A can be used over steps if the steps are processed in time division. In this case, for the purpose of making the input/output of each "5 bit add 13" circuit block controllable in accordance with simple on/off, 4 "5 bit add 13" circuit blocks in the case of k=0 are designed to form a circuit block with a minimum configuration as shown in FIG. 27.

The circuit including 4 "5 bit add 13" circuit blocks thus configured is referred to as an "a to X" circuit block.

Figure 28:
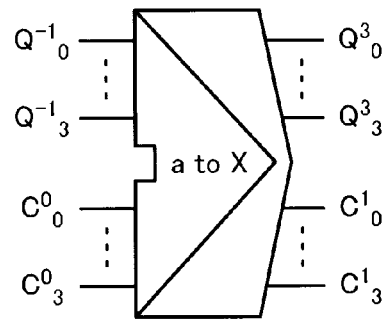
FIG. 28 is a diagram showing a circuit symbol of the "a to X" circuit block in the memory controller according to the present embodiment.

As shown in FIG. 28, the "a to X" circuit block has the inputs of $Q^{-1}{}_0$-$Q^{-1}{}_3$ and $C^0{}_0$-$C^0{}_3$, 8 in number, and the outputs of $Q^3{}_0$-$Q^3{}_3$ and $C^1{}_0$-$C^1{}_3$, 8 in number.

The following specific description is given to the "4 add 17" circuit block shown in FIG. 21, that is, the "5 bit add 13" circuit block.

Figure 29:
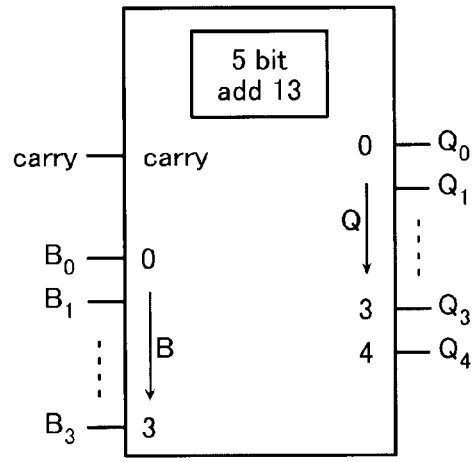
FIG. 29 is a diagram showing a circuit symbol of an operating circuit element for deriving a binary element ("5 bit add 13" circuit block) in the memory controller according to the present embodiment.

FIG. 29 shows a circuit symbol of the "5 bit add 13" circuit block. The "5 bit add 13" circuit block receives a 4-bit binary $B_0$-$B_3$ and a 1-bit carry (carry), and provides a 5-bit binary $Q_0$-$Q_4$. The "5 bit add 13" circuit block adds a prime 13 to the input B if the carry is '1', and provides the result as Q.

In the case of h=4, p=13, the relation shown in Expression 6 can establish between the binary B and the binary Q.

$$b = B_0 + B_1 2 + B_2 2^2 + B_3 2^3$$

$$Q = b + \text{carry} \times p$$

$$Q = Q_0 + Q_1 2 + Q_2 2^2 + Q_3 2^3 + Q_4 2^4 \quad \text{[Expression 6]}$$

Figure 30:
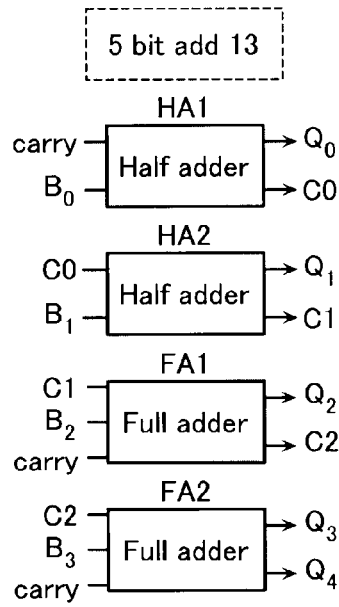
FIG. 30 is a block diagram of the "5 bit add 13" circuit block in the memory controller according to the present embodiment.

FIG. 30 is a block diagram of the "5 bit add 13" circuit block.

The "5 bit add 13" circuit block includes 2 half adders HA1, HA2, and 2 full adders FA1, FA2.

The half adder HA1 has inputs $B_0$ and carry, an output $Q_0$, and a carry output C0. The half adder HA2 has inputs C0 and $B_1$, an output $Q_1$, and a carry output C1. The full adder FA1 has inputs $B_2$ and carry, a carry input C1, an output C2, and a carry output $Q_2$. The full adder FA2 has inputs $B_3$ and carry, a carry input C2, an output $Q_3$, and a carry output $Q_4$.

In accordance with the above configuration, the "5 bit add 13" circuit block adds a prime 13 to the input binary B if carry='1'.

Next, the "a to X" circuit blocks described before are used to configure a circuit for 1 step operative to lower the degree of the 13-adic number by 1. Hereinafter, the circuit is referred to as a "p to X" circuit block. The "p to X" circuit block can be used in all the computation steps in common.

Figure 31:
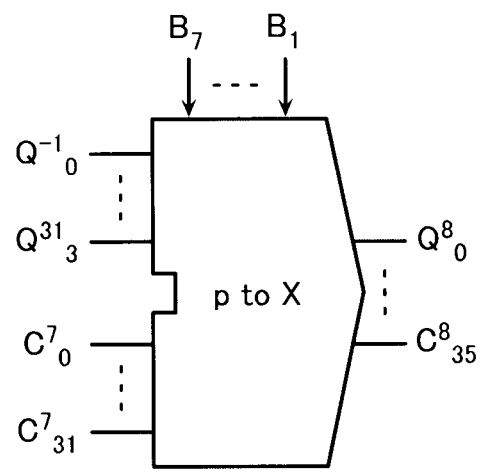
FIG. 31 is a block diagram of a to-$2^4$-adic converter circuit block corresponding to 1 step ("p to X" circuit block) common in the memory controller according to the present embodiment.

FIG. 31 is a diagram showing a circuit symbol of the "p to X" circuit block. The "p to X" circuit block is controlled by the timing signals $B_1$-$B_7$ to provide outputs $C^8{}_0$-$C^8{}_{35}$ in response to inputs $Q^{-1}{}_0$-$Q^{31}{}_3$, $C^7{}_0$-$C^7{}_{31}$.

Figure 32:
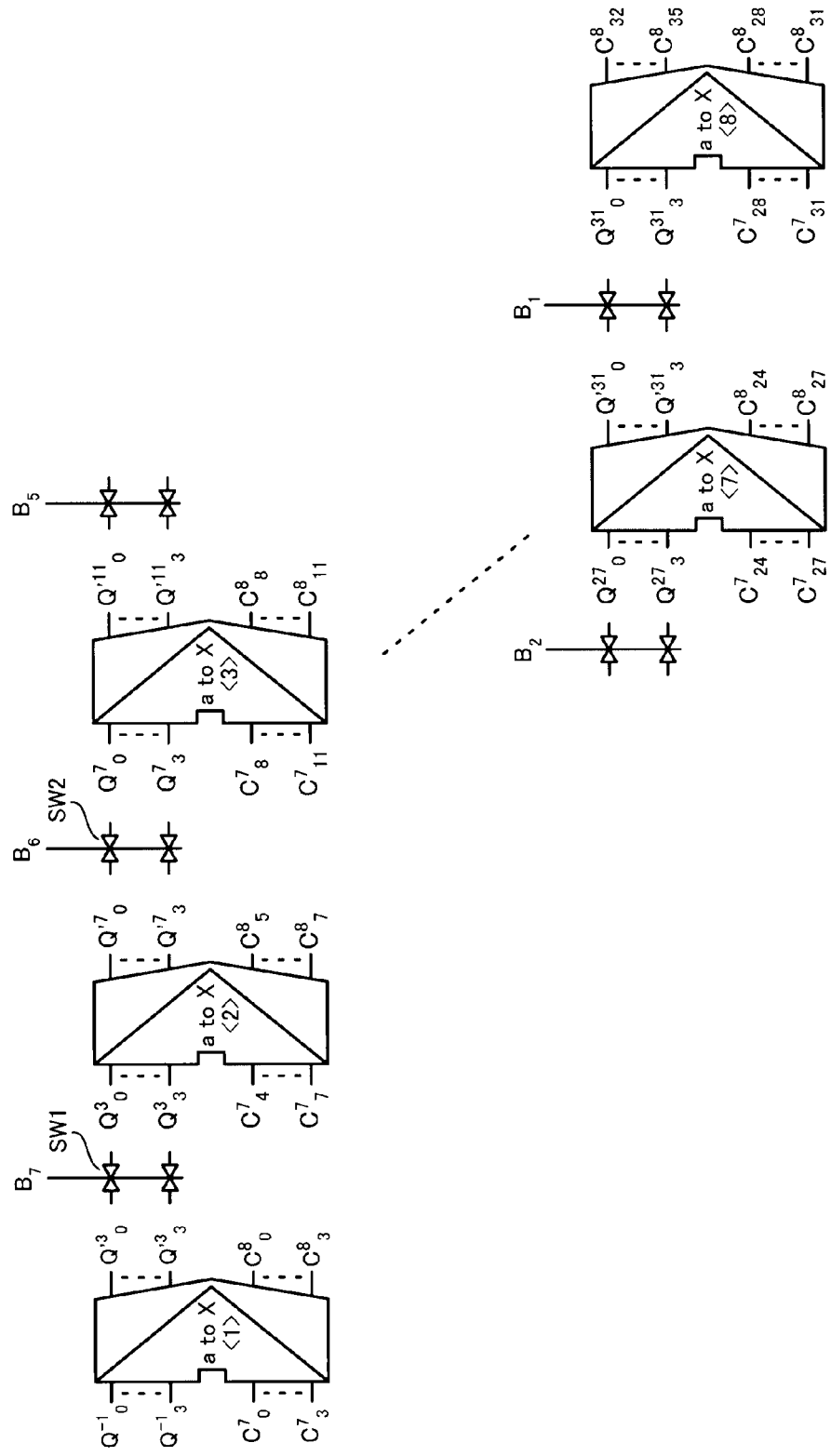
FIG. 32 is a diagram showing a circuit symbol of the "p to X" circuit block in the memory controller according to the present embodiment.

FIG. 32 is a block diagram of the "p to X" circuit block.

The "p to X" circuit block comprises 8 "a to X" circuit blocks.

The 1st "a to X" circuit block <1> receives part of the inputs to the "p to X" circuit block, that is, $Q^-{}_0$-$Q^{-1}{}_3$, and $C^7{}_0$-$C^7{}_3$, and provides $Q^{i3}{}_0$-$Q^{i3}{}_3$ and part of the outputs from the "p to X" circuit block, that is, $C^8{}_0$-$C^8{}_3$.

The 2nd "a to X" circuit block <2> receives $Q^3{}_0$-$Q^3{}_3$ and part of the inputs to the "p to X" circuit block, that is, $C^7{}_4$-$C^7{}_7$, and provides $Q'^7{}_0$-$Q'^7{}_3$ and part of the outputs from the "p to X" circuit block, that is, $C^8{}_5$-$C^8{}_7$. Among the inputs, $Q^3{}_0$-$Q^3{}_3$ are signals fed via the control switches SW1, through which the outputs $Q'^3{}_0$-$Q'^3{}_3$ from the 1st "a to X" circuit block <1> are controlled by the timing signal $B_7$.

The 3rd "a to X" circuit block <3> receives $Q^7{}_0$-$Q^7{}_3$ and part of the inputs to the "p to X" circuit block, that is, $C^7{}_8$-$C^7{}_{11}$, and provides $Q'^{11}{}_0$-$Q'^{11}{}_3$ and part of the outputs from the "p to X" circuit block, that is, $C^8{}_8$-$C^8{}_{11}$. Among the inputs, $Q^7{}_0$-$Q^7{}_3$ are signals fed via the control switches SW2, through which the outputs $Q'^7{}_0$-$Q'^7{}_3$ from the 2nd "a to X" circuit block are controlled by the timing signal $B_6$.

Thereafter, similar connections will be made up to the 8th "a to X" circuit block <8>.

The inputs and outputs of the "a to X" circuit block are connected via the control switches SW in this way, because the connection of the input is switched between the external input and the internal input at every computation step, and for the purpose of preventing the output from the internal circuit from interfering in the case of the external input.

In the case of the circuitry of FIG. 32, all the control switches SW are turned off at the timing when only the timing signal $B_0$ is at '1', thereby activating only the 1st "a to X" circuit block <8> from the right in FIG. 32. This corresponds to the 0-th step.

Subsequently, when the timing signal $B_1$ also turns to '1', the 2nd "a to X" circuit block <7> from the right in FIG. 32 is activated additionally. This corresponds to the 1st step.

Thereafter, at every sequential rise of the timing signals $B_2$-$B_7$, the "a to X" circuit block required at each step is activated.

The following description is given to the core part of the $2^4$-adic converter unit 260', that is, the "binary" circuit block.

Figure 33:
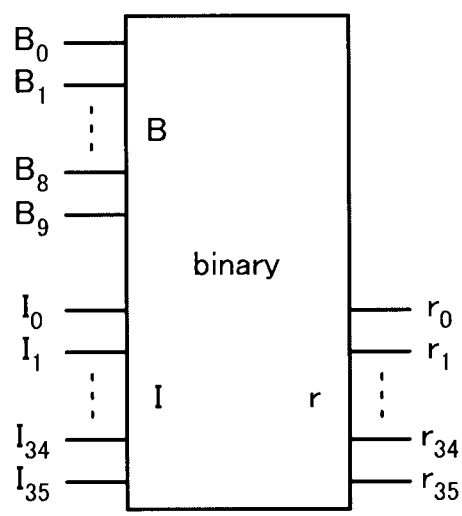
FIG. 33 is a diagram showing a circuit symbol of a to-$2^4$-adic converter circuit core ("binary" circuit block) in the memory controller according to the present embodiment.

FIG. 33 shows a circuit symbol of the "binary" circuit block.

As shown in FIG. 33, the "binary" circuit block receives $B_0$-$B_9$, $I_0$-$I_{35}$, and provides $r_0$-$r_{35}$.

Figure 34:
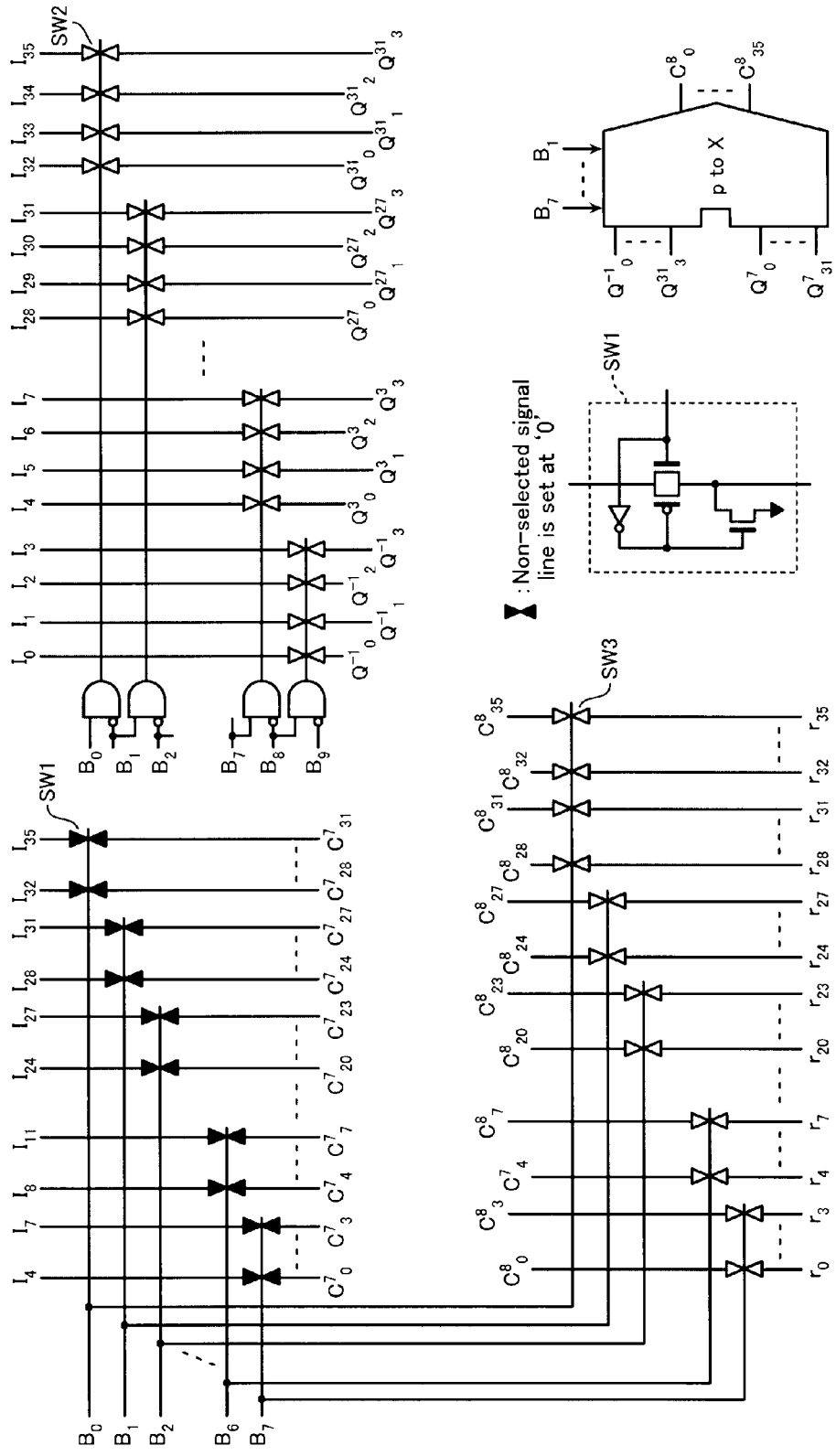
FIG. 34 is a block diagram of the "binary" circuit block in the memory controller according to the present embodiment.

FIG. 34 is a block diagram of the "binary" circuit block. The "binary" circuit block includes the "p to X" circuit block in the circuitry for 1 step, and additionally the control switch SW for use in control of the input/output of the "p to X" circuit block.

Specifically, the inputs $I_4$-$I_{35}$ are fed as $C^7{}_0$-$C^7{}_{31}$ to the "p to X" circuit block via the control switches SW1. These control switches SW1 are controlled by the timing signals $B_7$-$B_0$. Therefore, the control switches SW1 pass $I_4$-$I_{35}$ directly as $C^7{}_0$-$C^7{}_{31}$ if B='1' and keep the outputs at '0' independent of the inputs if B='0'.

In addition, the inputs $I_0$-$I_{35}$ are fed as $Q^{-1}{}_0$-$Q^{31}{}_3$ to the "p to X" circuit block via the control switches SW2, respectively. These control switches SW2 are controlled in accordance with $/B_9 \wedge B_8$ to $/B_1 \wedge B_0$, respectively. Therefore, the control switch SW2 located between $I_0$ and $Q^{-1}{}_0$ passes $I_0$ directly as $Q^{-1}{}_0$ only if $B_9$='0', $B_8$='1'.

The outputs $C^8{}_0$-$C^8{}_{35}$ from the "p to X" circuit block turn to $r_0$-$r_{35}$, that is, the outputs from the "binary" circuit block via the control switches SW3. These control switches SW3 are controlled by the timing signals $B_7$-$B_0$. Therefore, the control switches SW3 pass $C^8{}_0$-$C^8{}_{35}$ directly as $r_0$-$r_{35}$ if B='1'.

In accordance with the above circuitry, the "p to X" circuit block responds to each computation step while increasing the bit widths of the input and output 4-bit by 4-bit sequentially. While taking the numerals A on the digits of the 13-adic number from the upper digit sequentially at each computation step, and when all the computation steps are completed, a binary representation of data can be obtained.

As described earlier, the timing signals $B_0$-$B_9$ are the signals that rise in order. In accordance therewith, the paths to the inputs I and outputs r conduct 4-bit by 4-bit from the upper bit side.

The numeral A on each digit of the 13-adic number is initially set in the later-described external "A-r" register, and fed to the "A-r" register via the control switch SW3 on/off-controlled by the adjacent timing signal B such that the path switches selectively until the flow enters the next computation step.

The following description is given to the $2^4$-adic converter unit 260' including the above-described circuits grouped together.

Figure 35:
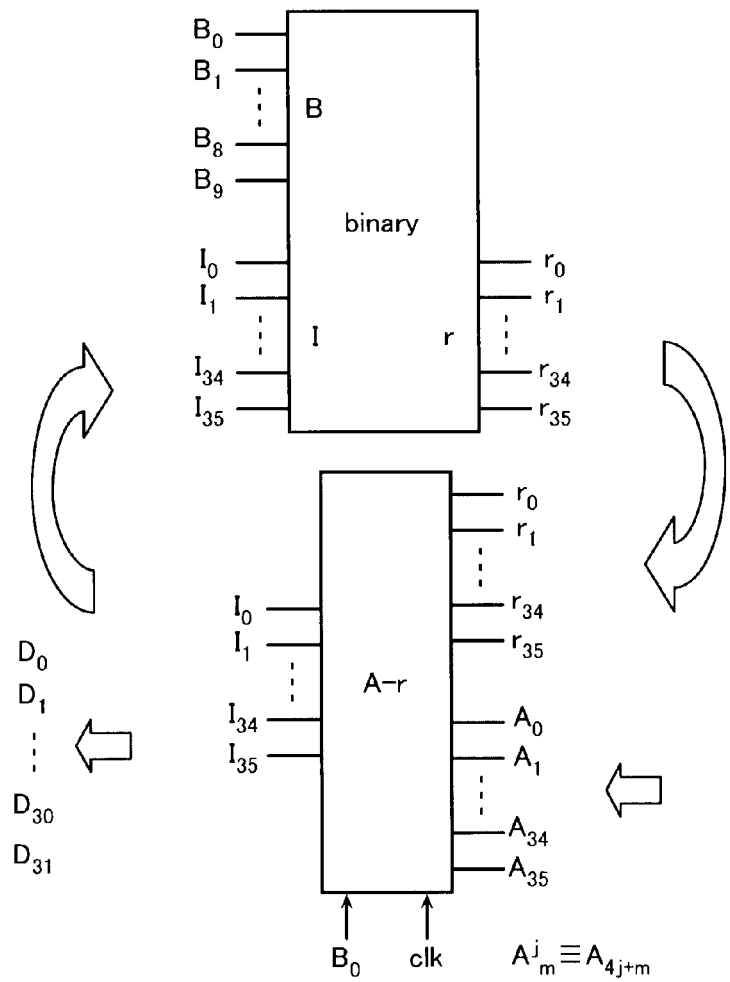
FIG. 35 is a block diagram of a to-$2^4$-adic converter circuit in the memory controller according to the present embodiment.

FIG. 35 is a block diagram of the $2^4$-adic converter unit 260'. The $2^4$-adic converter unit 260' includes the "binary" circuit block and the "A-r" register coupled thereto.

The "A-r" register is a register controlled by the timing signal $B_0$ and the clock clk and having the inputs $r_0$-$r_{35}$, $A_0$-$A_{35}$ and the outputs $I_0$-$I_{35}$ as shown in FIG. 35.

Figure 36:
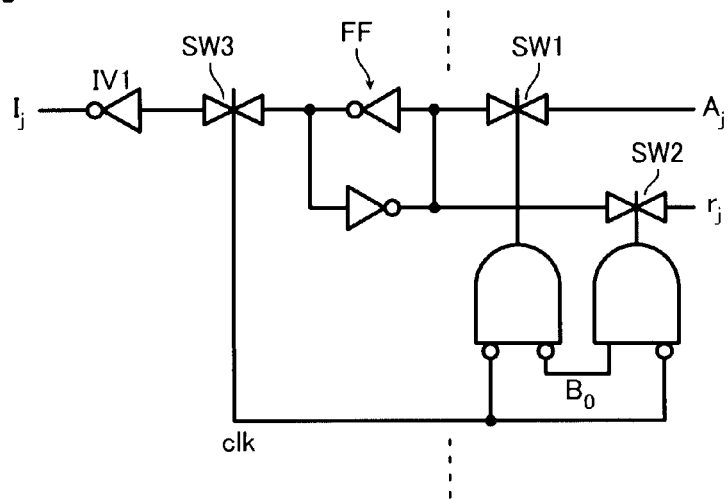
FIG. 36 is a circuit diagram of an "A-r" register in the memory controller according to the present embodiment.

FIG. 36 is a circuit diagram of the "A-r" register.

The "A-r" register includes, at every bit, a flip-flop FF composed of 2 inverters. The flip-flop FF receives $A_j$ (j=0-35) via the control switch SW1 and receives $r_j$ via the control switch SW2. On the other hand, the flip-flop FF is connected at the output thereof to an inverter IV1 via the control switch SW3. The output from the inverter IV1 provides $I_j$.

The control switches SW1-SW3 are controlled by the timing signal $B_0$ and the clock clk. Specifically, the control switch SW1 turns on if /clk □/$B_0$='1', the control switch SW2 if /clk □ $B_0$='1', and the control switch SW3 if clk='1', respectively.

The initial state of the "A-r" register includes the digits $A_0$-$A_{35}$ of the 13-adic number.

Thereafter, when the timing signal $B_0$ rises, $r_j$ taken in sync with the fall of the clock clk is provided as $I_j$ in sync with the rise of the clock clk.

The "A-r" register couples with the "binary" circuit block to advance the computation step at every timing signal $B_j$. The state of variations in each clock is similar to FIG. 24. The clock clk is used to generate ck and further generate the timing signal $B_j$.

After completion of all the computation steps, the "A-r" register holds a binary representation $D_j$ of the input, that is, the 13-adic number A.

In accordance with the $2^4$-adic converter unit 260' thus configured, the number of computation steps is equal to 10, and the number of "5 bit add 13" circuit blocks contained in the "binary" circuit block is equal to 32.

<Overview of ECC System>

The memory controller 200 of the present embodiment contains the "Lee metric code ECC system" circuit block 220, which serves as the ECC system for ensuring the reliability of data stored in the existing memory device 100 (such as the MLC NAND flash memory 100).

The "Lee metric code ECC system" circuit block 220 uses a Lee metric code for making simpler the computation required for error detection and correction. Therefore, the Lee metric code is described briefly here.

Symbols c representative of a code are integers shown in Expression 7.

$$c_j \in GF(p) = Zp, 0 \le c_j < p \qquad \text{[Expression 7]}$$

When the metrics of these integers are represented by $|c_j|$ as Lee metrics and all Lee metrics $|c_j|$ are represented by integers of p/2 or below, the Lee metrics $|c_j|$ can be defined as in Expression 8.

$$0 \le c_j < p/2 : |c_j| = c_j$$

$$p/2 < c < p : |c_j| = p - c_j \qquad \text{[Expression 8]}$$

As a code C can be considered a row of n (=p−1) symbols $c_j$, it can be represented by $C=(c_1, c_2, \ldots, c_n)$, and a metric w(C) of the code C can be defined as the sum of Lee metrics $|c_j|$ of the symbols $c_j$ as in Expression 9.

$$w(C) = |c_1| + |c_2| + \ldots + |c_n| \qquad \text{[Expression 9]}$$

The distance between codes can be defined by the sum of Lee metrics of the differences between the symbols corresponding to the codes. Here, a difference between 2 symbols candy (Lee distance), $d_L$ (c, y), is given as Expression 10.

$$d_L(c,y) = w(c-y) \qquad \text{[Expression 10]}$$

Further, the minimum Lee distance of the code C can be defined by the minimum metric of the metrics w(C) of the code C as shown in Expression 11.

$$d_L(C) = \min w(C) \qquad \text{[Expression 11]}$$

In this case, the Lee metric code is such a code that has the minimum distance of $2\gamma$ between codes having a generator matrix G and a syndrome matrix H shown in Expression 12 and that can correct ($\gamma-1$) or lower Lee metric errors.

$$G = \begin{bmatrix} 1 & 2 & \ldots & (p-1) \\ 1^2 & 2^2 & \ldots & (p-1)^2 \\ \vdots & \vdots & \ddots & \vdots \\ 1^k & 2^k & \ldots & (p-1)^k \end{bmatrix}, \qquad \text{[Expression 12]}$$

$$H = \begin{bmatrix} 1 & 2 & \ldots & (p-1) \\ 1^1 & 2^1 & \ldots & (p-1)^1 \\ \vdots & \vdots & \ddots & \vdots \\ 1^{\gamma-1} & 2^{\gamma-1} & \ldots & (p-1)^{\gamma-1} \end{bmatrix}$$

Here, when the word length of the code C is denoted with n and the word length of data is denoted with k, then $\gamma=n-k$ where $\gamma$ represents the redundant word length contained in the code C.

For the purpose of generating the Lee metric code thus configured, the input-converted data is represented by a k-digit, p-adic number. The numerals on the digits of the p-adic number correspond to the elements in Zp and therefore can be used as a data word X of the Lee metric code to obtain a code expression through an operation C=XG with the generator matrix G. The obtained code word is stored in the memory. Information about the error caused in the numeral in Zp stored is used as a data word Y of the Lee metric code read out of the memory to obtain a syndrome through an operation $S=YH^t$ ($H^t$ is a transpose of H) so that the position and quantity of the error can be computed to correct the error.

Next, as the premise of the description of the ECC system using the Euclidean iterative method with p=13, $\gamma=\epsilon+1=3$, $\epsilon=2$ dealt in the present embodiment, the general relational equations on the Euclidean method are described collectively.

The binary data of the code C recorded in the memory device 100 includes a collection of 12 code word symbols each composed of 4 bits, which may cause variations symbol by symbol when suffer various disturbances. Thus, the operation required to restore the code C from the code Y is decoding. Prior to decoding, syndromes are sought at the start.

Syndromes S can be sought as elements $S_0$, $S_1$, $S_2$ shown in Expression 13 through an operation $S=YH^t$ using a syndrome matrix H.

$$\sum_{j=1}^{12} (j)^1 c_j = \sum_{i=0}^{9} x^i \sum_{j=0}^{12} (j)^{1+i} = 0 \therefore \qquad \text{[Expression 13]}$$

$$S_1 = \sum_{j=1}^{12} (j)^1 y_j = \sum_{j=1}^{12} (j)^1 e_j,$$

$$S_0 = \sum e_j$$

Here, $H^t$ is a transpose of H. The generator matrix G and the syndrome matrix H are configured to satisfy $GH^t=0$ (mod 13). Accordingly, a substitution of Y=C+E yields $S=EH^t$. With $E=(e_1, e_2, \ldots, e_{12})$, a syndrome $S_0$ corresponds to the total sum of errors in the code word symbols as can be found. These syndromes S provide the only information on errors and, on the basis of these syndromes S, the correct code C is restored as follows.

Subsequently, the principle of decoding is described. Here, $n=p-1=12$ error symbols are classified into 2 sets $J_+$ and $J_-$ as in Expression 14.

$$J_+ = \{j \in (1,2,\ldots,13); e_j < 13/2\}$$

$$J_- = \{j \in (1,2,\ldots,13); e_j > 13/2\} \qquad \text{[Expression 14]}$$

Namely, they are classified into $J_+$ that is an arrangement of the positions j of the code symbols $c_j$ in the case of the symbol error quantity $e_j < 13/2$, and $J_-$ that is an arrangement of the positions j of the code symbols $c_j$ in the case of the symbol error quantity $e_j > 13/2$. Polynomials $\Lambda(x)$, $V(x)$ in the Galois field GF(13) are configured on the basis of these sets as in Expression 15.

$$\Lambda(x) = \prod_{j \in J_+} (1-jx)^{e_j}, \; V(x) = \prod_{j \in J_-} (1-jx)^{13-e_j} \qquad \text{[Expression 15]}$$

Thus, the polynomial $\Lambda(x)$ is a polynomial that has a reciprocal number of the position j of an error code word symbol in $J_+$ as a root and that has a Lee metric $e_j$ of that code word symbol as the multiplicity of the root. On the other hand, the polynomial V(x) is a polynomial that has a reciprocal number of the position j of an error code word symbol in $J_-$ as a root and that has a Lee metric, $13-e_j$, of that code word symbol as the multiplicity of the root. Decoding is a process of finally configuring these polynomials only from the information on the syndrome $S_1$ and solving them, thereby obtaining information on errors. In a word, it is required to seek a relation between these polynomials $\Lambda(x)$, V(x) and the syndrome $S_1$.

Subsequently, as shown in Expression 16, when it is configured with a series polynomial having each syndrome $S_1$ on a coefficient of the corresponding degree, it is represented by a rational polynomial having the error quantity $e_j$, the position j and the value of the symbol.

$$S(x) = \sum_{l=1}^{\infty} S_1 x^l = \sum_{j=1}^{12} e_j \sum_{l=1}^{\infty} (jx)^l = \sum_{j=1}^{12} e_j \frac{jx}{1-jx} \qquad \text{[Expression 16]}$$

From Expression 16, a relational equation shown in Expression 17 can establish among the polynomials $\Lambda(x)$, V(x) and the syndrome S(x).

$$\left(\frac{\Lambda(x)}{V(x)}\right) S(x) = -x\left(\frac{\Lambda(x)}{V(x)}\right)' \qquad \text{[Expression 17]}$$

Subsequently, the relational equation shown in Expression 17 is utilized to seek the polynomials $\Lambda(x)$, V(x) from the syndrome S(x).

The syndrome S(x) is used to find a polynomial $\Psi(x)$ at a degree of $(\gamma-1)$ or lower shown in Expression 18.

$$\Psi(x)S(x) \equiv -x\Psi'(x) \pmod{x^3} \qquad \text{[Expression 18]}$$

-continued $$\Psi(x) = 1 + \sum_{l=1}^{} \Psi_1 x^l, \; \psi_j = -\frac{1}{j}\sum_{i=1}^{j} \psi_{j-i} S_i$$

In an expansive expression of the polynomial $\Psi(x)$, a coefficient $\phi_j$ can be sought, from a comparison between the coefficients at the homogeneous degree on both sides of the expression shown in Expression 18, through an iterative method, using the syndrome $S_i$ and an already-determined coefficient $\phi_{j-1}$. The coefficients $\phi_0$-$\phi_2$ of the polynomial $\Psi(x)$ are sought from the syndromes $S_1$, $S_2$. The results are shown in Expression 19.

$$\psi_0 = 1$$

$$\psi_1 = -\psi_0 S_1 = -S_1$$

$$\psi_2 = -(\psi_1 S_1 + \psi_0 S_2)/2 \qquad \text{[Expression 19]}$$

The polynomial $\Psi(x)$ is a polynomial equivalent to $\Lambda(x)/V(x)$ while the polynomials $\Lambda(x)$, V(x) are given key conditions shown in Expression 20. Therefore, they can be sought through a Euclid iterative method applied to $x^3$ and the polynomial $\Psi(x)$ to eliminate constant multiples.

$$V(x)\Psi(x) \equiv \Lambda(x) \bmod x^3$$

$$\deg \Lambda(x) + \deg V(x) < 3$$

$$\Lambda(x) \text{ and } V(x) \text{ are coprimes}$$

$$\deg \Lambda(x) - \deg V(x) \equiv S_0 \pmod{13} \qquad \text{[Expression 20]}$$

Therefore, if the polynomial $\Psi(x)$ can be configured from the syndromes $S_1$, $S_2$, the syndrome $S_0$ can be used as the stop condition on the iterative method to seek the polynomials $\Lambda(x)$, V(x). Namely, the polynomials $\Lambda(x)$, V(x) sought from the set of $(S_0, \Psi(x))$ through the iterative method can represent the position j and the error quantity $e_j$ of an error code word symbol.

The Euclidean iterative method is detailed later.

Figure 37:
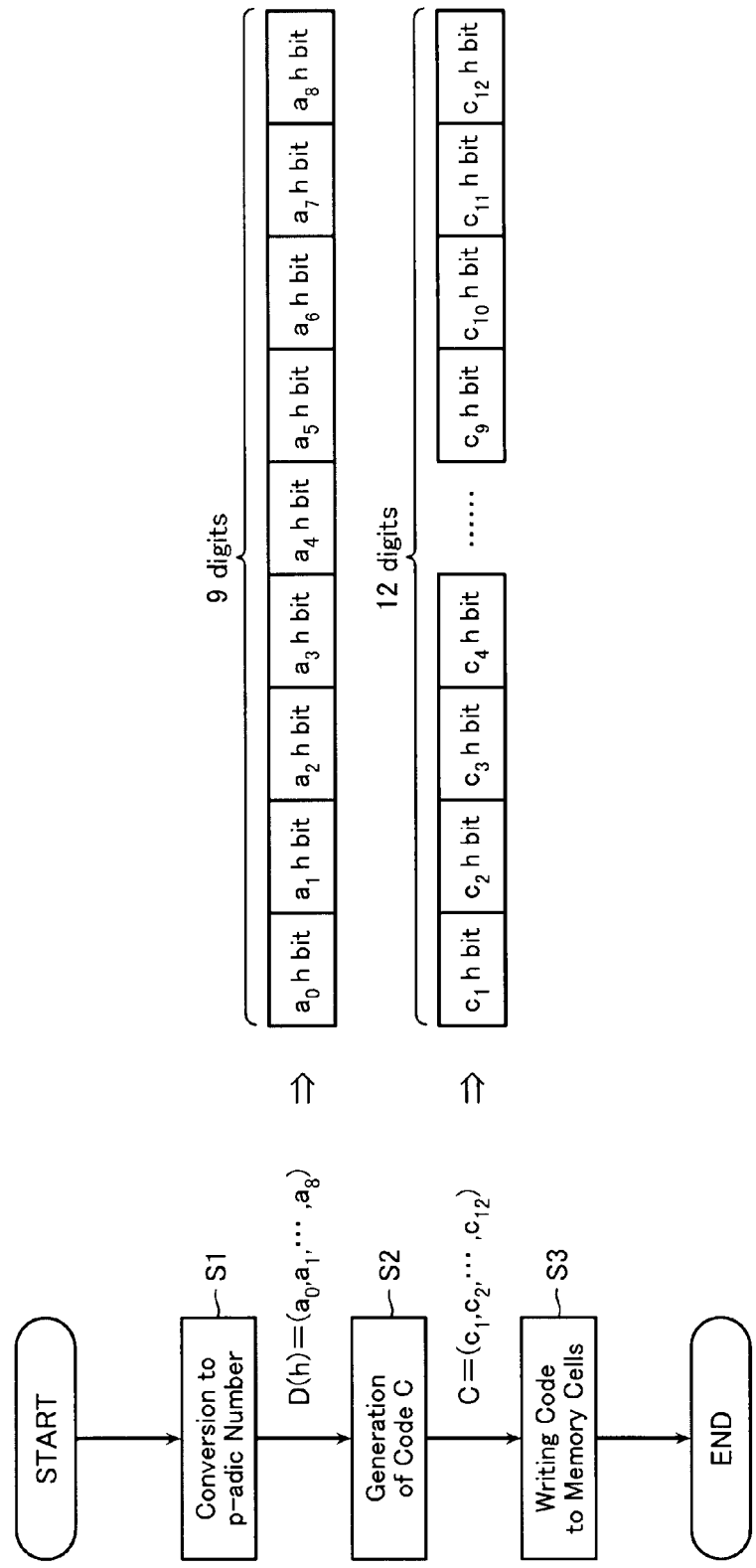
FIG. 37 is a flowchart of encoding in the memory controller according to the present embodiment.
Figure 38:
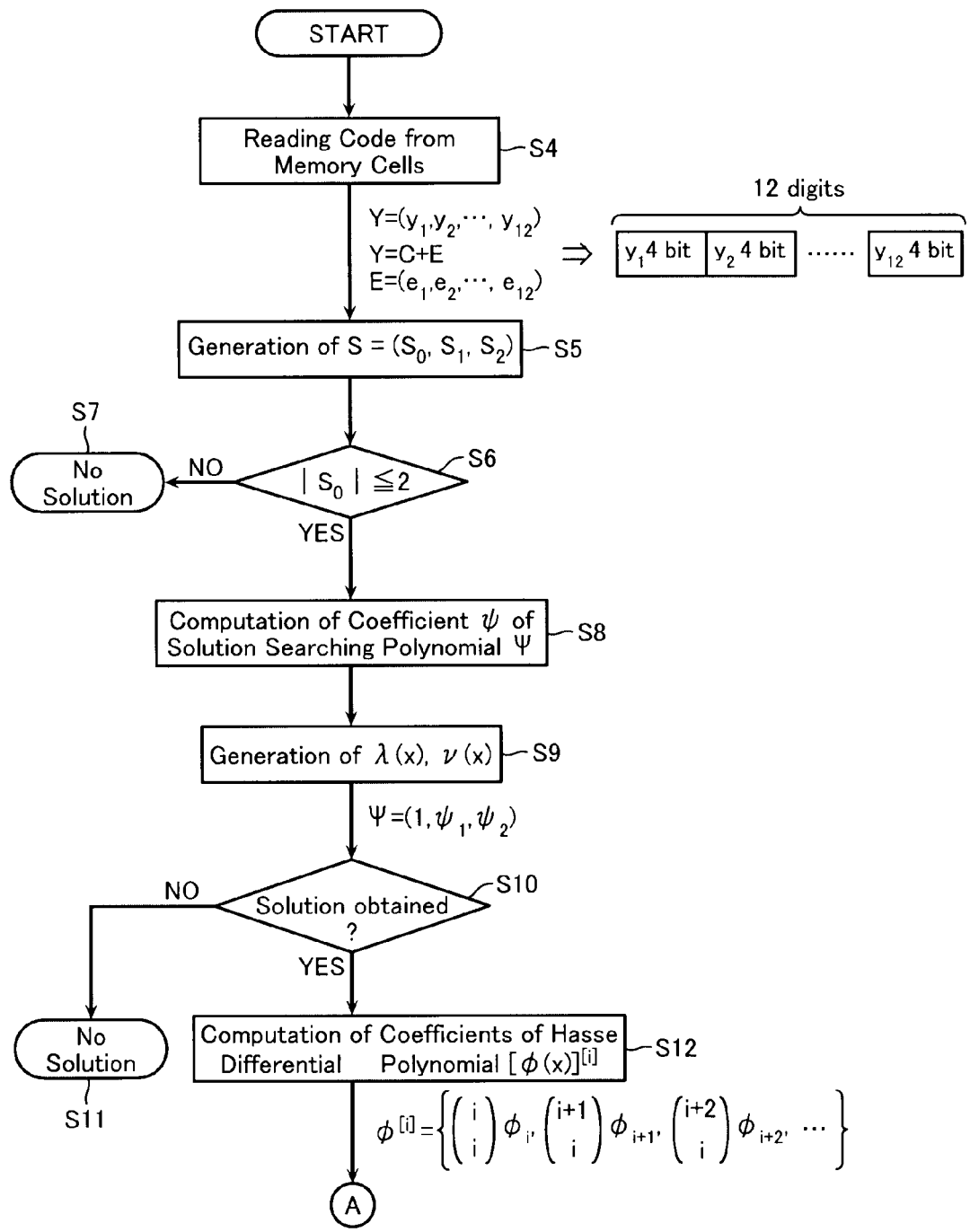
FIG. 38 is a flowchart of decoding in the memory controller according to the present embodiment.
Figure 39:
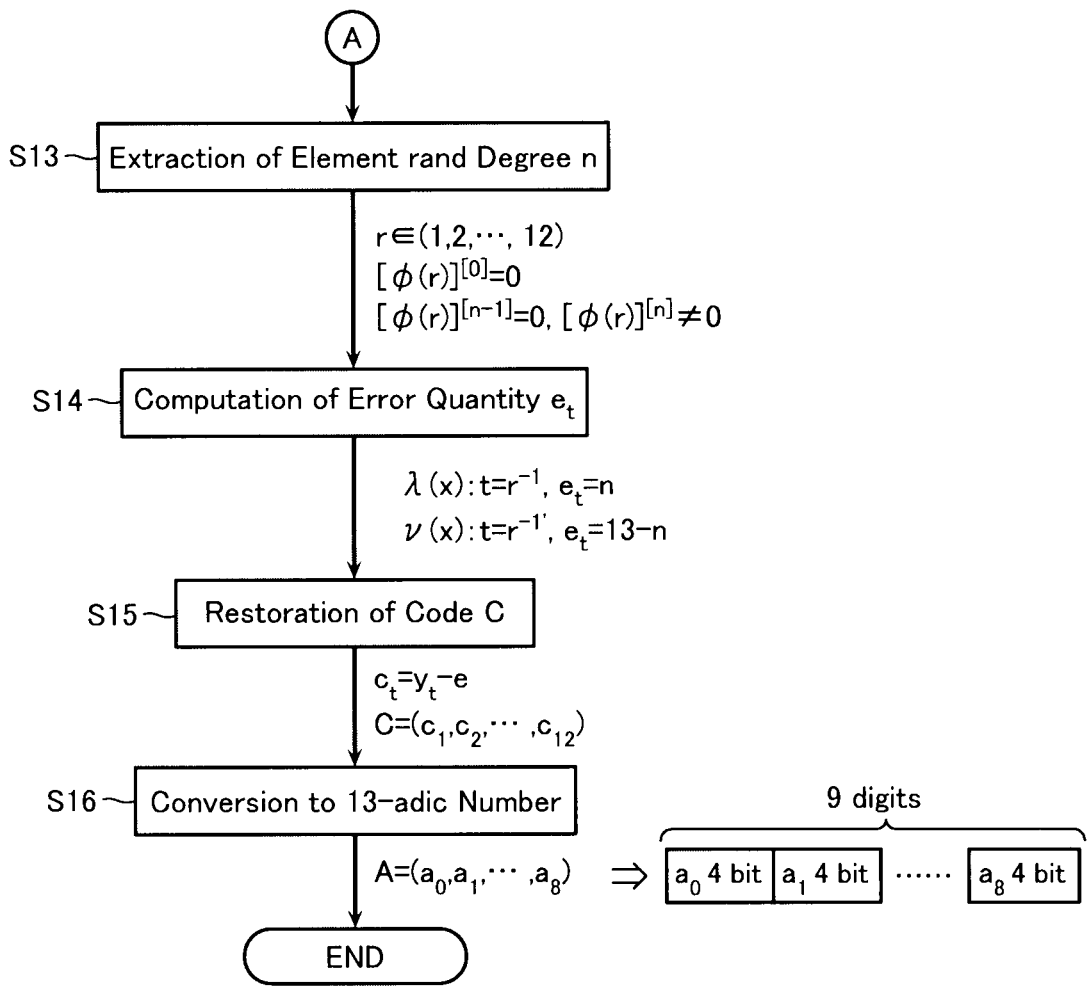
FIG. 39 is a flowchart of decoding in the memory controller according to the present embodiment.

Next, the procedures of data processing described with reference to FIGS. 37-39 are detailed.

Arranged below, with respect to an ECC operation in the "p-adic Zp world", are the procedure of encoding data input as Zp data to the memory system, and the procedure of decoding the code read out of the memory system to finally obtain the data A.

The procedure of encoding is as follows.

At the start, the input data D is converted at the 13-adic converter unit 210' to a 13-adic-represented 9-digit data word D(h) shown in Expression 21 (S1 in FIG. 37).

$$D(h) = (a_0, a_1, \ldots, a_8) \qquad \text{[Expression 21]}$$

Subsequently, the data D is multiplied by the generator matrix G to yield 12 code word components $c_1$-$c_{12}$ of the code C (S2 in FIG. 37). The value of each code word component is as shown in Expression 22.

$$c_j = \sum_{i=0}^{8} (j)^{i+1} a_i \qquad \text{[Expression 22]}$$

Finally, the code word component $c_j$ is stored in memory cells (S3 in FIG. 37). Each code word component can be processed as a 4-bit binary representation. In this case, as for threshold levels corresponding to the p-adic cells, the levels are set in the memory device 100 as they are representations of numerals in Zp.

The Lee metric code C is stored in the memory device 100 and turned to an error-containing code Y.

At the time of data read, the code Y read out of the memory device 100 is held in the page buffers 240 in the memory controller 100 (S4 in FIG. 38). The code Y is configured as shown in Expression 23 where $e_j$ denotes a Lee metric of the error in the code word symbol located at the position j in the code Y.

$$Y=(y_1, y_2, \ldots, y_{12})$$

$$Y=C+E, E=(e_1, e_2, \ldots, e_{12}) \quad \text{[Expression 23]}$$

The memory controller 200 applies ECC error correction to the code Y held in the page buffers 240 to generate binary data and provides it to external. The procedure of data processing at the time of data read is as follows.

(Procedure 1) The code Y held in the page buffers 240 is used to compute the syndromes $S=(S_0, S_1, S_2)$ based on a computational equation shown in Expression 24 (S5 in FIG. 38).

$$S_1 = \sum_{j=1}^{12} (j)^1 y_j = \sum_{j=1}^{12} (j)^1 e_j \quad \text{[Expression 24]}$$

As $S_0=\Sigma e_j$, so if $|S_0|>2$, the total sum of Lee metrics of errors is equal to or more than 3. Accordingly, the flow determines the code Y error-uncorrectable and terminates error searching as no solution (S6, S7 in FIG. 38). On the other hand, if $|S_0|\leq 2$, the flow advances processing to Procedure 2 (S6 in FIG. 38).

(Procedure 2) With respect to $\epsilon=2$, that is, the upper limit of the number of correctable code word components, the coefficients $\phi_j$ of the solution searching polynomial $\Psi(x)$ are computed first in turn from the syndromes $S_0$-$S_2$ obtained at Procedure 1 based on computational equations shown in Expression 25 (S8 in FIG. 38).

$$\psi_0 = 1 \quad \text{[Expression 25]}$$
$$\psi_1 = -\psi_0 S_1 = -S_1$$
$$\psi_2 = -(\psi_1 S_1 + \psi_0 S_2)/2$$
$$\Psi(x) = 1 + \sum_{j=1}^{2} \psi_j x^j$$

Subsequently, the Euclidean method is applied to $x^3$ and the polynomial $\Psi(x)$ to derive polynomials $\lambda(x)$ and $\nu(x)$ that can provide an ECC solution of the Lee metric code C (S9 in FIG. 38). If no solution can be obtained through the Euclidean method, the flow stops error correction as no solution (S10, S11 in FIG. 38). On the other hand, if a solution can be obtained, the flow proceeds processing to Procedure 3 and so on (S10 in FIG. 38).

(Procedure 3) The polynomial $\lambda(x)$ or $\nu(x)$ obtained in Procedure 2 is used as $\phi(x)$ to derive coefficients of a Hasse differential polynomial required for obtaining the multiplicity of the root of $\phi(x)$ (S12 in FIG. 38). The coefficients $\phi_j$ obtained in Procedure 2 are multiplied by a series of binomial coefficients $_jC_i$ to obtain vectors $\phi^{[i]}=(_iC_i\phi_i, _{i+1}C_i\phi_{i+1}, _{i+2}C_i\phi_{i+1}, \ldots)$ of the coefficients of the Hasse differential polynomial as in Expression 26.

$$[\phi(x)]^{[i]} = \sum_{j=0}^{2-i} \binom{j+i}{i} \phi_{j+i} x^j = \sum_{j=0}^{2-i} \phi^{[i]}_j x^j \quad \text{[Expression 26]}$$

Specifically, they can be represented as in Expression 27.

$$[\phi(x)]^{[0]} = \phi(x) = 1 + \phi_1 x + \phi_2 x^2$$
$$[\phi(x)]^{[1]} = \phi_1 + 2\phi_2 x$$
$$[\phi(x)]^{[2]} = \phi_2 \quad \text{[Expression 27]}$$

(Procedure 4) The Hasse differential polynomial obtained in Procedure 3 is given a substitution of the elements 1-12 in Zp to seek an element r that makes zero the 0-th degree differential polynomial $(=\phi(x))$. Subsequently, as shown in Expression 28, such the degree n is sought that makes an (n−1)-th degree differential polynomial zero and an n-th degree differential polynomial non-zero, for each element r (S13 in FIG. 39).

$$[\phi(r)]^{[0]}=\phi(r)=0,$$
$$[\phi(r)]^{[n-1]}=0, [\phi(r)]^{[n]}\neq 0 \quad \text{[Expression 28]}$$

The obtained r is an inverse element of the position number t of the error-caused code component, and the corresponding n indicates the quantity converted from the error quantity $e_t$ caused. This process is executed over all the elements r.

(Procedure 5) In this procedure, the error quantity is obtained through conversion from the multiplicity n of the solution (S14 in FIG. 39). The position number of the error-caused code word component is $t=r^{-1}$. If the root of the polynomials $\lambda(x)$ and $\nu(x)$ is r and the multiplicity of the root is n, the error quantity is $e_t=n$ in the case of the polynomial $\lambda(x)$ while the error quantity is $e_t=13-n$ in the case of the polynomial $\nu(x)$.

Subsequently, the code $y_t$ and the error quantity $e_t$ are used to restore the correct Lee metric code $C=(c_1, c_2, \ldots, c_{12})$ based on $c_t=y_t-e_t$ (S15 in FIG. 39), then the flow proceeds processing to Procedure 6.

(Procedure 6) A pluralistic system of linear equations of a relation AG=C among the codes C and A and the generator matrix G is applied to obtain 9 elements $a_0$-$a_8$ in Zp. The obtained elements $a_0$-$a_8$ are used to create a 9-digit, 13-adic number A $(=a_0, a_1, \ldots, a_8)$ (S16 in FIG. 39).

Thus, data processing in the "p-adic Zp world" in the memory controller 200 is finished. Subsequently, a conversion is made to restore the data A to binary data at the exit of the "p-adic Zp world". The data A is converted from the 9-digit, 13-adic representation to an 8-digit, $2^4$-adic representation such that a numeral on each digit is represented in binary as 8 digits. This turns to the binary data D input to the memory system.

Thus, the data is restored completely.

<Decoder Unit>

From now on, examples are described on specific circuits for realizing the above procedures.

First, a computing circuit operative to seek the product of Zp is described. Hereinafter, the computing circuit is referred to as an "X Zp" circuit block.

Figure 40:
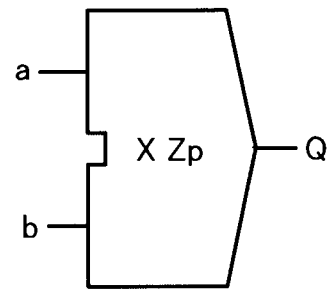
FIG. 40 is a diagram showing a circuit symbol of a multiplier circuit for deriving the product of elements in Zp ("X Zp" circuit block) in the memory controller according to the present embodiment.

FIG. 40 is a diagram showing a circuit symbol of the "X Zp" circuit block. FIG. 41A is a block diagram of the "X Zp" circuit block. FIGS. 41B and 41C are diagrams schematically showing operational processing in the "X Zp" circuit block.

The "X Zp" circuit block is roughly divided into a circuit for processing a computation step group in the first half, and a circuit for processing a computation step group in the second half.

The circuit for processing the first-half computation step group includes an AND gate G1, and 3 "4 bit AD mod 13" circuit blocks <1>-<3>.

The AND gate G1 yields the logical product of the i-th bit (i=0-3) of a multiplicand a and the j-th bit (j=0-3) of a multiplier b, and provides it as $M_{ij}$. The numerals a and b are represented as in Expression 29.

$$a=A_0+A_1 2+A_2 2^2+A_3 2^3$$

$$b=B_0+B_1 2+B_2 2^2+B_3 2^3 \quad \text{[Expression 29]}$$

The "4 bit AD mod 13" circuit block is a circuit operative to seek the sum of 2 numerals in Zp modulo 13. The "4 bit AD mod 13" circuit block has the inputs $A_0$-$A_3$ and $B_0$-$B_3$ and the outputs $Q_0$-$Q_3$. The specific configuration of the "4 bit AD mod 13" circuit block is described later.

The 1st "4 bit AD mod 13" circuit block <1> receives $M_{10}$-$M_{30}$, '0', $M_{01}$-$M_{31}$ at $A_0$-$A_2$, $A_3$ and $B_0$-$B_3$, and provides $Q^0_0$-$Q^0_3$ from $Q_0$-$Q_3$, respectively.

The 2nd "4 bit AD mod 13" circuit block <2> receives $Q^0_1$-$Q^0_3$, that is, the output from the "4 bit AD mod 13" circuit block <1>, '0', and $M_{02}$-$M_{32}$ at $A_0$-$A_2$, $A_3$ and $B_0$-$B_3$, and provides $Q^1_0$-$Q^1_3$ from $Q_0$-$Q_4$, respectively.

The 3rd "4 bit AD mod 13" circuit block <3> receives $Q^1_1$-$Q^1_3$, that is, the output from the "4 bit AD mod 13" circuit block <2>, 0, and $M_{03}$-$M_{33}$ at $A_0$-$A_2$, $A_3$ and $B_0$-$B_3$, and provides $Q^2_0$-$Q^2_3$ from $Q_0$-$Q_4$, respectively.

As described above, the circuit for processing the first-half computation step group includes the "4 bit AD mod 13" circuit blocks <1>-<3>, of which inputs and outputs are connected in order.

The circuit for processing the second-half computation step group includes 3 "5 bit mod 13" circuit blocks <1>-<3>. The "5 bit mod 13" circuit blocks <1>-<3> are the circuits shown in FIGS. 18 and 19.

The 1st "5 bit mod 13" circuit block <1> receives $Q^1_0$ and $Q^2_0$-$Q^2_3$ at $A_0$ and $A_1$-$A_4$, and provides $Q^3_0$-$Q^3_3$ from $Q_0$-$Q_3$, respectively.

The 2nd "5 bit mod 13" circuit block <2> receives $Q^0_0$, and $Q^3_0$-$Q^3_3$, that is, the outputs from the "5 bit mod 13" circuit block <1> at $A_0$ and $A_1$-$A_4$, and provides $Q^4_0$-$Q^4_3$ from $Q_0$-$Q_3$, respectively.

The 3rd "5 bit mod 13" circuit block <3> receives $M_{00}$, and $Q^4_0$-$Q^4_3$, that is, the outputs from the "5 bit mod 13" circuit block <2> at $A_0$ and $A_1$-$A_4$, and provides $Q^6_0$-$Q^6_3$ ($Q_0$-$Q_3$) from $Q_0$-$Q_3$, respectively.

As described above, the circuit for processing the second-half computation step group includes the "5 bit mod 13" circuit blocks <1>-<3>, of which inputs and outputs are connected in order.

All the circuits operate not in sync with clocks and decide the output Q when the input $M_{ij}$ is given.

Thus, the number of circuit blocks contained in the "X Zp" circuit block is equal to 6.

The following description is given to the "4 bit AD mod 13" circuit block shown in FIG. 41A.

Figure 42:
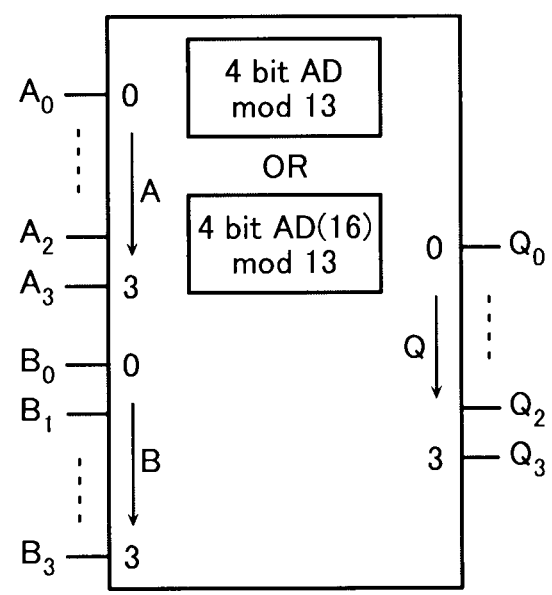
FIG. 42 is a diagram showing a circuit symbol of an operating circuit element for deriving the sum of elements in Zp ("4 bit AD mod 13" circuit block) in the memory controller according to the present embodiment.

FIG. 42 shows a circuit symbol of the "4 bit AD mod 13" circuit block.

The "4 bit AD mod 13" circuit block seeks the sum of numerals a and b input from A and B, and provides the residue of the resultant sum by a prime 13 as the output from Q. The sum of inputs may not be dealt as the numeral in Zp but as a 4-bit binary number, as required. Accordingly, FIG. 42 also shows a circuit symbol of a "4 bit AD(16) mod 13" circuit block, which can be realized by changing signals in the block.

In the case of h=4, p=13, the numerals a, b and the binary representation Q of the residue establish relations therebetween shown in Expression 30.

$$a=A_0+A_1 2+A_2 2^2+A_3 2^3$$

$$b=B_0+B_1 2+B_2 2^2+B_3 2^3$$

$$a+b \equiv Q \pmod{13}$$

$$Q=Q_0+Q_1 2+Q_2 2^2+Q_3 2^3 \quad \text{[Expression 30]}$$

Figure 43:
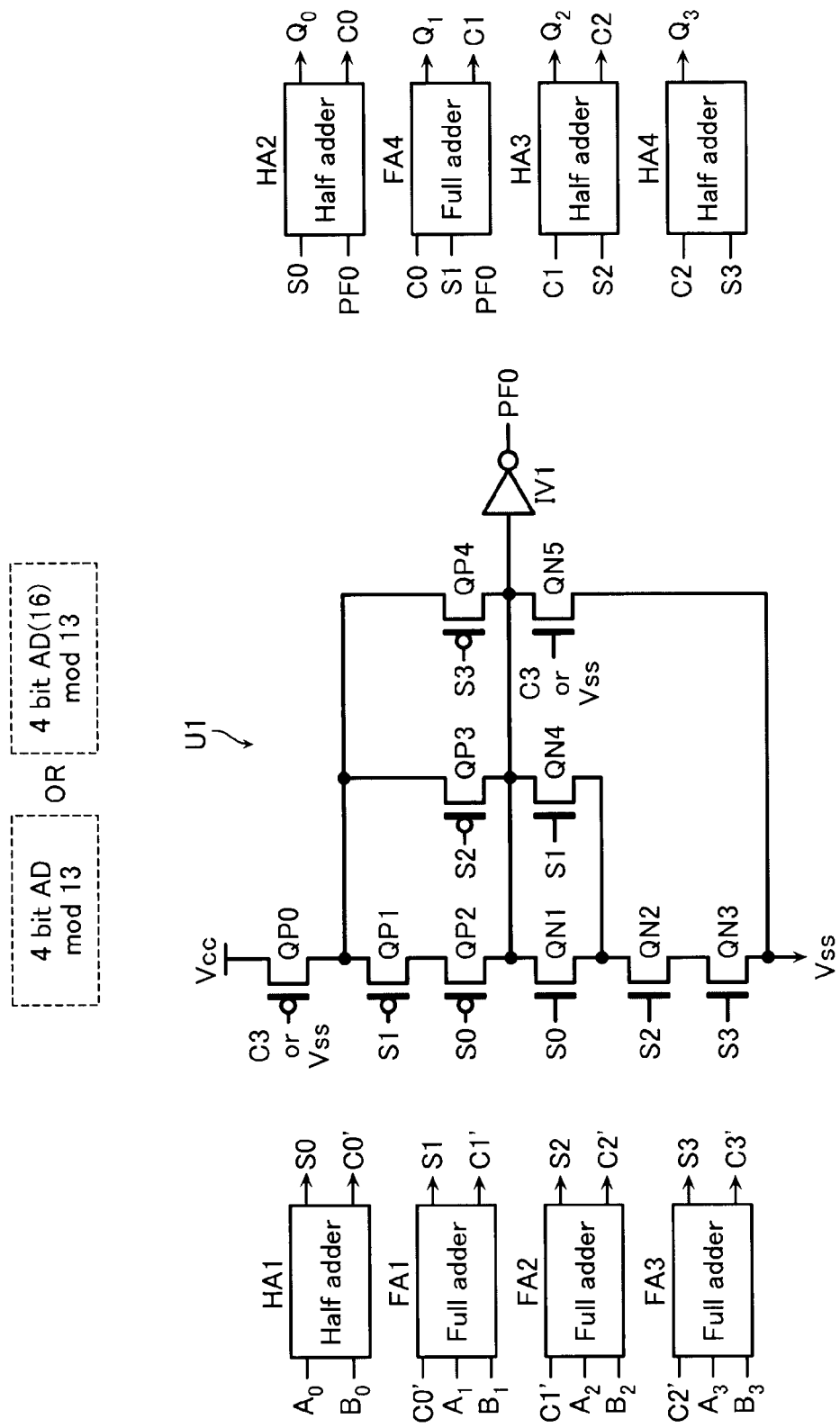
FIG. 43 is a circuit diagram of the "4 bit AD mod 13" circuit block in the memory controller according to the present embodiment.

FIG. 43 is a circuit diagram of the "4 bit AD mod 13" circuit block.

The "4 bit AD mod 13" circuit block and the "4 bit AD (16) mod 13" circuit block comprise a PF0 generator unit U1, 4 half adders HA1-HA4, and 4 full adders FA1-FA4.

The PF0 generator unit U1 includes serially connected PMOS transistors QP0, QP1, QP2 and NMOS transistors QN1-QN3 between the Vcc terminal supplied with a certain voltage and the Vss terminal. These transistors QP0, QP1, QP2, QN1, QN2 and QN3 are controlled by C3 or Vss, S1, S0, S0, S2 and S3, respectively.

The PF0 generator unit U1 additionally includes 2 PMOS transistors QP3, QP4, 2 NMOS transistors QN4, QN5, and an inverter IV1.

The transistors QP3, QP4 are connected between the source of the transistor QP1 and the drain of the transistor QP2 in parallel. The transistor QN4 is connected between the source and drain of the transistor QN1 in parallel. The transistor QN5 is connected between the source of the transistor QN1 and the drain of the transistor QN3 in parallel. These transistors QP3, QP4, QN4 and QN5 are controlled by S2, S3, S1, and C3 or Vss, respectively. The inverter IV1 has an input connected to the sources of the transistors QN1, QN4 and QN5. The output from the inverter IV1 provides a carry PF0. Thus, the input of Vss instead of C3 realizes the "4 bit AD(16) mod 13" circuit block.

The half adder HA1 has inputs $A_0$ and $B_0$, an output S0, and a carry output C0'. The full adder FA1 has inputs $A_1$ and $B_1$, a carry input C0', an output S1, and a carry output C1'. The full adder FA2 has inputs $A_2$ and $B_2$, a carry input C1', an output S2, and a carry output C2'. The full adder FA3 has inputs $A_3$ and $B_3$, a carry input C2', an output S3, and a carry output C3'. The half adder HA2 has inputs S0 and PF0, and an output $Q_0$, and a carry output C0. The full adder FA4 has inputs S1 and PF0, a carry input C0, an output $Q_1$, and a carry output C1. The half adder HA3 has inputs C1 and S2, an output $Q_2$, and a carry output C2. The half adder HA4 has inputs C2 and S3, and an output $Q_3$.

In accordance with the above configuration, the PF0 generator unit U1 determines if the sum of binaries A and B input to the "4 bit AD mod 13" circuit block is equal to or higher than 13 and if the sum of the numerals input, not as the numerals in Zp but as the 4-bit binary numbers, to the "4 bit AD(16) mod 13" circuit block is equal to or higher than 13. If the sum of binaries A and B is equal to or higher than 13, then the half adders HA1-HA3 and the full adders FA1-FA3 are used to add 3, a complement of 13 in 4-bit binary, to the sum of A and B in order to subtract 13 from the sum of A and B.

An example is described next on the circuitry of the encoder unit 221.

Figure 44A:
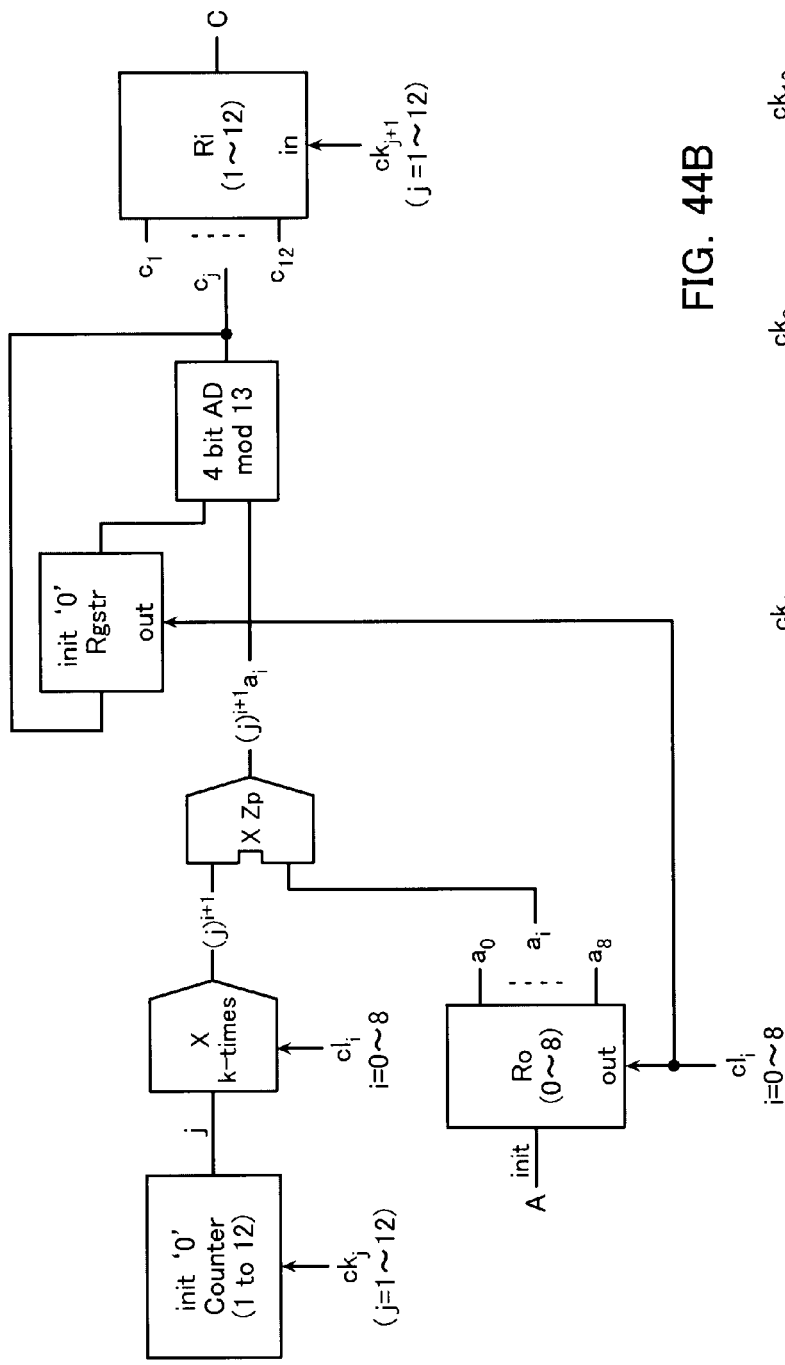
FIG. 44A is a block diagram of a circuit for deriving a code component to be stored in a memory in the memory controller according to the present embodiment.
Figure 44B:
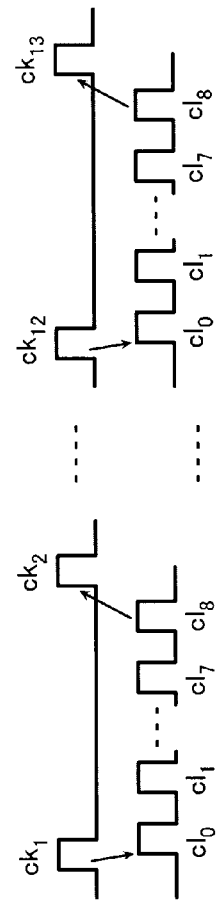
FIG. 44B is a diagram showing clocks for use in control of the circuit for deriving a code component to be stored in a memory in the memory controller according to the present embodiment.

FIG. 44A is a block diagram of a circuit for converting a code word A in Zp to a Lee metric code C. FIG. 44B is a diagram showing double clocks ck and cl for use in control of the circuit shown in FIG. 44A.

As shown in FIG. 44B, the clocks cl are pulses that rise with delays after the rise of ck, and the clocks cl rise sequentially as $cl_0$-$cl_8$, 9 in total, at every clock ck. After $cl_8$ rises, the next clock ck rises with a delay. The same waveforms repeat from $ck_1$ to $ck_{12}$.

Among these clocks ck and cl, ck is applied to control a "Counter (1 to 12)" circuit block and a "Ri (1-12)" register unit, and cl to control a "Ro (0-8)" register unit, an "X k-times" circuit block and a "Rgstr" register.

The "Counter (1 to 12)" circuit block is a circuit having an initial state of 0. It starts counting the number of clocks again at every rise of the clock ck and provides the number. Namely, of $ck_j$ (j=1-12), it provides j to the "X k-times" circuit block at the rise of $ck_j$.

The "Ri (1-12)" register unit includes registers operative to store components $c_j$ of the code word C and capable of storing 12 numerals in total. The "Ri (1-12)" register unit stores numerals in the individual registers sequentially in sync with the timing of the rise of ck. Namely, data, that is, the element $c_j$ is taken into the register at the timing of the rise of $ck_{j+1}$. At the rise of $ck_{13}$, 12 elements $c_j$ are taken in the registers. In a word, the code C can be thus stored.

The "X k-times" circuit block is a circuit that multiplies the output by the input at every rise of the clock cl. The "X k-times" circuit block multiplies the output by the input j at every rise of cl, 9 times in total. Namely, the rises of $cl_i$ (i=0-8) bring the output from the "X k-times" circuit block to $(j)^{i+1}$. This output is fed to the "X Zp" circuit block.

The "Ro (0-8)" register unit includes registers capable of storing 9 numerals, and stores 9 components $a_0$-$a_8$ of the code A in the initial state. The "Ro (0-8)" register unit receives the clock cl, and provides the components $a_0$-$a_8$ of the code A in order at every rise of the clock cl. Namely, on receipt of $cl_i$ (i=0-8), it provides $a_i$.

The "X Zp" circuit block is a circuit operative to execute a multiplication of the input in Zp. The "X Zp" circuit block receives the output $(j)^{i+1}$ from the "X k-times" circuit block and the output $a_i$ from the "Ro (0-8)" register unit at every clock $cl_i$, and provides $(j)^{i+1}a_i$. The output numeral $(j)^{i+1}a_i$ is summed in a combination of the "4 bit AD mod 13" circuit block and the "Rgstr" register.

The "4 bit AD mod 13" circuit block is a circuit that seeks the sum of 2 input numerals modulo 13. On the other hand, the "Rgstr" register is a register having an initial state of 0. It blocks any input from the "4 bit AD mod 13" circuit block at every input of the clock cl and feeds the self-holding contents to the "4 bit AD mod 13" circuit block. The connection of the "4 bit AD mod 13" circuit block with the "Rgstr" register as shown in FIG. 44A provides the sum of the previous output numeral and a numeral output from a new "X Zp" circuit block at every input of the clock cl. Namely, when the clock $cl_0$-$cl_8$ rises, the component $c_j$ of C after the conversion of the code A to the Lee metric code is provided in the cycle of the clock $ck_j$. This is held in the "Ri (1-12)" register unit at the top in the cycle of the next $ck_{j+1}$. Thus, it is possible to obtain the code C converted from the code A.

The "X k-times" circuit block shown in FIG. 44A is described next.

Figure 45:
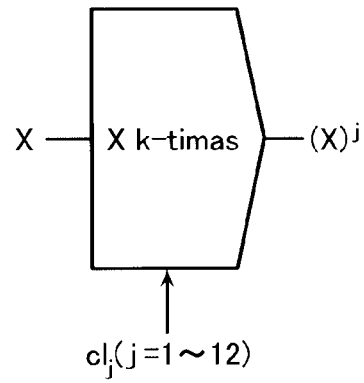
FIG. 45 is a diagram showing a circuit symbol of a circuit for deriving the powers of elements in Zp ("X k-times" circuit block) in the memory controller according to the present embodiment.
Figure 46:
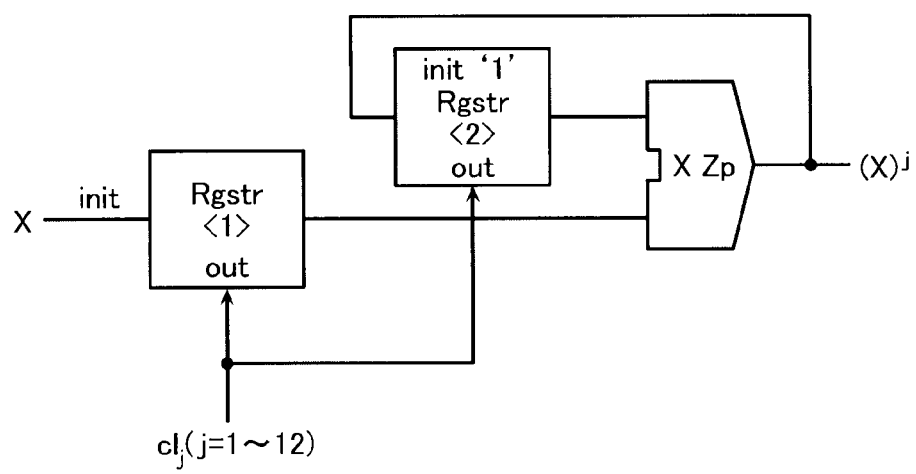
FIG. 46 is a block diagram of the "X k-times" circuit block in the memory controller according to the present embodiment.

FIG. 45 is a diagram showing a circuit symbol of the "X k-times" circuit block. FIG. 46 is a block diagram of the "X k-times" circuit block.

The "X k-times" circuit block is a circuit operative to compute a power $(X)^j$ of the input X, which is controlled by the clock $cl_j$ (j=1-12) as shown in FIG. 45.

The "X k-times" circuit block includes an "X Zp" circuit block, and a "Rgstr" register <1> and a "Rgstr" register <2> operable in sync with the clock cl as shown in FIG. 46.

The "Rgstr" register <1> has an input connected to X, and an output connected to one output of the "X Zp" circuit block.

The "Rgstr" register <2> has an input connected to the output of the "X k-times" circuit block, and an output connected to one input of the "k-times" circuit block. The "Rgstr" register <2> holds '1' as the initial state.

In accordance with this circuitry, the "X k-times" circuit block takes its own output with a 1-cycle delay to obtain the product of the input X and the output $(X)^j$.

The output $(X)^j$ is multiplied cumulatively by the input X at every input of the clock cl. The data X is set in the "Rgstr" register <1> before the clock $cl_j$ rises, and the "Rgstr" register <2> having an initial state of '1' is brought into sync therewith, thereby obtaining $(X)^j$ at the j-th $cl_j$.

<Syndrome Generator Unit>

The circuitry of the syndrome generator unit 222 is described below.

A circuit block is described first, which is frequently used in subsequent operational processing, including the syndrome generator unit 222, for computing the m-th power of an element j in Zp over all the elements j in batch. Hereinafter, this circuit block is referred to as a "$(j)^i$ (j=1 to 12)" circuit block.

Figure 47:
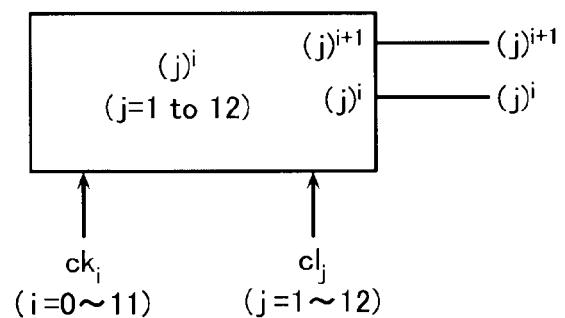
FIG. 47 is a diagram showing a circuit symbol of a circuit for deriving the powers of elements in Zp ("$(j)^i$ (j=1 to 12)" circuit block) in the memory controller according to the present embodiment.

FIG. 47 is a diagram showing a circuit symbol of the "$(j)^i$ (j=1 to 12)" circuit block.

The "$(j)^i$ (j=1 to 12)" circuit block is controlled by the clocks $ck_i$ (i=0-11) and $cl_j$ (j=1-12), and provides $(j)^i$ and $(j)^{i+1}$ in sync with the rise of the clock $cl_j$.

Figure 48A:
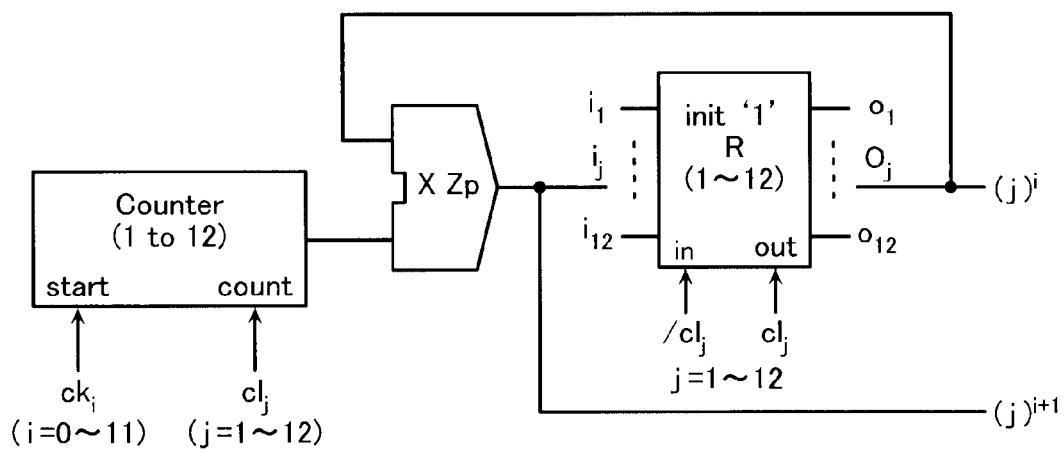
FIG. 48A is a block diagram of the "$(j)^i$ (j=1 to 12)" circuit block in the memory controller according to the present embodiment.

FIG. 48A is a block diagram of the "$(j)^i$ (j=1 to 12)" circuit block.

The "$(j)^i$ (j=1 to 12)" circuit block is a circuit that computes the 0-th to 11-th powers of all the elements 1-12 in Zp other than zero in order, and holds them in registers.

The "$(j)^i$ (j=1 to 12)" circuit block includes an "X Zp" circuit block, a "Counter (1 to 12)" circuit block, and a "R (1-12)" register unit as shown in FIG. 48A.

Figure 48B:
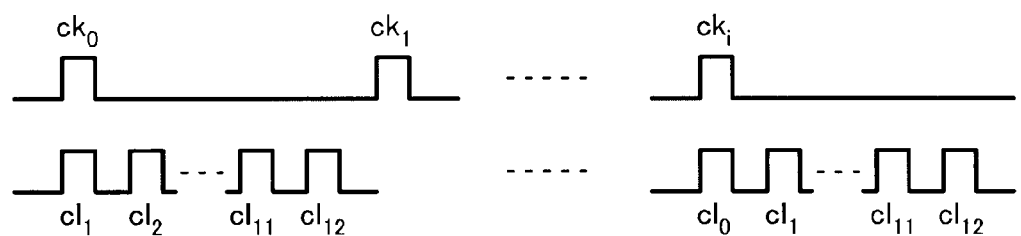
FIG. 48B is a diagram showing clocks for use in control of the "$(j)^i$ (j=1 to 12)" circuit block in the memory controller according to the present embodiment.

FIG. 48B is a diagram showing clocks for use in control of the "$(j)^i$ (j=1 to 12)" circuit block. The index-decidable clock is cki, and an index i can be decided by the order of the clock cki. On the other hand, the elements in Zp are designated from 1 in order by the clock cl, and the order j of the clock $cl_j$ indicates the number of elements.

The "Counter (1 to 12)" circuit block is connected to one input of the "X Zp" circuit block. It uses $ck_i$ as the start signal and counts up at the timing of the rise of $cl_j$ within a range of 1-12.

The "R (1-12)" register unit includes 12 registers. It stores the inputs $i_1$-$i_{12}$ in No. 1-12 registers in order at the rise of the clock /$cl_j$ at in, and provides the contents $i_1$-$i_{12}$ of No. 1-12 registers in order at the rise of the clock $cl_j$ at out.

As shown in FIG. 48A, the clocks ck and cl input to the "Counter (1 to 12)" circuit block and the "R (1-12)" register unit are synchronized with each other, and the output from the "R (1-12)" register unit is multiplied by the output from the "Counter (1 to 12)" circuit block at the "X Zp" circuit block. As a result, after the clock $ck_i$ rises, the "R (1-12)" register unit provides $(j)^i$ at every rise of $cl_j$. In addition, the "X Zp" circuit block provides $(j)^{i+1}$. This $(j)^{i+1}$ can be used in each computing circuit, if required.

Next, an example is described on the circuitry of the syndrome generator unit 222, that is, an operating circuit operative to seek component elements of the syndrome S in batch. Hereinafter, this operating circuit is referred to as a "syndrome component element generating circuit".

The syndrome component element generating circuit is configured based on the equations shown in Expression 31.

$$S_0 = \sum_{j=1}^{12} y_j = \sum_{j=1}^{12} e_j \qquad \text{[Expression 31]}$$

$$S_1 = \sum_{j=1}^{12} (j)^1 y_j = \sum_{j=1}^{12} (j)^1 e_j$$

Figure 49A:
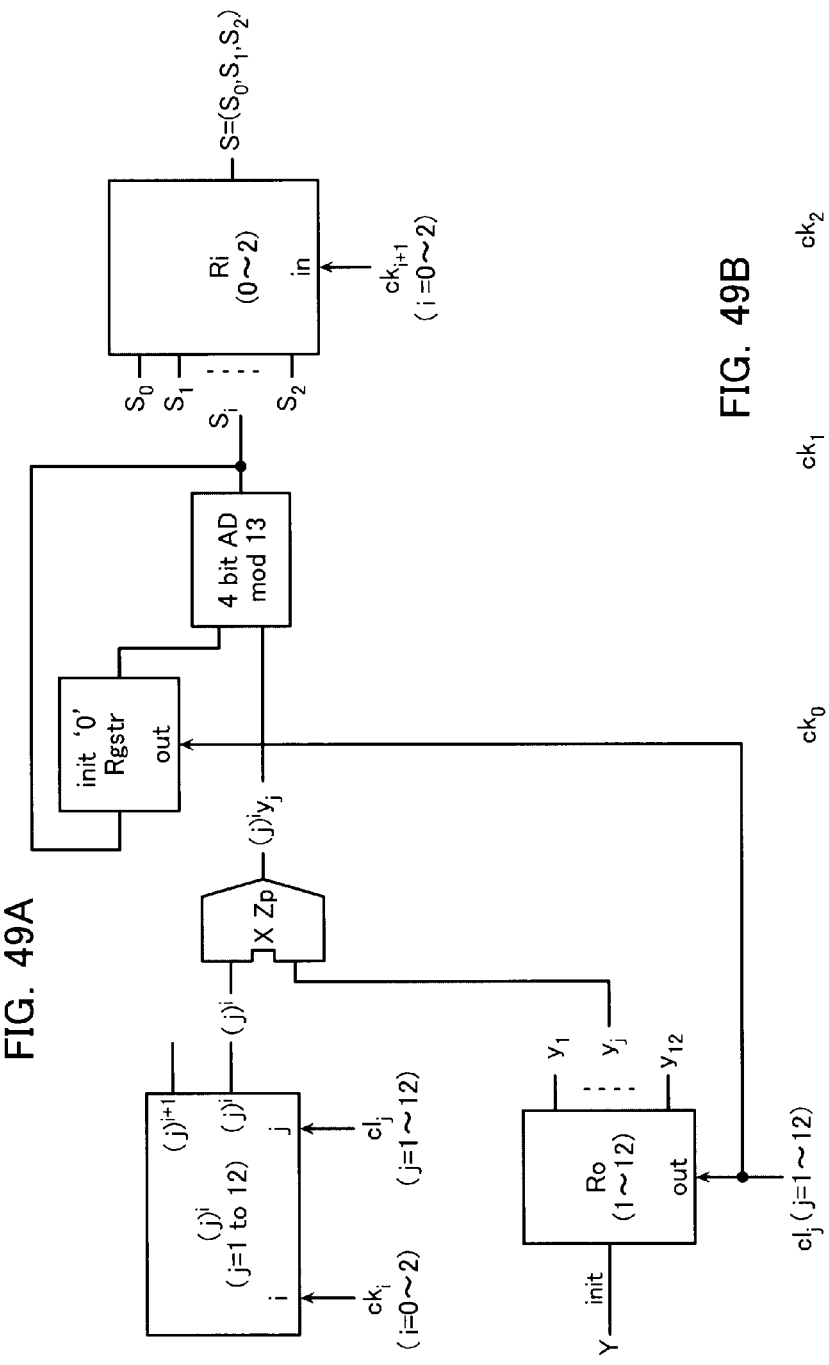
FIG. 49A is a block diagram of a circuit for deriving component elements of a syndrome in the memory controller according to the present embodiment.
Figure 49B:
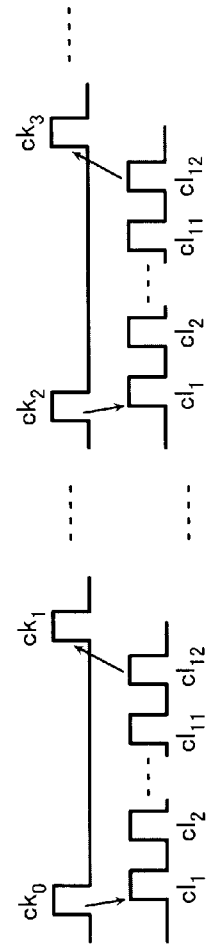
FIG. 49B is a diagram showing clocks for use in control of the circuit for deriving component elements of a syndrome in the memory controller according to the present embodiment.

FIG. 49A is a block diagram of the syndrome component element generating circuit, and FIG. 49B is a timing chart of the clocks $ck_i$ (i=0-3), $cl_j$ (j=1-12) for use in control of the syndrome component element generating circuit.

The syndrome component element generating circuit includes, as shown in FIG. 49A, a "Ro (1-12)" register unit, a "$(j)^i$ (j=1 to 12)" circuit block, an "X Zp" circuit block, a "4 bit AD mod 13" circuit block, a "Rgstr" register, and a "Ri (0-2)" register unit.

The code Y readout of the memory device 100 is converted at the "p-adic < > MLC binary mapping" circuit block 230 and stored in the "Ro (1-12)" register as the initial setting. The "$(j)^i$ (j=1 to 12)" circuit block generates $(j)^i$. The "Ro (1-12)" register and the "$(j)^i$ (j=1 to 12)" circuit block are synchronized with each other by the clock $cl_j$ and controlled so that $(j)^i$ is provided at the same time as the output of the component $y_j$ of Y. The "X Zp" circuit block yields the product thereof, $(j)^i y_j$, which is summed, in sync with the clock $cl_j$ (j=1 to 12), through the loop including the "4 bit AD mod 13" circuit block and the "Rgstr" register, to create a syndrome component $S_i$. The resultant $S_i$ is stored in the i-th register in the "Ri (0-2)" register at the clock $ck_{i+1}$. This process is treated at the clock $ck_i$ for i=0-2 to obtain all syndrome components, which are then stored in the "Ri (0-2)" register unit.

The decision on the success/fail of error searching for the code Y requires derivation of Lee metrics $|S_0|$ of syndrome vector components $S_0$.

Therefore, the following description is given to an operational circuit element operative to compute a Lee metric of the element in Zp. Hereinafter, this operational circuit element is referred to as a "4 bit LM 13" circuit block.

As for an element a in Zp represented in 4-bit binary, the associated Lee metric Q=|a| can be expressed by Q=/PF0×a+ PF0×(13−a). Here, PRO becomes '1' if a ≥7, and '0' if a <7. Therefore, a derivation of the Lee metric of a in the case of a ≥7 just requires a subtraction of a from 13, that is, an addition of the complement of a to 13.

A relation between A and Q in the case of h=4, p=13 is as in Expression 32.

$$a = A_0 + A_1 2 + A_2 2^2 + A_3 2^3$$

$$Q = |a|(Q = /PF0 \times a + PF0 \times (13-a))$$

$$Q = Q_0 + Q_1 2 + Q_2 2^2 + Q_3 2^3 \qquad \text{[Expression 32]}$$

Figure 50:
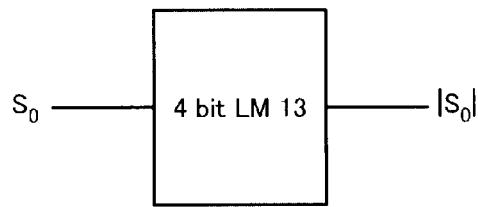
FIG. 50 is a diagram showing a circuit symbol of a Lee metric operating circuit ("4 bit LM 13" circuit block) in the memory controller according to the present embodiment.
Figure 51:
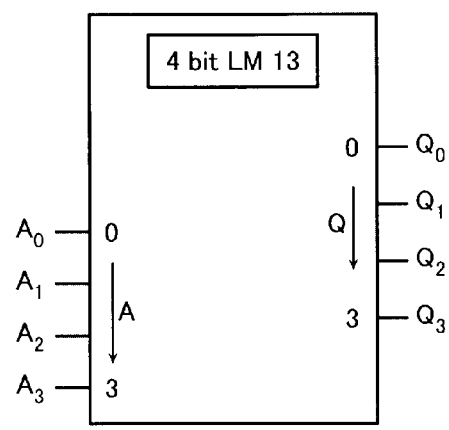
FIG. 51 is a diagram showing a detailed circuit symbol of the "4 bit LM 13" circuit block in the memory controller according to the present embodiment.
Figure 52:
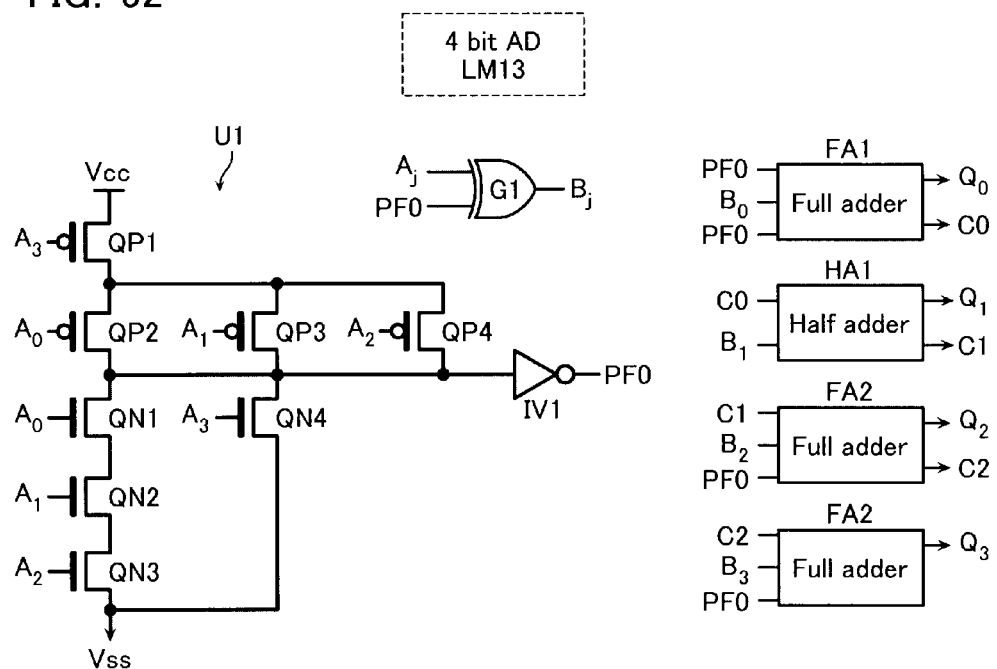
FIG. 52 is a block diagram of the "4 bit LM 13" circuit block in the memory controller according to the present embodiment.

FIG. 50 shows a circuit symbol of the "4 bit LM 13" circuit block, and FIG. 51 is a block diagram of the "4 bit LM 13" circuit block.

The "4 bit LM 13" circuit block receives a 4-bit binary $A_0$-$A_3$, and provides a 4-bit binary $Q_0$-$Q_3$.

The "4 bit LM 13" circuit block comprises a PF0 generator unit U1, an XOR gate G1, a half adder HA1, and 3 full adders FA1-FA3.

The PF0 generator unit U1 includes, between the Vcc terminal and the Vss terminal, serially connected PMOS transistors QP1, QP2 and NMOS transistors QN1-QN3. These transistors QP1, QP2, QN1, QN2 and QN3 are controlled by $A_3$, $A_0$, $A_0$, $A_1$, and $A_2$, respectively.

The PF0 generator unit U1 also includes 2 PMOS transistors QP3, QP4, an NMOS transistor QN4, and an inverter IV1.

The transistors QP3, QP4 are connected between the source and drain of the transistor QP2. The transistor QN4 is connected between the source of the transistor QN1 and the drain of the transistor QN3 (Vss terminal). These transistors QP3, QP4 and QN4 are controlled by $A_1$, $A_2$ and $A_3$, respectively. The inverter IV1 has an input connected to the sources of the transistors QN1 and QN4. The output from the inverter IV1 provides a carry PF0.

The XOR gate G1 receives A (j=0-3) and PF0, and provides $B_j$.

The full adder FA1 has inputs $B_0$ and PF0, a carry input PF0, an output $Q_0$, and a carry output C0. The half adder HA1 has inputs C0 and $B_1$, an output $Q_1$, and a carry output C1. The full adder FA2 has inputs $B_2$ and PF0, a carry input C1, an output $Q_2$ and a carry output C2. The full adder FA3 has inputs $B_3$ and PF0, a carry input C2, an output $Q_3$.

If the input reaches 7 or above, the complement of a is added to 13. The complement of a in the case of PF0=1 is created at the XOR gate G1 by inverting $A_j$, that is, each bit representation of a, to yield $B_1$, and adding 1 thereto.

As p=13 is 13=$(1101)_2$, this is represented by PF0, and further PF0 is used as 1, then these are added to $B_j$ as the sum of binaries.

The "4 bit LM 13" circuit block operates not in sync with the clocks and, on receipt of inputs, provides the computed Lee metric. If the Lee metric is equal to or larger than 3, solution searching is halted.

<Solution Searching Polynomial Generator Unit>

The configuration of the solution searching polynomial generator unit 223 is described below.

First, an operating circuit for seeking a solution searching polynomial Ψ(x) is described. This operating circuit is referred to as a "solution searching polynomial generating circuit".

A processing equation is shown in Expression 33, which is required in operational processing for deriving a coefficient $\phi_j$ at each degree j of x in the solution searching polynomial Ψ(x).

$$\Psi(x) = 1 + \sum_{j=1} \psi_j x^j \qquad \text{[Expression 33]}$$

$$\psi_j = -j^{-1} \sum_{i=1}^{j} \psi_{j-1} S_i$$

$$\psi_0 = 1$$

$$\psi_1 = -\psi_0 S_1 = -S_1$$

$$\psi_2 = -(\psi_1 S_1 + \psi_0 S_2)/2 = -(\psi_1 S_1 + S_2)/2$$

Figure 53:
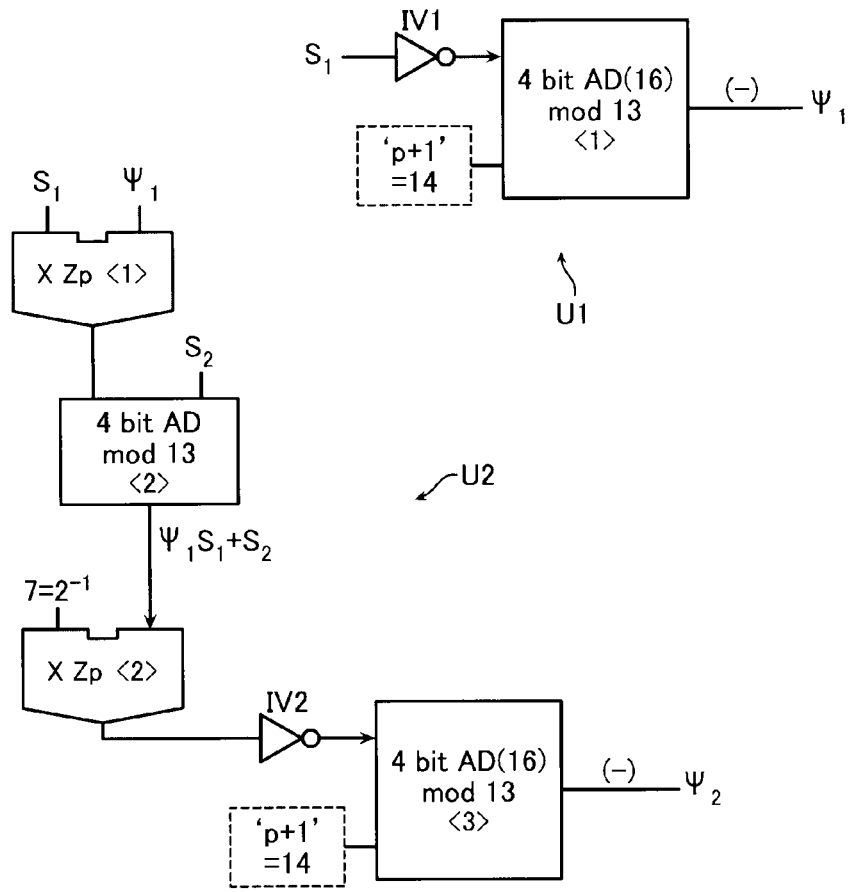
FIG. 53 is a block diagram of a circuit for deriving a solution searching polynomial in the memory controller according to the present embodiment.

FIG. 53 is a block diagram of the solution searching polynomial generating circuit.

The solution searching polynomial generating circuit includes a first part unit U1 operative to derive the 1st order coefficient $\phi_1$, and a second part unit U2 operative to derive the 2nd order coefficient $\phi_2$.

The first part unit U1 includes an inverter IV1 operative to receive $S_1$, and a "4 bit AD(16) mod 13" circuit block <1> operative to receive the output from the inverter IV1 and 14 (=p+1).

As the 1st order coefficient is $\phi_1 = -S_1$, it is sufficient to derive a complement of $S_1$ in a 4-bit representation. The derivation of the complement in 4-bit binary makes it possible to represent a negative numeral in Zp. Therefore, the first part unit U1 uses the inverter IV1 to invert $S_1$, to which 14 is added at the "4 bit AD(16) mod 13" circuit block <1>, so that the output from the "4 bit AD(16) mod 13" circuit block <1> can provide $\phi_1$.

The first part unit U1 is configured based on a computational equation for the input A shown in Expression 33.

$$-A \equiv p - A \equiv p + A^* \pmod{2^h} \equiv p + 1 + /A \pmod{2^h} \equiv p + 1 + /A \pmod{2^h}$$
[Expression 33]

where A* indicates a complement of A in h bits, /A indicates an inverted number of A in h bits, and ≡ indicates the sum mod p.

The first part unit U1 embodies p+1+/A (mod $2^h$) in Expression 33. Therefore, for computation of the sum of 4-bit numbers mod 13 at the "4 bit AD(16) mod 13" circuit block <1>, it receives the output from the inverter IV1 corresponding to /A, and 14 corresponding to p+1.

The second part unit U2 comprises an "X Zp" circuit block <1> operative to receive $S_1$ and $\phi_1$; a "4 bit AD mod 13" circuit block <2> operative to receive the output from the "X Zp" circuit block <1> and $S_2$; an "X Zp" circuit block <2> operative to receive the inverse element of 2, that is, 7 (=$2^{-1}$) and the output from the "4 bit AD mod 13" circuit block <2>, that is, $\phi_1 S_1 + S_2$; an inverter IV2 operative to receive the output from the "X Zp" circuit block <2>; and a "4 bit AD(16) mod 13" circuit block <3> operative to receive the output from the inverter IV2 and 14 (=p+1). The output from the "4 bit AD(16) mod 13" circuit block <3> provides $\phi_2$.

The second part unit U2 realizes $\phi_2 = -(\phi_1 S_1 + S_2)/2$ faithfully using the "X Zp" circuit blocks <1>, <2>, the "4 bit AD mod 13" circuit block <2>, and the "4 bit AD(16) mod 13" circuit block <3>. The inverse element of 2 is equal to 7 and thus a division by 2 turns to a multiplication by 7.

All the circuits contained in the solution searching polynomial generating circuit are asynchronous circuits in simple circuitry using no clocks.

<Euclidean Iteration Processing Unit>

The Euclidean iteration processing unit 224 is described below.

First, as the premise of the use of a Euclidean method for deriving an error searching polynomial from $\Psi(x)$ and $x^3$, the Euclidean method is described.

Below described is a method for deriving polynomials $\lambda(x)$ and $\nu(x)$ that satisfy a congruence equation, $\nu(x)\Psi(x) \equiv \lambda(x) \pmod{x^3}$, using the Euclidean iterative method, in accordance with the stop condition, deg $\lambda(x)$ – deg $\nu(x) \equiv S_0 \pmod{13}$. Among the polynomials $\lambda(x)$ and $\nu(x)$ derived, one that satisfies deg $\lambda(x)$ + deg $\nu(x) < 3$ is the error searching polynomial.

The Euclidean iterative method is a method for deriving functions $f_0, f_1, \ldots, f_n$ in turn using divisions of polynomials. These quantities have relations therebetween shown in Expression 34.

$$f_0 = k_0 f_1 + f_2,$$
$$f_1 = k_1 f_2 + f_3, \ldots, f_n = k_n f_{n+1} + f_{n+2}$$
$$p_{-1} = 0, p_0 = 1, p_n = k_{n-1} p_{n-1} + p_{n-2}$$
$$q_0 = 0, q_1 = 1, q_n = k_{n-1} q_{n-1} + q_{n-2}$$

$$\begin{aligned} p_n f_n + p_{n-1} f_{n+1} &= (k_{n-1} p_{n-1} + p_{n-2}) f_n + p_{n-1} f_{n+1} \\ &= p_{n-1}(k_{n-1} f_n + f_{n+1}) + p_{n-2} f_n \\ &= p_{n-1} f_{n-1} + p_{n-2} f_n \\ &\vdots \\ &= p_0 f_0 + p_{-1} f_1 = f_0 \end{aligned}$$

$$\begin{aligned} q_n f_n + q_{n-1} f_{n+1} &= (k_{n-1} q_{n-1} + q_{n-2}) f_n + q_{n-1} f_{n+1} \\ &= q_{n-1}(k_{n-1} f_n + f_{n+1}) + q_{n-2} f_n \\ &= q_{n-1} f_{n-1} + q_{n-2} f_n \\ &\vdots \\ &= q_1 f_1 + q_0 f_2 = f_1 \end{aligned}$$

$$f_0 = p_n f_n + p_{n-1} f_{n+1}, f_1 = q_n f_n + q_{n-1} f_{n+1}$$

$$\begin{vmatrix} p_n & p_{n-1} \\ q_n & q_{n-1} \end{vmatrix} = \begin{vmatrix} k_{n-1} p_{n-1} & p_{n-1} \\ k_{n-1} q_{n-1} & q_{n-1} \end{vmatrix}$$
$$= -\begin{vmatrix} p_{n-1} & p_{n-2} \\ q_{n-1} & q_{n-2} \end{vmatrix} \to p_n q_{n-1} - p_{n-1} q_n$$
$$= (-1)^{n-1}(p_1 q_0 - p_0 q_1)$$
$$= (-1)^n,$$

$$f_n = (-1)^n (q_{n-1} f_0 - p_{n-1} f_1)$$
$$\therefore f_n \equiv (-1)^{n+1} p_{n-1} \Psi \pmod{x^3},$$
$$f_0 = x^3, f_1 = \Psi$$

[Expression 34]

In this case, increases in n inevitably find $f_n$ having a smaller degree than the previous degrees at a certain n as shown in Expression 34. This fact leads to the condition indicative of the presence of the possibility of deriving a solution that satisfies the stop condition on the Euclidean iterative method.

In particular, with sequential introductions of $p_n$ and $q_n$ from the quotient polynomials $k_n$ obtained in the process of divisions, these polynomials can satisfy simple relations. Therefore, $f_n$ can be represented by $f_0, f_1, p_{n-1}$ and $q_{n-1}$ as $f_n = (-1)^n (q_{n-1} f_0 - p_{n-1} f_1)$ such that as the degree of $f_n$ decreases, the degrees of $p_{n-1}$ and $q_{n-1}$ increase. The degree of $p_{n-1}$ increases as the degree of $f_n$ decreases in this way, and accordingly the difference between degrees decreases inevitably to satisfy the stop condition.

Generally, in the Euclidean method, $f_n = k_n f_{n+1} + f_{n+2}$ utilizes the sequential decreases in degree in relation to divisions while $k_n$ assumes the 1st or 0-th degree equation here and accordingly the degree cannot decrease always. Rather, the degree may increase but cannot exceed the degree of $f_0$. In any way, if the relation about the factorization of the above polynomial $\Psi(x)$ establishes, the relation shown in Expression 34 can establish. Therefore, it is possible to finally lower the degree to satisfy the stop condition on the iteration.

Therefore, when substitutions of $f_0 = x^3$, $f_1 = \Psi(x)$ are made to create a congruence equation at $x^3$, the stop condition on the iteration comes to deg $f_n$ – deg $p_{n-1} \equiv S_0 \pmod{13}$. With respect to n that satisfies this stop condition, if deg $f_n$ + deg $p_{n-1} < 3$, then substitutions of $\lambda(x) = f_n$, $\nu(x) = p_{n-1}$ are possible.

On the other hand, if it is not possible to achieve such the degree relation, it means the occurrence of an error that cannot satisfy the error-correctable condition.

An example is described next on the circuitry of the Euclidean iteration processing unit 224.

Described first is a circuit operative to derive $k_n$ in computation of $f_n = k_n f_{n+1} + f_{n+2}$. Hereinafter, this circuit is referred to as a "kn" circuit block.

The "kn" circuit block is configured based on the relational equations shown in Expression 35.

$$f_n = k_n f_{n+1} + f_{n+2}$$

$$f_n = a^{(n)}_0 + a^{(n)}_1 x + a^{(n)}_2 x^2 + a^{(n)}_3 x^3$$

$$k_n = b^{(n)}_0 + b^{(n)}_1 x$$

$$b^{(n)}_1 = a^{(n)}_m / b^{(n+1)}_{m-1}, b^{(n)}_0 = (a^{(n)}_{m-1} - b^{(n)}_1 a^{(n+1)}_{m-2}) / a^{(n+1)}_{m-1}$$

[Expression 35]

The "kn" circuit block computes the relation between coefficients, $b^{(n)}_1 = a^{(n)}_m / b^{(n+1)}_{m-1}$, $b^{(n)}_0 = (a^{(n)}_{m-1} - b^{(n)}_1 a^{(n+1)}_{m-2}) / a^{(n+1)}_{m-1}$.

Figure 54:
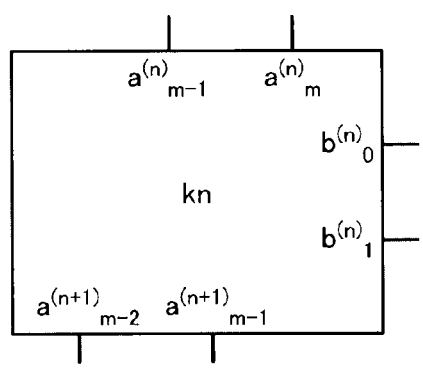
FIG. 54 is a diagram showing a circuit symbol of a circuit for use in a Euclidean iterative method ("kn" circuit block) in the memory controller according to the present embodiment.
Figure 55:
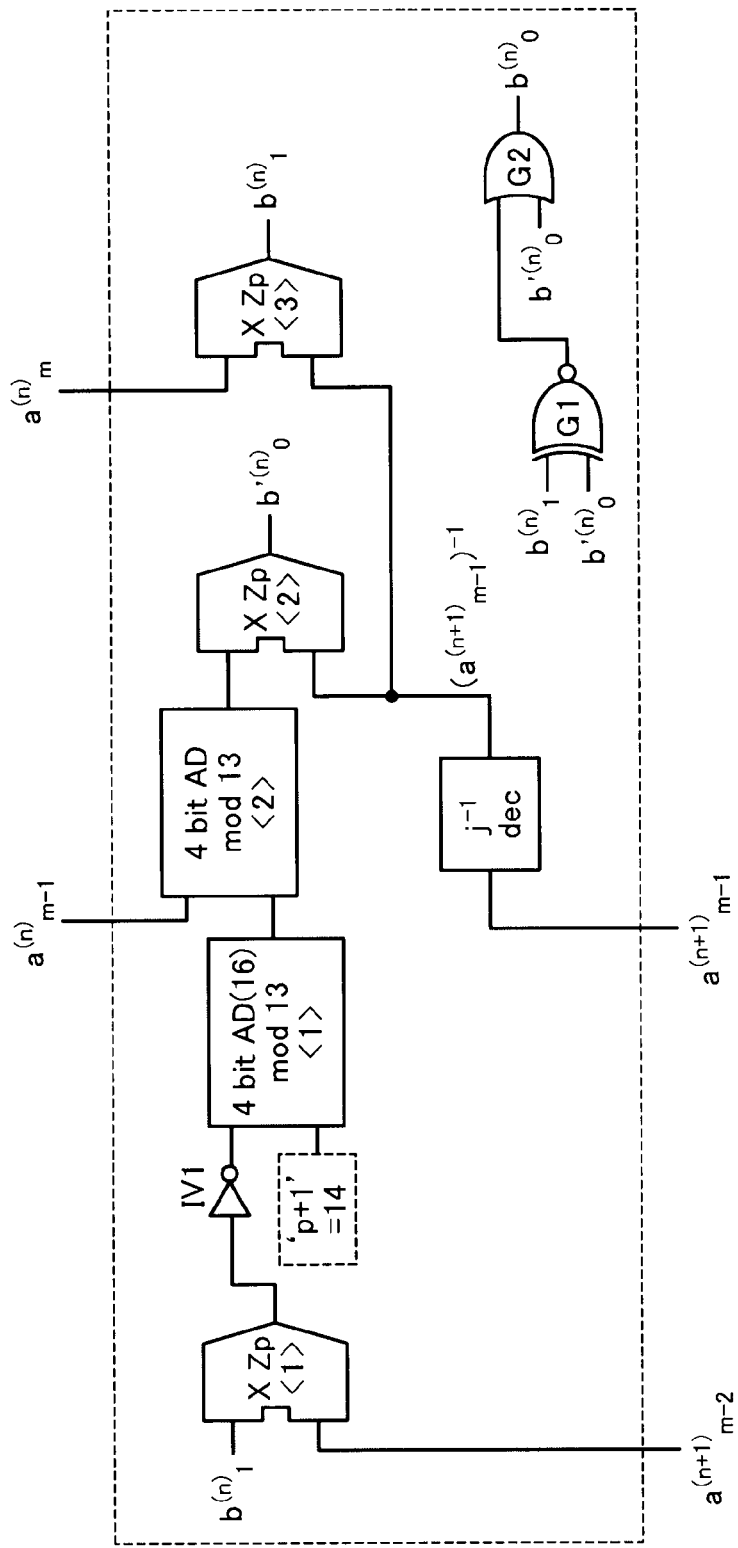
FIG. 55 is a block diagram of the "kn" circuit block in the memory controller according to the present embodiment.

FIG. 54 is a diagram showing a circuit symbol of the "kn" circuit block. FIG. 55 is a block diagram of the "kn" circuit block.

The "kn" circuit block receives $a^{(n)}_{m-1}$ and $a^{(n)}_m$, and provides $a^{(n+1)}_{m-1}$, $a^{(n+1)}_{m-2}$, $b^{(n)}_1$, and $b^{(n)}_0$ as shown in FIG. 54.

The "kn" circuit block includes 3 "X Zp" circuit blocks <1>, <2>, <3>, a "4 bit AD(16) mod 13" circuit block <1>, a "4 bit AD mod 13" circuit block <2>, a "$j^{-1}$ dec" circuit block, an XNOR gate G1, and an OR gate G2.

The "X Zp" circuit block <1> computes the product of $a^{(n+1)}_{m-2}$ and $b^{(n)}_1$. The result $b^{(n)}_1 a^{(n+1)}_{m-2}$ is fed to the "4 bit AD(16) mod 13" circuit block <1> via the inverter IV1.

The "4 bit AD(16) mod 13" circuit block <1> receives the output from the inverter IV1 and 14 (=p+1) to obtain a complement of $b^{(n)}_1 a^{(n+1)}_{m-2}$.

The "4 bit AD mod 13" circuit block <2> receives the output from the "4 bit AD (16) mod 13" circuit block <1> and $a^{(n)}_{m-1}$, and provides the result, $a^{(n)}_{m-1} - b^{(n)}_1 a^{(n+1)}_{m-2}$, to the "X Zp" circuit block <2>.

The "$j^{-1}$ dec" circuit block receives $a^{(n+1)}_{m-1}$, and provides the inverse element thereof, $(a^{(n+1)}_{m-1})^{-1}$, to the "X Zp" circuit blocks <2> and <3>.

The "X Zp" circuit block <2> computes the product of the output, $a^{(n)}_{m-1} - b^{(n)}_1 a^{(n+1)}_{m-2}$, from the "4 bit AD mod 13" circuit block <2> and the output, $(a^{(n+1)}_{m-1})^{-1}$, from the "$j^{-1}$ dec" circuit block to obtain the result $b'^{(n)}_0$.

The "X Zp" circuit block <3> computes the product of $a^{(n)}_m$ and the output, $(a^{(n+1)}_{m-1})^{-1}$, from the "$j^{-1}$ dec" circuit block to obtain the result $b^{(n)}_1$, that is, the output from the "kn" circuit block.

The XNOR gate G1 receives the output, $b'^{(n)}_0$, from the "X Zp" circuit block <2> and the output, $b^{(n)}_1$, from the "X Zp" circuit block <3>. The OR gate G2 receives the output from the XNOR gate G1 and $b'^{(n)}_0$. In this case, the output from the OR gate G2 turns to the output, $b^{(n)}_0$, from the "$k_n$" circuit block.

The "kn" circuit block applies the relations between coefficients shown in Expression 35 to derive an unknown coefficient from the known coefficients. On the assumption that the polynomial of $k_n$ is at the 1st degree, and that the coefficient is determined 0 in the process of computation if the coefficient at the highest degree becomes 0 as well, the process advances the procedure of computation sequentially. At this time, the inverse element of 0 is determined 0. In addition, the logics of the XNOR gate G1 and the OR gate G2 are introduced to deal $k_n$ as 1 to prevent $k_n$ from coming to zero in relation to the degrees of $f_n$ and $f_{n+1}$, so that the computation advances without entering the repetition loop. At this time, the degree of $f_{n+1}$ may increase in the process of computation though the degree can be made lower than the previous degrees before long because the degree is lowered 1 by 1 in and after the next cycle.

The following description is given to a circuit operative to derive $f_{n+2}$ in computation of $f_n = k_n f_{n+1} + f_{n+2}$. Hereinafter, this circuit is referred to as an "fn" circuit block.

The "fn" circuit block is configured based on the relational equations shown in Expression 36.

$$f_n = k_n f_{n+1} + f_{n+2}$$

$$f_{n+2} = f_n - k_n f_{n+1}, k_n = b^{(n)}_0 + b^{(n)}_1 x$$

$$f_{n+2} = f_n - (b^{(n)}_0 f_{n+1} + b^{(n)}_1 x f_{n+1})$$

$$a^{(n+2)}_m = a^{(n)}_m - (b^{(n)}_0 a^{(n+1)}_m + b^{(n)}_1 a^{(n+1)}_{m-1})$$

[Expression 36]

The "fn" circuit block applies the relations between coefficients shown in Expression 36 to derive an unknown coefficient from the known coefficients. It utilizes the already-obtained coefficients of the polynomial of $k_n$. The "fn" circuit block computes $a^{(n+2)}_m = a^{(n)}_m - (b^{(n)}_0 a^{(n+1)}_m + b^{(n)}_1 a^{(n+1)}_{m-1})$.

Figure 56:
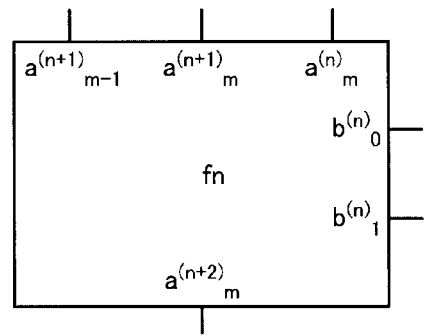
FIG. 56 is a diagram showing a circuit symbol of a circuit for use in a Euclidean iterative method ("fn" circuit block) in the memory controller according to the present embodiment.
Figure 57:
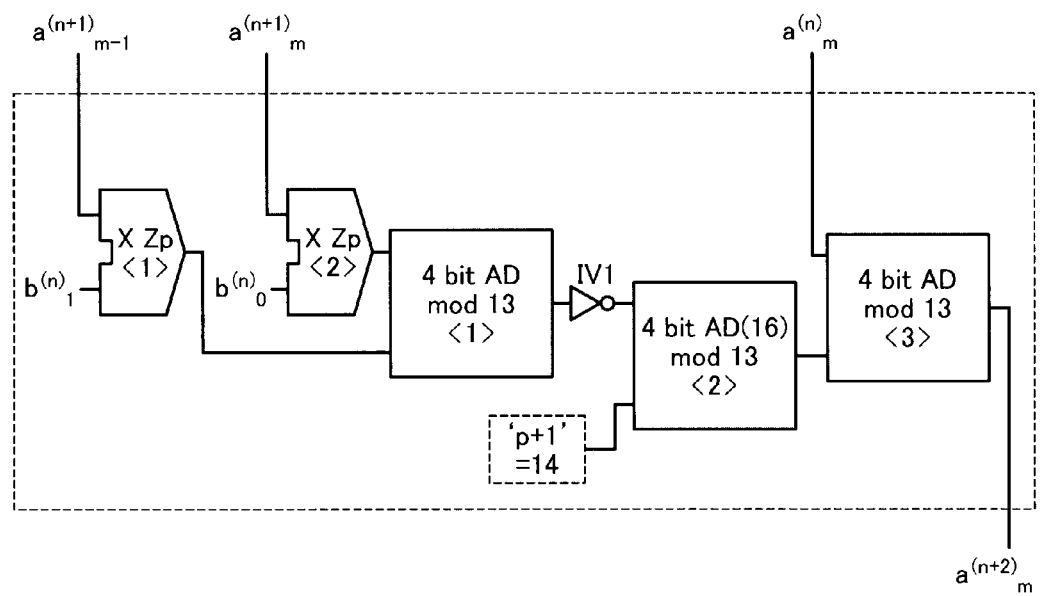
FIG. 57 is a block diagram of the "fn" circuit block in the memory controller according to the present embodiment.

FIG. 56 is a diagram showing a circuit symbol of the "fn" circuit block. FIG. 57 is a block diagram of the "fn" circuit block.

The "fn" circuit block receives $a^{(n+1)}_{m-1}$, $a^{(n+1)}_m$, $a^{(n)}_m$, $b^{(n)}_1$ and $b^{(n)}_0$, and provides $a^{(n+2)}_m$ as shown in FIG. 56.

The "fn" circuit block includes 2 "X Zp" circuit blocks <1>, <2>, 2 "4 bit AD mod 13" circuit blocks <1>, <3>, and a "4 bit AD (16) mod 13" circuit block <2>.

The "X Zp" circuit block <1> computes the product of $a^{(n+1)}_{m-1}$ and $b^{(n)}_1$, and provides the result, $b^{(n)}_1 a^{(n+1)}_{m-1}$, to the "4 bit AD mod 13" circuit block <1>.

The "X Zp" circuit block <2> computes the product of $a^{(n+1)}_m$ and $b^{(n)}_0$, and provides the result, $b^{(n)}_0 a^{(n+1)}_m$, to the "4 bit AD mod 13" circuit block <1>.

The "4 bit AD mod 13" circuit block <1> receives the output, $b^{(n)}_1 a^{(n+1)}_{m-1}$, from the X Zp" circuit block <1> and the output, $b^{(n)}_0 a^{(n+1)}_m$, from the X Zp" circuit block <2>. The output from the "4 bit AD mod 13" circuit block <1> is fed to the "4 bit AD (16) mod 13" circuit block <2> via the inverter IV1.

The "4 bit AD (16) mod 13" circuit block <2> receives the output from the inverter IV1 and '1' to obtain a complement of $(b^{(n)}_0 a^{(n+1)}_m + b^{(n)}_1 a^{(n+1)}_{m-1})$.

The 4 bit AD mod 13" circuit block <3> receives $a^{(n)}_m$ and the output from the "4 bit AD (16)mod 13" circuit block <2> to obtain $a^{(n+2)}_m$, that is, the output from this "fn" circuit block.

The following description is given to a circuit operative to derive $p_{n-2}$ in computation of $p_n = k_{n-1} p_{n-1} + p_{n-2}$. Hereinafter, this circuit is referred to as a "pn" circuit block.

The "pn" circuit block is configured based on the relational equations shown in Expression 37.

$$p_n = k_{n-1} p_{n-1} + p_{n-2}$$

$$p_n = a^{(n)}_0 + a^{(n)}_1 x + a^{(n)}_2 x^2$$

$$k_n = b^{(n)}_0 + b^{(n)}_1 x$$

$$p_{n+1} = (b^{(n)}_0 p_n + b^{(n)}_1 x p_n) + p_{n-1}$$

$$a^{(n+1)}_m = (b^{(n)}_0 a^{(n)}_m + b^{(n)}_1 a^{(n)}_{m-1}) + a^{(n-1)}_m$$

[Expression 37]

The "pn" circuit block applies the relations between coefficients shown in Expression 37 to derive an unknown coefficient from the known coefficients. It utilizes the already-obtained coefficients of the polynomial of $k_n$. The "pn" circuit block computes the relation between coefficients, $a^{(n+1)}_m = (b^{(n)}_0 a^{(n)}_m + b^{(n)}_1 a^{(n)}_{m-1}) + a^{(n-1)}_m$.

Figure 58:
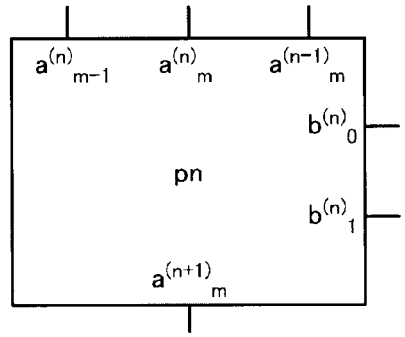
FIG. 58 is a diagram showing a circuit symbol of a circuit for use in a Euclidean iterative method ("pn" circuit block) in the memory controller according to the present embodiment.
Figure 59:
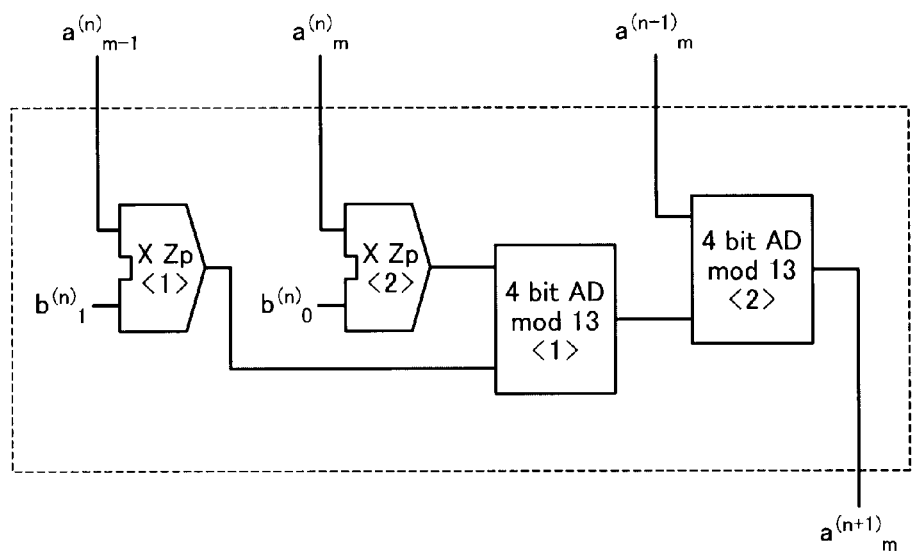
FIG. 59 is a block diagram of the "pn" circuit block in the memory controller according to the present embodiment.

FIG. 58 is a diagram showing a circuit symbol of the "pn" circuit block. FIG. 59 is a block diagram of the "pn" circuit block.

The "pn" circuit block receives $a^{(n)}_{m-1}$, $a^{(n)}_m$ and $a^{(n-1)}_m$, and provides $a^{(n+1)}$, as shown in FIG. 58.

The "pn" circuit block includes 2 "X Zp" circuit blocks <1>, <2>, and 2 "4 bit AD mod 13" circuit blocks <1> and <2> as shown in FIG. 59.

The "X Zp" circuit block <1> computes the product of $a^{(n)}_{m-1}$ and $b^{(n)}_1$, and provides the result, $b^{(n)}_1 a^{(n)}_{m-1}$, to the "4 bit AD mod 13" circuit block <1>.

The "X Zp" circuit block <2> computes the product of $a^{(n)}_m$ and $b^{(n)}_0$, and provides the result, $b^{(n)}_0 a^{(n)}_m$, to the "4 bit AD mod 13" circuit block <1>.

The "4 bit AD mod 13" circuit block <1> receives the output, $b^{(n)}_1 a^{(n)}_{m-1}$, from the X Zp" circuit block <1> and the output, $b^{(n)}_0 a^{(n)}_m$, from the X Zp" circuit block <2>, and provides $b^{(n)}_0 a^{(n)}_m + b^{(n)}_1 a^{(n)}_{m-1}$ to the "4 bit AD mod 13" circuit block <1>.

The "4 bit AD mod 13" circuit block <2> receives $a^{(n-1)}_m$ and the output, $b^{(n)}_0 a^{(n)}_m + b^{(n)}_1 a^{(n)}_{m-1}$, from the "4 bit AD mod 13" circuit block <1> to obtain $a^{(n+1)}_m$, that is, the output from the "pn" circuit block.

Subsequently, a circuit for computing $f_n = k_n f_{n+1} + f_{n+2}$ is described. Hereinafter, this circuit is referred to as an "$f_n = k_n f_{n+1} + f_{n+2}$" circuit block.

Figure 60:
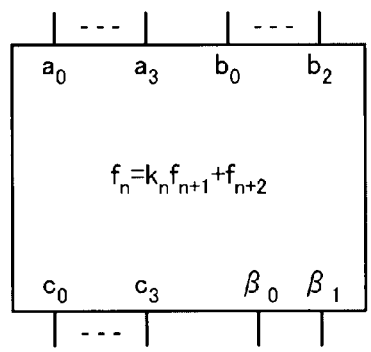
FIG. 60 is a diagram showing a circuit symbol of a circuit for use in a Euclidean iterative method ("$f_n=k_n f_{n+1}+f_{n+2}$" circuit block) in the memory controller according to the present embodiment.
Figure 61:
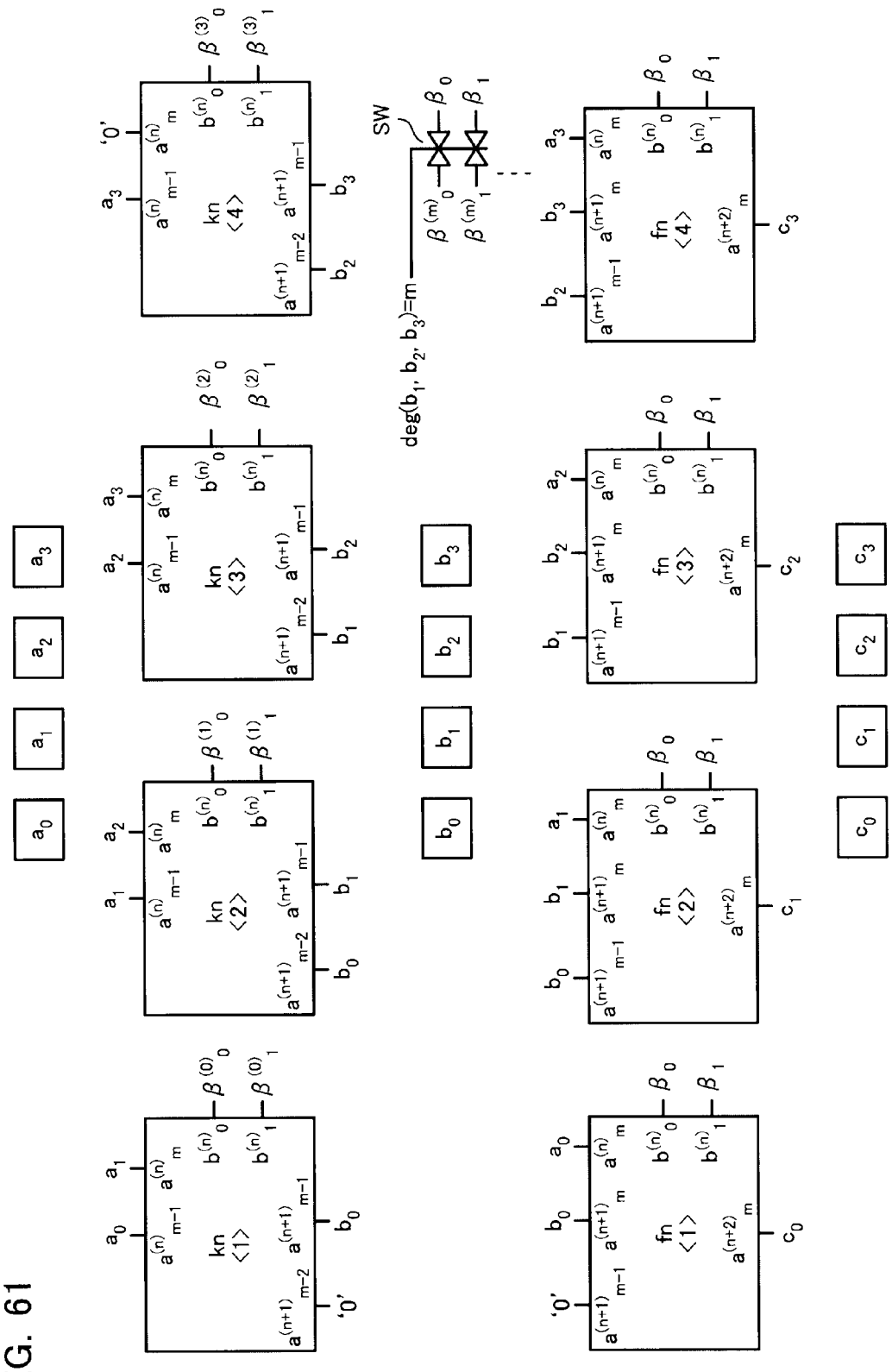
FIG. 61 is a block diagram of the "$f_n=k_n f_{n+1}+f_{n+2}$" circuit block in the memory controller according to the present embodiment.

FIG. 60 is a diagram showing a circuit symbol of the "$f_n = k_n f_{n+1} + f_{n+2}$" circuit block. FIG. 61 is a block diagram of the "$f_n = k_n f_{n+1} + f_{n+2}$" circuit block.

The "$f_n = k_n f_{n+1} + f_{n+2}$" circuit block receives the coefficients $a_0$-$a_3$ of $f_n$ and the coefficients $b_0$-$b_2$ of $f_{n+1}$, and provides the coefficients $c_0$-$c_3$ of $f_{n+2}$ and the coefficients $\beta_0$-$\beta_1$ of $k_n$ as shown in FIG. 60. As computations are started with substitutions of $f_0 = x^3$, $f_1 = \Psi(x)$, the maximum degree of $f_n$ is 3, and the maximum degree of $f_{n+2}$ is also 3 because $k_n$ may be 1. Therefore, the "$f_n = k_n f_{n+1} + f_{n+2}$" circuit block includes 4 "kn" circuit blocks <1>-<4>, and 4 "fn" circuit blocks <1>-<4> as shown in FIG. 61.

The "kn" circuit block <1> associates '0', $a_0$, $b_0$ and $a_1$ with $a^{(n+1)}_{m-2}$, $a^{(n)}_{m-1}$, $a^{(n+1)}_{m-1}$ and $a^{(n)}_m$, and associates $\beta^{(0)}_0$ and $\beta^{(0)}_1$ with $b^{(n)}_0$ and $b^{(n)}_1$, respectively.

The "kn" circuit block <2> associates $b_0$, $a_1$, $b_1$ and $a_2$ with $a^{(n+1)}_{m-2}$, $a^{(n)}_{m-1}$, $a^{(n+1)}_{m-1}$, and $a^{(n)}_m$, and associates $\beta^{(1)}_0$ and $\beta^{(1)}_1$ with $b^{(n)}_0$ and $b^{(n)}_1$, respectively.

The "kn" circuit block <3> associates $b_1$, $a_2$, $b_2$ and $a_3$ with $a^{(n+1)}_{m-2}$, $a^{(n)}_{m-1}$, $a^{(n+1)}_{m-1}$, and $a^{(n)}_m$, and associates $\beta^{(2)}_0$ and $\beta^{(2)}_1$ with $b^{(n)}_0$ and $b^{(n)}_1$, respectively.

The "kn" circuit block <4> associates $b_2$, $a_3$, $b_3$ and '0' with $a^{(n+1)}_{m-2}$, $a^{(n)}_{m-1}$, $a^{(n+1)}_{m-1}$ and $a^{(n)}_m$, and associates $\beta^{(3)}_0$ and $\beta^{(3)}_1$ with $b^{(n)}_0$ and $b^{(n)}_1$, respectively.

The outputs, $\beta^{(m)}_0$ and $\beta^{(m)}_1$ (m=0-3), from the "kn" circuit blocks <1>-<4> are provided as $\beta_0$ and $\beta_1$ from the "$f_n = k_n f_{n+1} + f_{n+2}$" circuit block via the control switches SW controlled by deg($b_1$, $b_2$, $b_3$)=m, respectively. The $\beta_0$ and $\beta_1$ can be utilized also as the inputs to the "fn" circuit blocks <1>-<4>. Here, deg( ) represents the output from the degree decision circuit associated with $f_{n+1}$.

The "fn" circuit block <1> receives '0', $b_0$, $a_0$, $\beta_0$ and $\beta_1$ as $a^{(n+1)}_{m-1}$, $a^{(n+1)}_m$, $a^{(n)}_m$, $b^{(n)}_0$ and $b^{(n)}_1$, and provides $c_0$ as $a^{(n+2)}_m$.

The "fn" circuit block <2> receives $b_0$, $b_1$, $a_1$, $\beta_0$ and $\beta_1$ as $a^{(n+1)}_{m-1}$, $a^{(n+1)}_m$, $a^{(n)}_m$, $b^{(n)}_0$ and $b^{(n)}_1$, and provides $c_1$ as $a^{(n+2)}_m$.

The "fn" circuit block <3> receives $b_1$, $b_2$, $a_2$, $\beta_0$ and $\beta_1$ as $a^{(n+1)}_{m-1}$, $a^{(n+1)}_m$, $a^{(n)}_m$, $b^{(n)}_0$ and $b^{(n)}_1$, and provides $c_2$ as $a^{(n+2)}_m$.

The "fn" circuit block <4> receives $b_2$, $b_3$, $a_3$, $\beta_0$ and $\beta_1$ as $a^{(n+1)}_{m-1}$, $a^{(n+1)}_m$, $a^{(n)}_m$, $b^{(n)}_0$ and $b^{(n)}_1$, and provides $c_3$ as $a^{(n+2)}_m$.

The outputs from the "fn" circuit blocks <1>-<4> turn to $c_0$-$c_3$, that is, the output from the "$f_n = k_n f_{n+1} + f_{n+2}$" circuit block.

If one of more of the inputs to the "kn" circuit blocks <1>-<4> and the "fn" circuit blocks <1>-<4> have no corresponding value, '0' is given instead.

The computation results from the "kn" circuit blocks <1>-<4> are switched in accordance with the degree of the polynomial $f_{n+1}$ representative of the coefficient of the input $b_n$, and utilized as $\beta$ inside the "$f_n = k_n f_{n+1} + f_{n+2}$" circuit block and provided. Namely, $\beta$ output from the "kn" circuit block related to the highest degree of $f_{n+1}$ is utilized.

Subsequently, a circuit for computing $p_{n+1} = k_n p_n + p_{n-1}$ is described. Hereinafter, this circuit is referred to as a "$p_{n+1} = k_n p_n + p_{n-1}$" circuit block.

Figure 62:
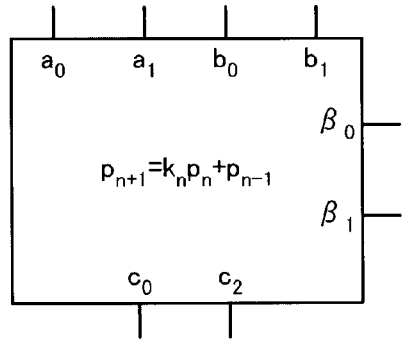
FIG. 62 is a diagram showing a circuit symbol of a circuit for use in a Euclidean iterative method ("$p_{n+1}=k_n p_n+p_{n-1}$" circuit block) in the memory controller according to the present embodiment.
Figure 63:
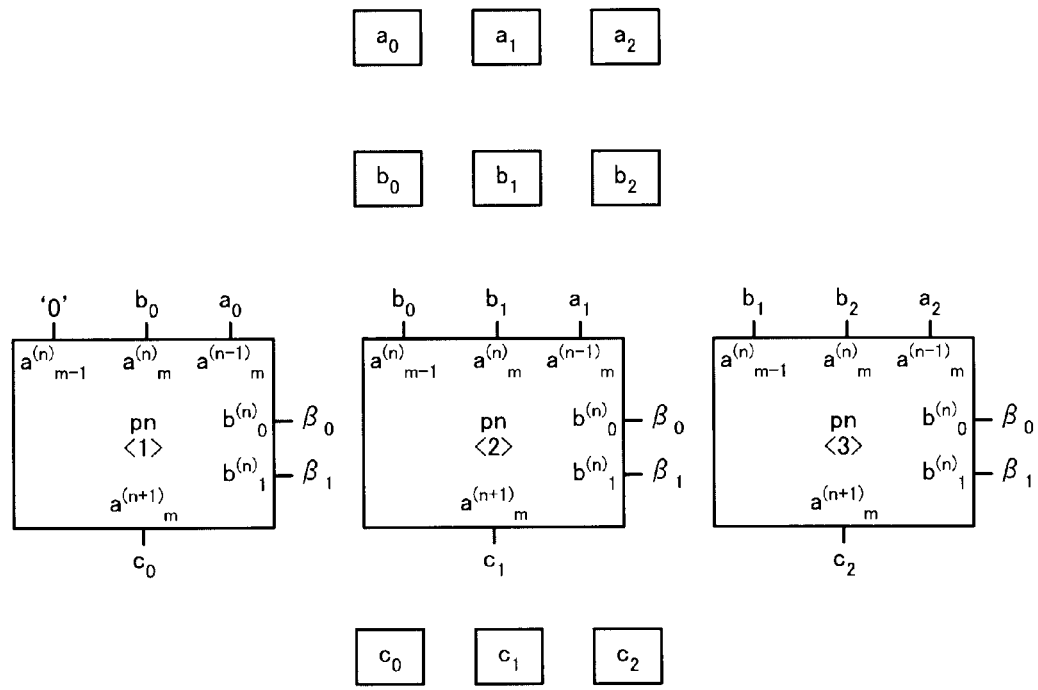
FIG. 63 is a block diagram of the "$p_{n+1}=k_n p_n+p_{n-1}$" circuit block in the memory controller according to the present embodiment.

FIG. 62 is a diagram showing a circuit symbol of the "$p_{n+1} = k_n p_n + p_{n-1}$" circuit block. FIG. 63 is a block diagram of the "$p_{n+1} = k_n p_n + p_{n-1}$" circuit block.

The "$p_{n+1} = k_n p_n + p_{n-1}$" circuit block receives the coefficients $\beta_0$, $\beta_1$ of $k_n$, the coefficients $a_0$-$a_2$ of $p_{n-1}$, and the coefficients $b_0$-$b_2$ of $p_n$, and provides the coefficients $c_0$-$c_2$ of $p_{n+1}$ as shown in FIG. 62.

As computations are started with substitutions of $p_{-1} = 0$, $p_0 = 1$, and for the purpose of utilizing $p_{n+1}$ mod $x^3$, the maximum degree of $p_{n+1}$ is 2. Therefore, the "$p_{n+1} = k_n p_n + p_{n-1}$" circuit block includes 3 "kn" circuit blocks <1>-<3>.

The "pn" circuit block <1> receives '0', $b_0$, $a_0$, $\beta_0$ and $\beta_1$ as $a^{(n)}_{m-1}$, $a^{(n)}_m$, $a^{(n-1)}_m$, $b^{(n)}0$ and $b^{(n)}1$, and provides $c_0$ as $a^{(n+1)}_m$, respectively.

The "pn" circuit block <2> receives $b_0$, $b_1$, $a_1$, $\beta_0$ and $\beta_1$ as $a^{(n)}_{m-1}$, $a^{(n)}_m$, $a^{(n-1)}_m$, $b^{(n)}_0$ and $b^{(n)}_1$, and provides $c_1$ as $a^{(n+1)}_m$, respectively.

The "pn" circuit block <3> receives $b_1$, $b_2$, $a_2$, $\beta_0$ and $\beta_1$ as $a^{(n)}_{m-1}$, $a^{(n)}_m$, $a^{(n-1)}_m$, $b^{(n)}_0$ and $b^{(n)}_1$, and provides $c_2$ as $a^{(n+1)}_m$, respectively.

The outputs from the "pn" circuit blocks <1>-<3> are provided as $c_0$-$c_2$, that is, the output from the "$p_{n+1} = k_n p_n + p_{n-1}$" circuit block.

Subsequently, computing circuits are described for deriving $f_n$ and $p_{n-1}$ through iterative computations from 0 to n.

Figure 64:
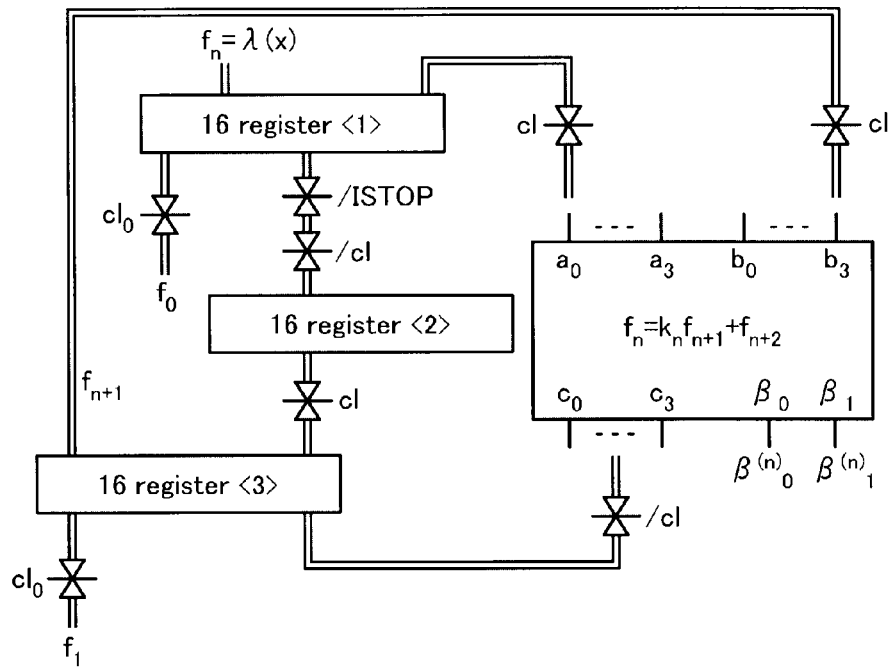
FIG. 64 is a block diagram of a circuit for use in the Euclidean iterative method in the memory controller according to the present embodiment.
Figure 65:
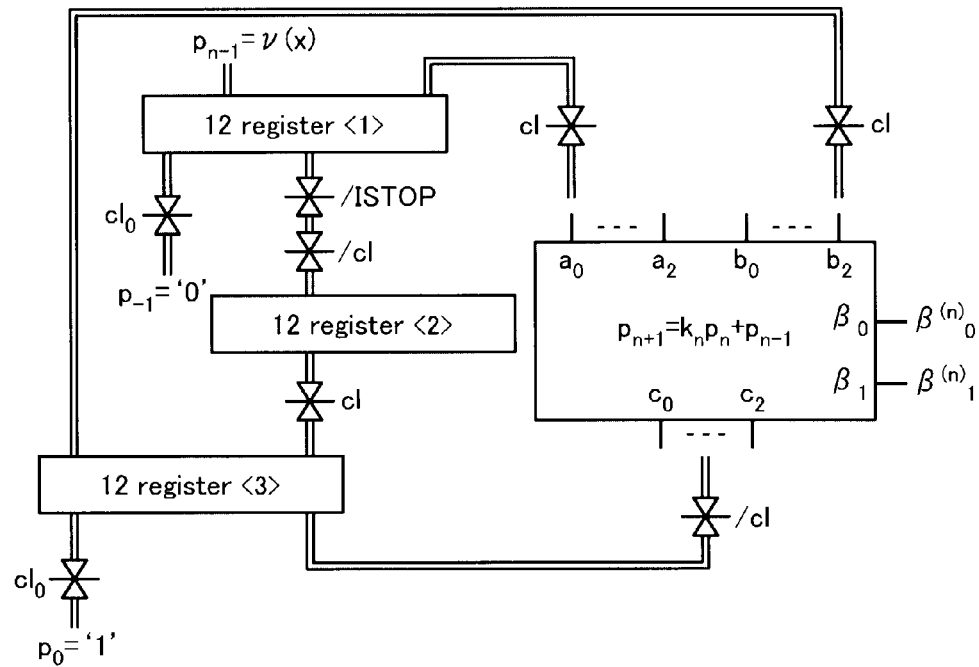
FIG. 65 is a block diagram of a circuit for use in the Euclidean iterative method in the memory controller according to the present embodiment.

FIG. 64 shows a computing circuit operative to derive $f_n$, and FIG. 65 shows a computing circuit operative to derive $p_{n-1}$.

The computing circuit operative to derive $f_n$ includes 3 "16 register" units <1>-<3>, as shown in FIG. 64, in addition to the "$f_n = k_n f_{n+1} + f_{n+2}$" circuit block. The "16 register" units <1>-<3> include 4 sets of 4-bit latches each. The "16 register" units <1>-<3> are set at '0' if there is no corresponding input. The computation of $f_n$ is advanced at the "$f_n = k_n f_{n+1} + f_{n+2}$" circuit block and 3 "16 register" units <1>-<3> provided in the periphery thereof, which circularly transfer data.

The computing circuit operative to derive $p_{n+1}$ includes "12 register" units <1>-<3>, as shown in FIG. 65, in addition to the "$p_{n+1} = k_n p_n + p_{n-1}$" circuit block. The "12 register" units <1>-<3> include 3 sets of 4-bit latches each. The "12 register" units <1>-<3> are set at '0' if there is no corresponding input. The computation of $p_{n+1}$ is advanced at the "$p_{n+1} = k_n p_n + p_{n-1}$" circuit block and 3 "12 register" units <1>-<3> provided in the periphery thereof, which circularly transfer data.

The computations of $f_n$ and $p_{n-1}$ advance at every cycle of the clock cl and the number of cycles of the clock cl counted from 0 corresponds to n of the Euclidean iteration. Finally, the "16 register" unit <1> holds $f_n$, and the "12 register" unit <1> holds $p_{n-1}$.

In the first clock cycle $cl_0$, the "16 register" units <1>-<3> and the "12 register" units <1>-<3> are set to have such initial values as shown in FIGS. 64 and 65, respectively.

Namely, in the computing circuit operative to derive $f_n$, the coefficient of $f_0 = x^3$ is set in the "16 register" unit <1>, and the coefficient of $f_1 = \Psi(x)$ in the "16 register" unit <3>. In the computing circuit operative to derive $p_{n-1}$, $p_{-1} = $ '0' is set in the "12 register" unit <1>, and $p_0 =$ '1' in the "12 register" unit <3>. Thereafter, as the clock cycle advances, $f_n$ and $p_{n-1}$ are set in the corresponding register units at the start of the $cl_n$ cycle.

The "16 register" unit <1> and the "12 register" unit <1> are prevented from receiving the inputs by a signal /ISTOP. Accordingly, data in the "16 register" unit <1> and the "12 register" unit <1> can be determined at that moment. The signal /ISTOP is a signal that is activated if the later-described stop condition on the Euclidean iterative method is satisfied.

Thus, the "16 register" unit <1> and the "12 register" unit <1> can obtain the coefficients of the polynomials as desired.

These coefficients can be fed to the first Hasse differential polynomial generator unit 225 and the second Hasse differential polynomial generator unit 226 to seek the root and the multiplicity of the Hasse differential polynomial.

For the purpose of seeking the signal /ISTOP shown in FIGS. 64 and 65, that is, the stop condition on the Euclidean iterative method, it is required to determine the degree of the polynomial resulted from the computation. Therefore, the following description is given to a circuit operative to represent the degree in binary based on the coefficients, $a_j$ (j=0-3), of $f_n$ or $p_{n-1}$ obtained. Hereinafter, this circuit is referred to as a "DEG" circuit block.

Figure 66:
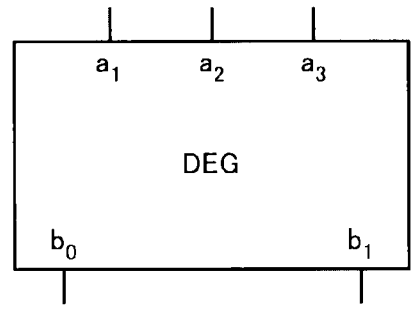
FIG. 66 is a diagram showing a circuit symbol of a circuit for use in a Euclidean iterative method ("DEG" circuit block) in the memory controller according to the present embodiment.
Figure 67:
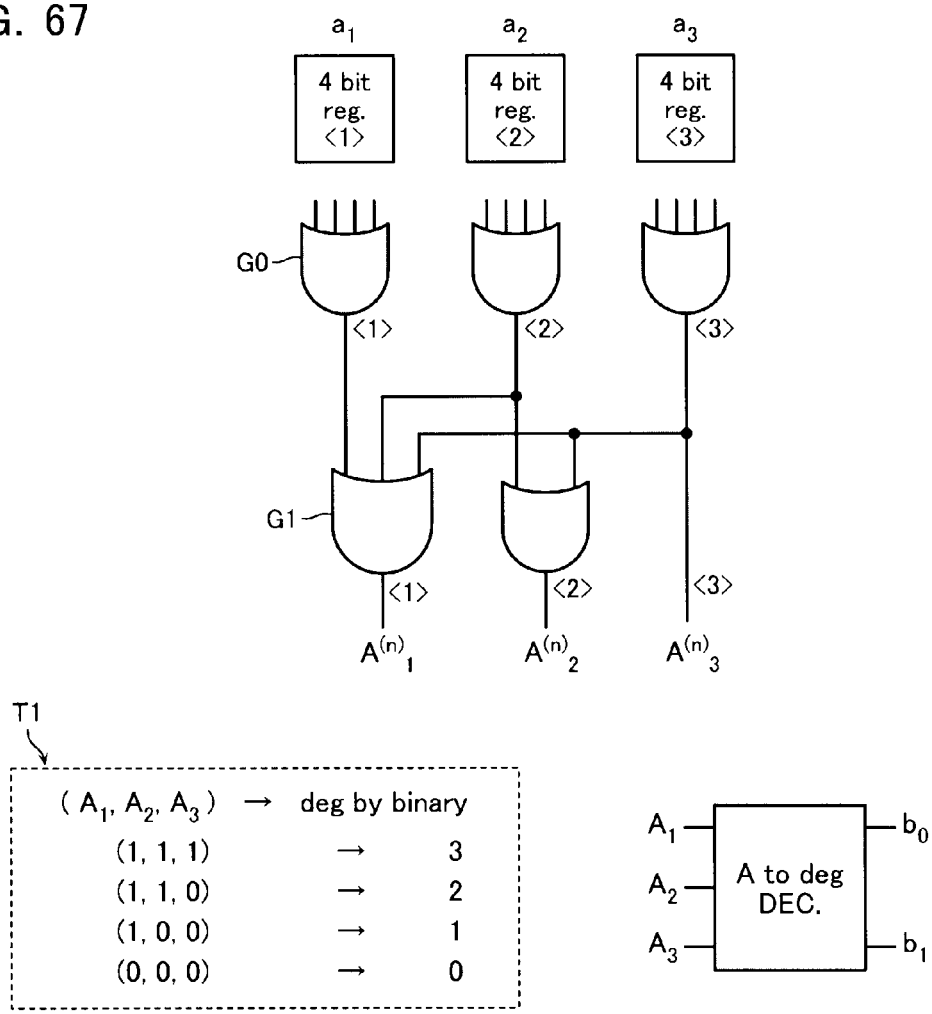
FIG. 67 is a block diagram of the "DEG" circuit block in the memory controller according to the present embodiment.

FIG. 66 is a diagram showing a circuit symbol of the "DEG" circuit block. FIG. 67 is a block diagram of the "DEG" circuit block.

The "DEG" circuit block receives $a_1$-$a_3$, and provides $b_0$, $b_1$, that is, a binary representation of the degree as shown in FIG. 66.

The "DEG" circuit block includes 4-bit registers <1>-<3>, OR gates G0<1>-<3>, G1<1>-<3>, and an "A to deg DEC." circuit block as shown in FIG. 67.

The 4-bit registers <1>-<3> each hold 3-bit binary data indicative of the coefficients, $a_1$-$a_3$, of the 3rd degree polynomial. The 4-bit binary data indicative of the coefficients $a_1$-$a_3$ are fed to the OR gates G0<1>-<3>, respectively.

The OR gate G0<n> (n=1-3) receives 3-bit binary data indicative of $a_n$. The OR gate G0<1> provides '0' if $a_n = 0$ and '1' if $a_n \neq 0$. In a word, the OR gate G0<n> determines whether $a_n$ is equal to 0 or other than 0.

The OR gate G1<m> (m=1, 2) receives the outputs from the OR gates G0<m>-<3>. The outputs from the OR gates G1<1>,<2> turn to $A_1$, $A_2$, respectively. In addition, the output from the OR gate G0<3> directly turns to $A_3$. These $A_1$-$A_3$ are fed to the "A to deg DEC." circuit block.

The "A to deg DEC." circuit block is a decoder circuit capable of realizing the associated relations between $A_1$-$A_3$ and binary representations of the degrees as shown with T1 in FIG. 67. The total sum of '1's in A (j=1-3) corresponds to a binary representation of the degree.

The "A to deg DEC." derives $b_0$, $b_1$, that is, the output from the "DEC" circuit block, from $A_1$-$A_3$ based on the association table shown with T1 in FIG. 67. A degree of 3 can be represented by 2 bits.

The final description is given to a circuit operative to decide if the key condition on the Lee metric code is satisfied to stop the iterations, and if the error correctable condition is satisfied, based on $f_n$ and $p_{n-1}$ obtained through the Euclidean iterative method.

Figure 68:
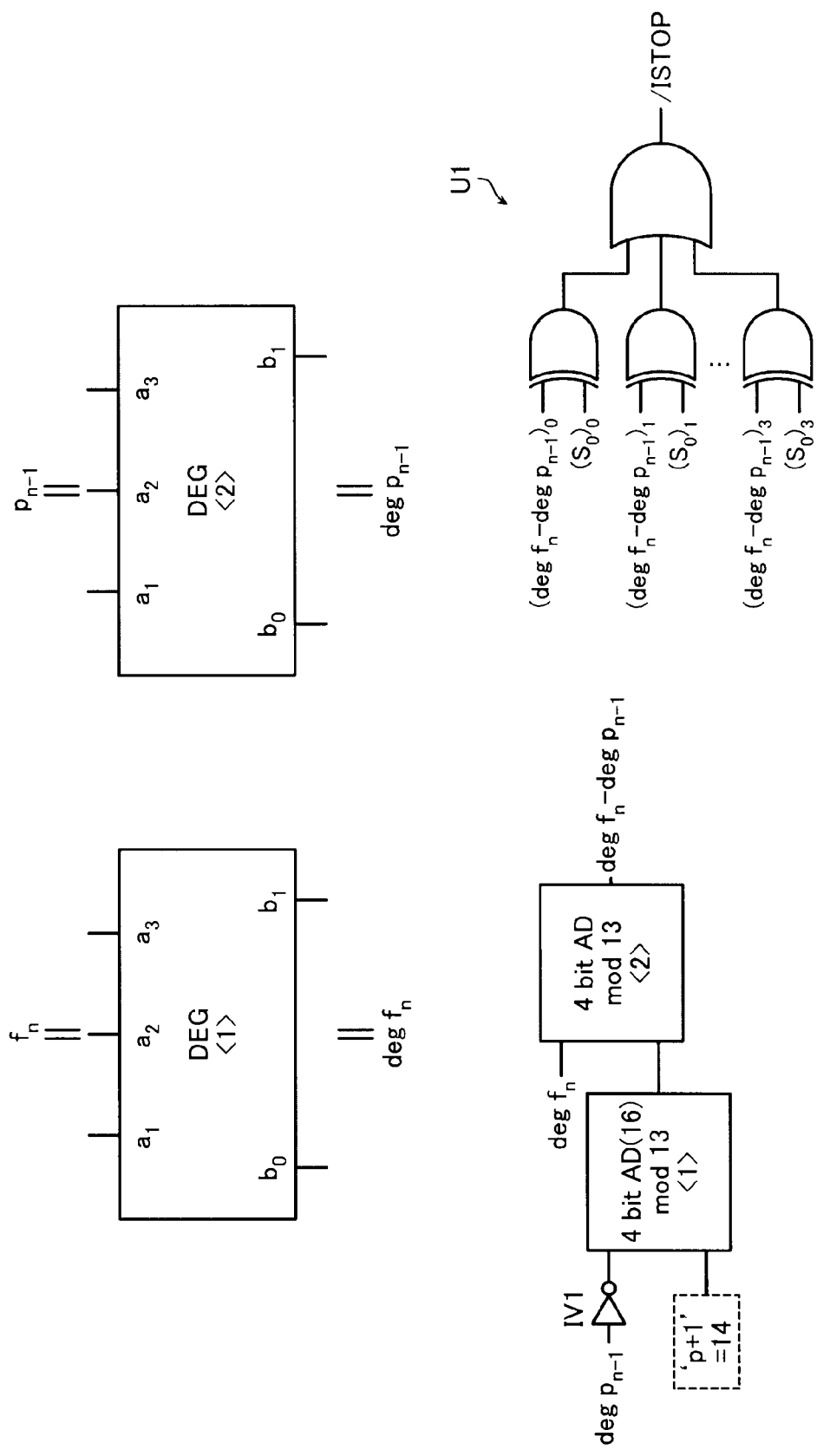
FIG. 68 is a block diagram of a circuit for deciding the stop condition on the Euclidean iterative method in the memory controller according to the present embodiment.

FIG. 68 is a block diagram of a circuit operative to decide the stop condition on the Euclidean iterative method, that is, to create the signal /ISTOP.

This circuit includes 2 "DEG" circuit blocks <1>, <2>, a "4 bit AD(16) mod 13" circuit block <1>, a "4 bit AD mod 13" circuit block <2>, and a part circuit U1 composed of plural logic gates.

The "DEG" circuit block <1> receives $f_n$ as $a_1$-$a_3$, and provides deg $f_n$, that is, a binary representation of $f_n$, as $b_0$, $b_1$. This deg $f_n$ is fed to the "4 bit AD mod 13" circuit block <2>.

The "DEG" circuit block <2> receives $p_{n-1}$ as $a_1$-$a_3$, and provides deg $p_{n-1}$, that is, a binary representation of $p_{n-1}$, as $b_0$, $b_1$. This deg is fed to the "4 bit AD(16) mod 13" circuit block <1> via the inverter IV1.

The "4 bit AD(16) mod 13" circuit block <1> derives a complement of deg $p_{n-1}$ from the input, deg $p_{n-1}$, fed via the inverter IV1 and '1'. The complement of deg $p_{n-1}$ is fed to the "4 bit AD mod 13" circuit block <2>.

The stop condition on the Euclidean iterative method is deg $f_n$-deg $p_{n-1} \equiv S_0$ (mod 13). Therefore, the "4 bit AD mod 13" circuit block <2> receives deg $f_n$ and a complement of deg $p_{n-1}$ to obtain deg $f_n$-deg $p_{n-1}$ as a numeral in Zp. This result is fed to the part circuit U1 for comparison with $S_0$ at every bit of the binary representation.

For the purpose of comparing deg $f_n$-deg $p_{n-1}$ with $S_0$ at every bit, the part circuit U1 computes the exclusive logical sum at every bit. If all bits (deg $f_n$-deg $p_{n-1}$)$_j$ (j=0-3) match $(S_0)_j$, the part circuit U1 provides '0' as the signal /ISTOP. In a word, the signal /ISTOP is (deg $f_n$-deg $p_{n-1}$)$_0$(+) $(S_0)_0 \square \ldots \square$ (deg $f_n$-deg $p_{n-1}$)$_m$(+)$(S_0)_m \square \ldots \square$ (deg $f_n$-deg $p_{n-1}$)$_{h-1}$(+)$(S_0)_{h-1}$. Thus, the part circuit U1 can realize if deg $f_n$-deg $p_{n-1}$ matches $S_0$ or not.

Figure 69:
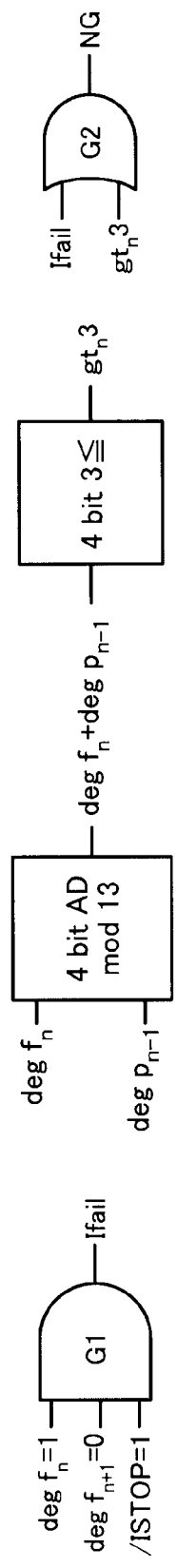
FIG. 69 is a block diagram of a circuit for deciding the success condition on the Euclidean iterative method in the memory controller according to the present embodiment.

FIG. 69 is a block diagram of a circuit for deciding the success condition on the Euclidean iterative method.

This circuit includes a NAND gate G1, a "4 bit AD mod 13" circuit block, a "4 bit 3≤" circuit block later-described, and an NOR gate G2.

The NAND gate G1 is arranged to provide for the case where the Euclidean iterative method fails to satisfy the stop condition to stop. On the condition that the degree of $f_n$ is 1, the degree of $f_{n+1}$ is 0, and the signal /ISTOP is 1, that is, (deg $f_n$=1) $\square$ (deg $f_{n+1}$=0) $\square$ (/ISTOPn=1), the NAND gate G1 provides '1' as a signal Ifail.

It is determined based on deg $f_n$+deg $p_{n-1}$<3 if the error is correctable when the Euclidean iterative method stops.

Therefore, the "4 bit AD mod 13" circuit block is given deg $f_n$ and deg $p_{n-1}$ to derive the sum thereof, deg $f_n$+deg $p_{n-1}$. This sum, deg $f_n$+deg $p_{n-1}$, is fed to the "4 bit 3≤" circuit block.

The "4 bit 3≤" circuit block is a circuit operative to determine if the input is equal to or higher than 3 or not. The "4 bit 3≤" circuit block provides '1' as a signal $gt_n3$ if the input, deg $f_n$+deg $p_{n-1}$, supplied from the "4 bit AD mod 13" circuit block is equal to or higher than 3.

The details of the "4 bit 3≤" circuit block are omitted from the following description though they can be configured similar to the PF0 generator unit U1 in the "4 bit AD mod 13" circuit block shown in FIG. 43.

The OR gate G2 receives the output, Ifail, from the NAND gate G1 and the output, $gt_n3$, from the "4 bit 3≤" circuit block and, if Ifail □ gt$_n$3, it provides NG signal indicative of the impossibility of error correction through the Euclidean iterative method.

Thus, the circuit blocks shown in FIGS. 54-69 can realize the Euclidean iterative method.

These circuit blocks utilize the inverse elements of the elements in Zp.

Figures 70, 71:
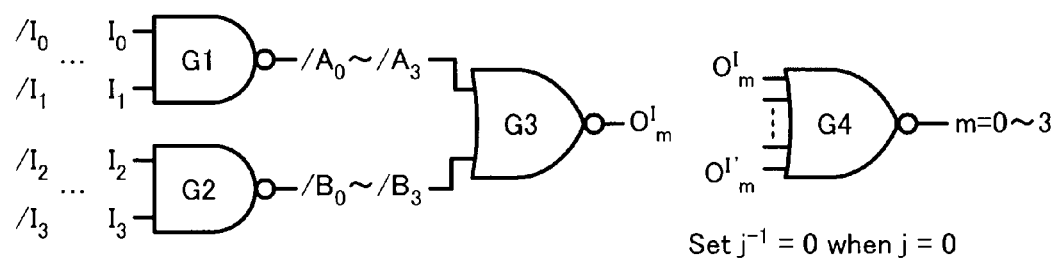
FIG. 70 is a table showing the associated relations between the elements in Zp and the corresponding inverse elements in the memory controller according to the present embodiment.
FIG. 71 is a circuit diagram of a decoder for deriving the correspondence among the elements in Zp in the memory controller according to the present embodiment.

FIG. 70 is a table showing the elements in Zp and the correspondence to these elements in the case of p=13. The 4-bit binary representations of the numerals shown in this table can be used to create a decoder. The inverse element of 0 is set 0 for convenience of circuit operation.

An example is described next on the configuration of a specific decoder.

In particular, a decoder capable of creating the inverse element of an element in Zp is highly required. Accordingly, herein described is a decoder operative to derive the inverse element $j^{-1}$ of an element j in Zp.

Hereinafter, this decoder is referred to as a "$j^{-1}$ dec" circuit block.

The inverse element $j^{-1}$ can be derived from the element j by seeking a relation of $j \times j^{-1} \equiv 1 \pmod{13}$, then configuring j and $j^{-1}$ in 4-bit binary representations as shown in Expression 38, thereby forming a conversion decoder.

Input:$I_i=(j)_i$ $j=(j)_0+(j)_1 2+(j)_2 2^2+(j)_3 2^3$

Output:$O_i=(j^{-1})_i$ $jj^{-1} \equiv 1 \pmod{p}$ $j^{-1}=(j^{-1})_0+(j^{-1})_1 2+(j^{-1})_2 2^2+(j^{-1})_3 2^3$ [Expression 38]

FIG. 71 is a block diagram of the "$j^{-1}$ dec" circuit block.

The "$j^{-1}$ dec" circuit block can be configured by a general circuit operative to decode 4-bit binary data I to other 4-bit binary data O, setting I=j, O=$j^{-1}$ as shown in Expression 38 in this case.

The "$j^{-1}$ dec" circuit block includes 2 NAND gates G1, G2, and 2 NOR gates G3, G4.

First, the NAND gates G1 and G2 are used to pre-decode 4 bits $I_0$-$I_3$ of the input to create signals /$A_0$-/$A_3$, /$B_0$-/$B_3$. Subsequently, the NOR gate G3 is used to create $O'_m$, that is, the input Zp represented by 'H' based on a combination of 'L' in /$A_m$,/$B_m$ (m=0-3). Finally, the NOR gate G4 is used to collect the inverse elements exhibiting 1 on the m bit from $O'_m$ and execute the logical sum at every m. Thus, it is possible to obtain the inverse element of the input. If the input is j=0, then $j^{-1}$=0 is set.

<Hasse Differential Polynomial Generator Unit>

The following description is given to the Hasse differential polynomial generator units 225 and 226.

The degree of the error searching polynomial obtained through the Euclidean iterative method is the 2nd degree at the maximum. Therefore, the coefficients of a Hasse differential polynomial for obtaining a root of the error searching polynomial and the multiplicity of the root can be derived through a simple operation.

The relation between the representation and the coefficient of a Hasse differential polynomial of φ(x) is as in Expression 39.

$$[\phi(x)]^{[i]} = \sum_{j=0}^{2-i} \binom{j+1}{i} \phi_{j+1} x^j = \sum_{j=0}^{2-i} \phi^{[i]}{}_j x^j \quad \text{[Expression 39]}$$

$[\phi(x)]^{[0]} = \phi(x) = 1 + 2\phi_2 x^2$ $[\phi(x)]^{[1]} = \phi_1 + 2\phi_2 x$ $[\phi(x)]^{[2]} = \phi_2$ When the relational equations shown in Expression 39 are applied to the error searching polynomials λ(x), ν(x) obtained through the Euclidean iterative method, as φ(x)=λ(x), φ(x)=ν(x), they can be represented as in Expression 40 and Expression 41.

$[\lambda(x)]^{[0]}=\lambda(x)=1+\lambda_1 x+\lambda_2 x^2 \Rightarrow \phi^{[0]}{}_0=1 \phi^{[0]}{}_1=\lambda_1 \phi^{[0]}{}_2=\lambda_2$ $[\lambda(x)]^{[1]}=\lambda_1+\lambda_2 x \Rightarrow \phi^{[1]}{}_0=\lambda_1 \phi^{[1]}{}_1=2\lambda_2$ $[\lambda(x)]^{[2]}=\lambda_2 \Rightarrow \phi^{[2]}{}_0=\lambda_2$ [Expression 40]

$[\nu(x)]^{[0]}=\nu(x)=1+\nu_1 x+\nu_2 x^2 \Rightarrow \phi^{[0]}{}_0=1 \phi^{[0]}{}_1=\nu_1 \phi^{[0]}{}_2=\nu_2$ $[\nu(x)]^{[1]}=\nu_1+\nu_2 x \Rightarrow \phi^{[1]}{}_0=\nu_1 \phi^{[1]}{}_1=2\nu_2$ $[\nu(x)]^{[2]}=\nu_2 \Rightarrow \phi^{[2]}{}_0=\nu_2$ [Expression 41]

As can be found from Expression 40 and Expression 41, the coefficients of the Hasse differential polynomial can be obtained by the permutation of the coefficients obtained through the Euclidean iterative method and the multiplication by 2. These coefficients are stored in the registers.

The following description is given to an operating circuit operative to compute a root and the associated multiplicity of the solution searching polynomial φ(x). Here, φ(x) turns to the error searching polynomial λ(x) or ν(x). Hereinafter, this operating circuit is referred to as a "solution searching polynomial root/multiplicity operating circuit".

The solution searching polynomial root/multiplicity operating circuit regards the 0-th order differential of the Hasse differential polynomial as φ(x). Unless the Hasse differential polynomial is zero for each element in Zp, the circuit shifts the computation to the next element and increases the number of differential orders while the Hasse differential polynomial keeps zero. When registers are used to hold the number of the first Hasse differential orders while the Hasse differential polynomial is not zero, for each element in Zp, the element when the number of orders is not zero indicates the root, and the number of the remaining orders indicates the multiplicity of the root. In a word, when one with non-'0' content is selected from the registers, the value held therein indicates the multiplicity of the root.

Specifically, when the root of the solution searching polynomial φ(x) is denoted with α, and a Hasse differential polynomial of φ(x) at the i-th order with $[\phi(x)]^{[i]}$, a relational equation is given as in Expression 42 where the multiplicity of α is denoted with n.

$$[\phi(\alpha)]^{[0]} = \phi(\alpha) = 1 + \sum_{j=1}^{2} \phi_j \alpha^j = 0 \quad \text{[Expression 42]}$$

$$[\phi(\alpha)]^{[n-1]} = \sum_{j=0}^{3-n} \phi^{[n-1]}{}_j \alpha^j = 0,$$

-continued $$[\phi(\alpha)]^{[n]} = \sum_{j=0}^{2-n} \phi^{[n]}{}_j \alpha^j \neq 0$$

The solution searching polynomial root/multiplicity operating circuit seeks n that satisfies Expression 42 for each element α in Zp regardless of whether it is the root of φ(x) or not. In the case of n=0, it means that α is not a root.

Figure 72A:
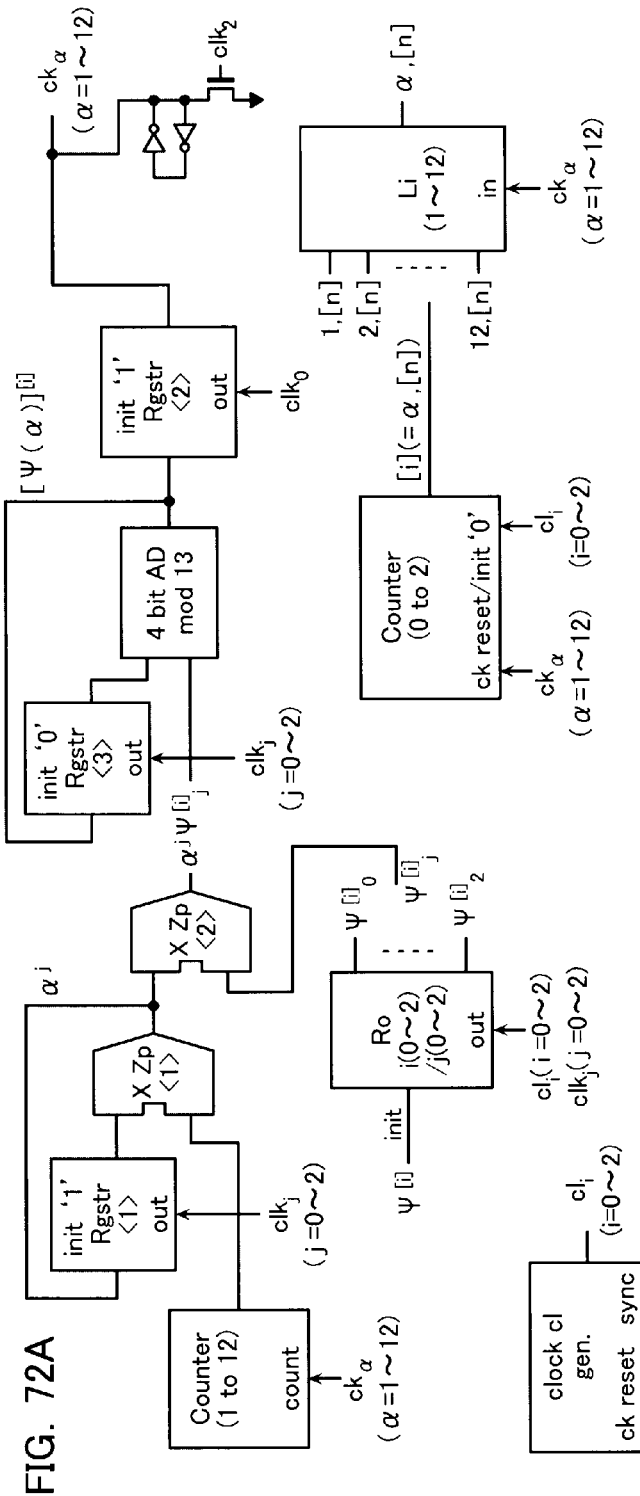
FIG. 72A is a block diagram of a circuit for deriving a polynomial solution and the associated multiplicity in the memory controller according to the present embodiment.
Figure 72B:
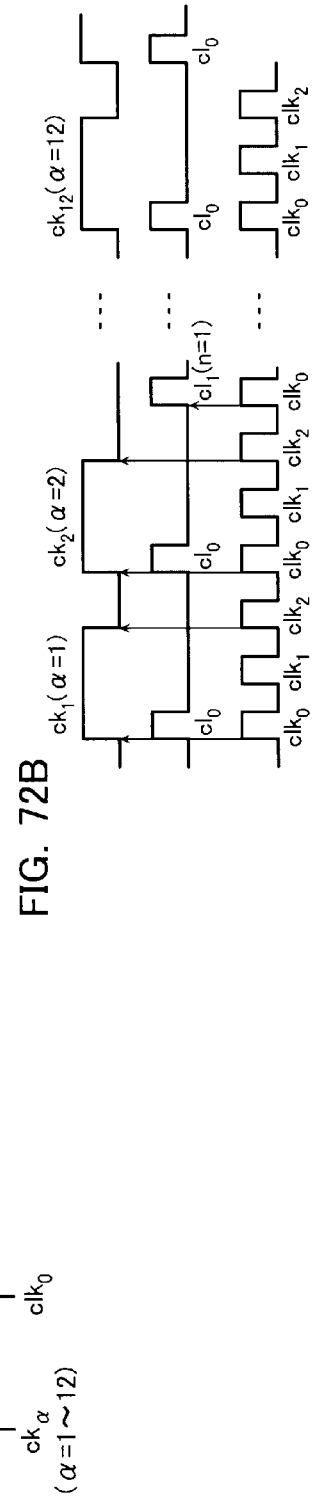
FIG. 72B is a diagram showing clocks for use in control of the circuit for deriving a polynomial solution and the associated multiplicity in the memory controller according to the present embodiment.

FIG. 72A is a block diagram of the solution searching polynomial root/multiplicity operating circuit, and FIG. 72B is a timing chart of the clocks ck, cl and clk for use in control of the solution searching polynomial root/multiplicity operating circuit.

The solution searching polynomial root/multiplicity operating circuit scans the elements 1-12 in Zp at the clock ck, increases the number of the Hasse differential orders at the clock cl, and seeks the value of the Hasse differential polynomial in that number of orders at the clock clk. The clock ck is generated when the computed value of the Hasse differential polynomial becomes non-zero so that the process enters the cycle for the next element in Zp.

The solution searching polynomial root/multiplicity operating circuit includes, as shown in FIG. 72A, a "Counter (1 to 12)" circuit block, an "X Zp" circuit block <1>, a "Rgstr" register <1>, a "Ro i(0-2)/j(0-2)" register unit, an "X Zp" circuit block <2>, a "Rgstr" register <2>, a "4 bit AD mod 13" circuit block, a "Rgstr" register <3>, a "clock cl gen." circuit block, a "Counter (0 to 2)" circuit block, and a "Li (1-12)" register unit.

The "Counter (1 to 12)" circuit block is operative on receipt of the clock ck α times to generate an element α in Zp and count up from 1 to 12. The "Counter (1 to 12)" circuit block returns to the initial value of 1 always after it counts up to 12 in cyclic count.

The "Rgstr" register has an initial value of 1 and uses the output from the "X Zp" circuit block <1> to update the holding value on receipt of the clock $clk_j$ (j=0-2).

The "X Zp" circuit block <1> multiplies the output a from the "Counter (1 to 12)" circuit block by the value held in the "Rgstr" register <1> to yield $\alpha^j$.

The "Ro i(0-2)/j(0-2)" register unit is a register operative to provide a coefficient $\phi^{[i]}{}_j$ of the Hasse differential polynomial on receipt of the clocks $cl_i$ and $clk_j$.

The "X Zp" circuit block <2> multiplies the output $\alpha^j$ from the "X Zp" circuit block <1> by the output $\phi^{[i]}{}_j$ from the "Ro i(0-2)/j(0-2)" register unit to yield $\alpha^j \phi^{[i]}{}_j$.

Thus, when the clock clk is applied 3 times to the circuit comprising the "Counter (1 to 12)" circuit block, the "Rgstr" register <1>, the "X Zp" circuit block <1>, the "Ro i(0-2)/j (0-2)" register unit, and the "X Zp" circuit block <2>, the value of the Hasse differential polynomial can be obtained. For the purpose of simplifying the control of the clocks ck, cl and clk, the sum of the terms of the value 0 not present in this computation is computed as well. Therefore, the total sum of the clocks clk originally required is almost halved.

The value $[\phi(x)]^{[i]}$ of the differential polynomial is taken in the "Rgstr" register <1> as '0' in the case of zero and '1' in other cases.

The value held in the "Rgstr" register <1> is output at the timing of the clock $clk_0$ as the clock $ck_\alpha$ (α=1-12). The clock $ck_\alpha$ is kept until it is reset by the clock $clk_2$.

The "Rgstr" register <1> has an initial value of '1' and accordingly the clock $ck_1$ rises at the first $clk_0$. The clock $ck_2$ and so on rise at $clk_0$ in any one cycle of clk in accordance with the computation result.

The "clock cl gen." circuit block generates the clock $cl_i$ in sync with the clock $clk_0$ and resets it to the clock $cl_0$ at every rise of the clock $ck_\alpha$.

The "Counter (0 to 2)" circuit block is reset to 0 by the clock $ck_\alpha$, and counts up at every input of the clock cl and outputs the order of the clock cl minus 1. This output is stored in the "Li (1-12)" register unit.

The "Li (1-12)" register unit has the inputs switchable by the clock $ck_\alpha$, and thus the α-th register can store the associated multiplicity.

After the "Counter (1 to 12)" circuit block completes one flow of counting up, the "Li (1-12)" register unit stores the multiplicities associated with α of the solution searching polynomial φ(x) and, if these are finite, the root a and the corresponding multiplicity can be found.

<Decoder Unit>

The decoder unit 228 is described below.

After error searching is finished and a Lee metric code C corrected with the error code E is obtained, it is required to restore it to the data code A in Zp. This operation corresponds to an inverse operation of C=AG with the generator matrix G though an inversion of a matrix requires a large-scale operation. Therefore, the elements of A are sequentially derived from the elements of C. The computation process is shown in Expression 43.

$$c_j = \sum_{i=0}^{8}(j)^{i+1}a_i \left\{ \sum_{j=1}^{12}(j)^{-1}c_j = \sum_{j=1}^{12}(j)^{-1}\sum_{i=0}^{8}(j)^{i+1}a_i = \right. \quad \text{[Expression 43]}$$

$$\left. \sum_{i=0}^{8}\sum_{j=1}^{12}(j)^i a_i = \sum_{j=1}^{12}(j)^0 a_0 = 12a_0 \right\}$$

$$\therefore a_0 = 12^{-1}\sum_{j=1}^{12}(j)^{-1}c_j$$

$$c_j^{(0)} = c_j - ja_0 =$$

$$\sum_{i=0}^{8}(j)^{i+1}a_i \left\{ \sum_{j=1}^{12}(j^2)^{-1}c_j^{(0)} = \sum_{j=1}^{12}(j^2)^{-1}\sum_{i=1}^{8}(j)^{i+1}a_i = \right.$$

$$\left. \sum_{i=1}^{8}\sum_{j=1}^{12}(j)^i a_i = \sum_{j=1}^{12}(j)^0 a_1 = 12a_1 \right\}$$

$$\therefore a_1 = 12^{-1}\sum_{j=1}^{12}(j^2)^{-1}c_j^{(0)}$$

$$c_j^{(1)} = c_j^{(0)} - j^2 a_1 = \sum_{i=2}^{8}(j)^{i+1}a_i$$

$$\vdots$$

As shown in Expression 43, the relation $c_j = \Sigma(j)^{i+1}a_i$ is deformed in turn to sequentially derive $a_1$ from $a_0$, subsequently $a_2$ from $a_1$, . . . , then $a_m$. This is the principle of computation.

Both sides are multiplied by the inverse element of the power of j to yield the terms of j on all elements in Zp, which are then summed. At this time, the deformation is executed based on the fact that the sum of all elements in Zp becomes zero.

Expression 44 shows a relational equation of the components of C and the components of A.

$$c_j^{(-1)} = c_j \qquad \text{[Expression 44]}$$

$$c_j^{(m-1)} = c_j^{(m-2)} - (j)^m a_{m-1} = \sum_{i=m}^{8} (j)^{i+1} a_i$$

$$\therefore a_m = 12^{-1} \sum_{j=1}^{12} (j^{m+1})^{-1} c_j^{(m-1)}$$

The following description is given to a specific operating circuit realized using the relational equation shown in Expression 44.

When seeking $a_m$ after $a_{m-1}$ is obtained, the parallel use of clocks is executed by computing the sum on j at $a_m$ in order while seeking $c^{(m-1)}{}_j$.

Next, a circuit for converting the component of the Lee metric code C every time is described based on $c^{(m-1)}{}_j = c^{(m-2)}{}_j - (j)^m a_{m-1}$ shown in Expression 44. Hereinafter, this circuit is referred to as a "$c^{(m-1)}{}_j$" circuit block.

Figure 73:
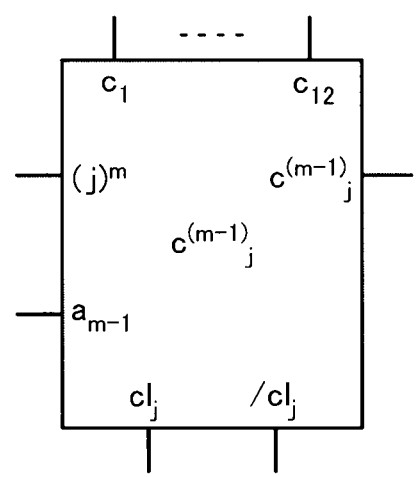
FIG. 73 is a diagram showing a circuit symbol of a unit ("$c^{(m-1)}j$" circuit block) contained in a computing circuit for deriving $A=CG^{-1}$ from $C=AG$ in the memory controller according to the present embodiment.
Figure 74:
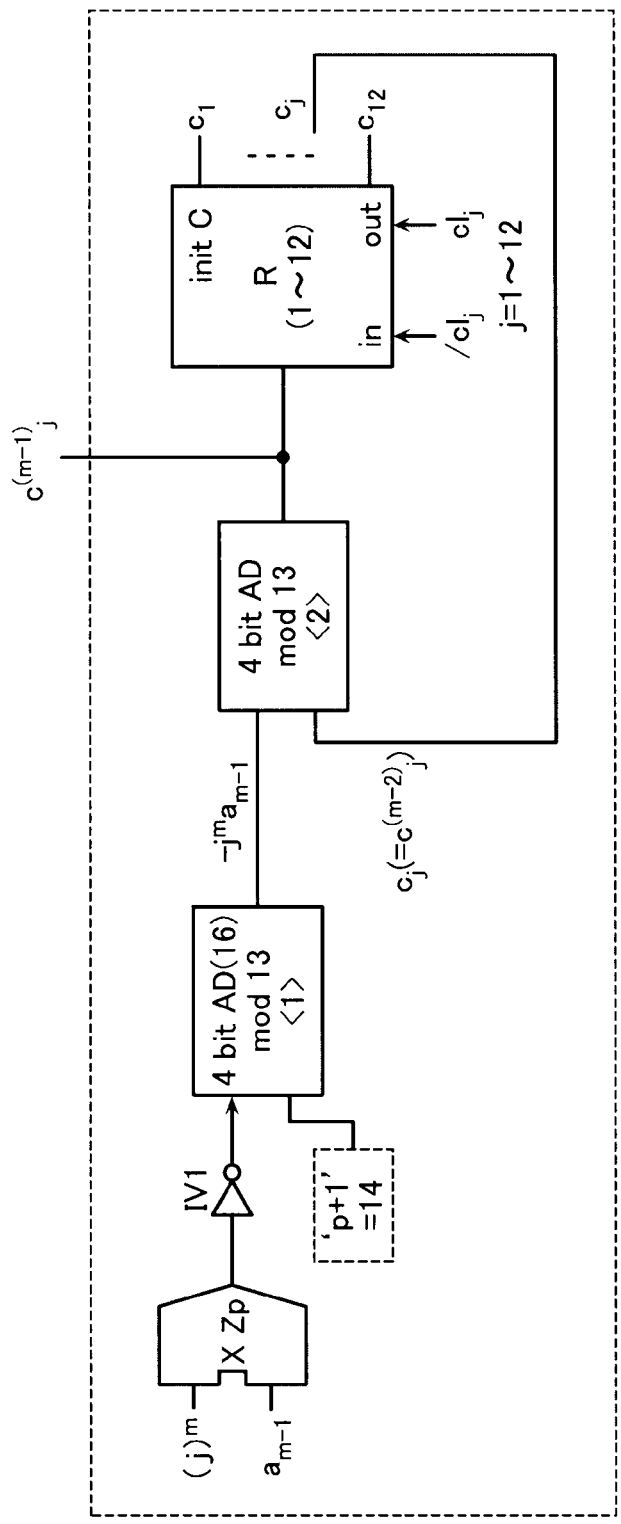
FIG. 74 is a block diagram of the "$c^{(m-1)}j$" circuit block in the memory controller according to the present embodiment.

FIG. 73 is a diagram showing a circuit symbol of the "$c^{(m-1)}{}_j$" circuit block, and FIG. 74 is a block diagram of the "$c^{(m-1)}{}_j$" circuit block.

The "$c^{(m-1)}{}_j$" circuit block is a circuit operable in sync with the clocks $cl_j$, $/cl_j$. It receives $(j)^m$, $a_{m-1}$ and the code components $c_1$-$c_{16}$, and provides $c^{(m-1)}{}_j$.

The "$c^{(m-1)}{}_j$" circuit block includes an "X Zp" circuit block, a "4 bit AD(16) mod 13" circuit block <1>, a "4 bit AD mod 13" circuit block <2>, and a "R (1-12)" register unit.

The "X Zp" circuit block yields the product of $(j)^m$ and $a_{m-1}$, and provides it to the "4 bit AD(16) mod 13" circuit block <1> via the inverter IV1.

The "4 bit AD(16) mod 13" circuit block <1> seeks a complement of $(j)^m a_{m-1}$, that is, the output fed via the inverter IV1 to yield $-j^m a_{m-1}$, and provides it to the "4 bit AD mod 13" circuit block <2>.

The "4 bit AD mod 13" circuit block <2> yields the sum of $-j^m a_{m-1}$ output from the "4 bit AD (16) mod 13" circuit block <1> and $c_j$ ($=c^{(m-2)}{}_j$) output from the "R (1-12)" register unit in sync with the clock cl. This sum turns to $c^{(m-1)}{}_j$, that is, the output from the "$c^{(m-1)}{}_j$" circuit block. The output $c^{(m-1)}{}_j$ from the "4 bit AD mod 13" circuit block <2> is recorded in the j-th register in the "R (1-12)" register unit in sync with the fall of the clock cl.

The subsequent description is given to a circuit for creating $a_m$ based on $a_m = 12^{-1} \Sigma (j^{m+1})^{-1} c^{(m-1)}{}_j$ (j=1-12) shown in Expression 44. Hereinafter, this circuit is referred to as an "$a_m$" circuit block.

Figure 75:
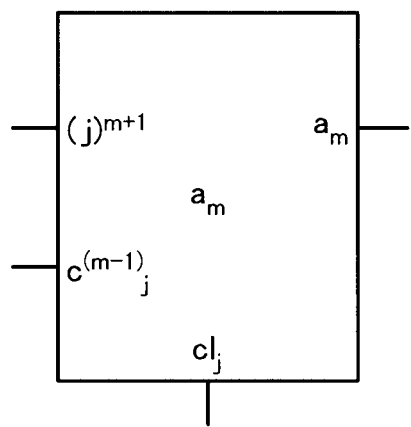
FIG. 75 is a diagram showing a circuit symbol of a unit ("$a_m$" circuit block) contained in the computing circuit for deriving $A=CG^{-1}$ from $C=AG$ in the memory controller according to the present embodiment.
Figure 76:
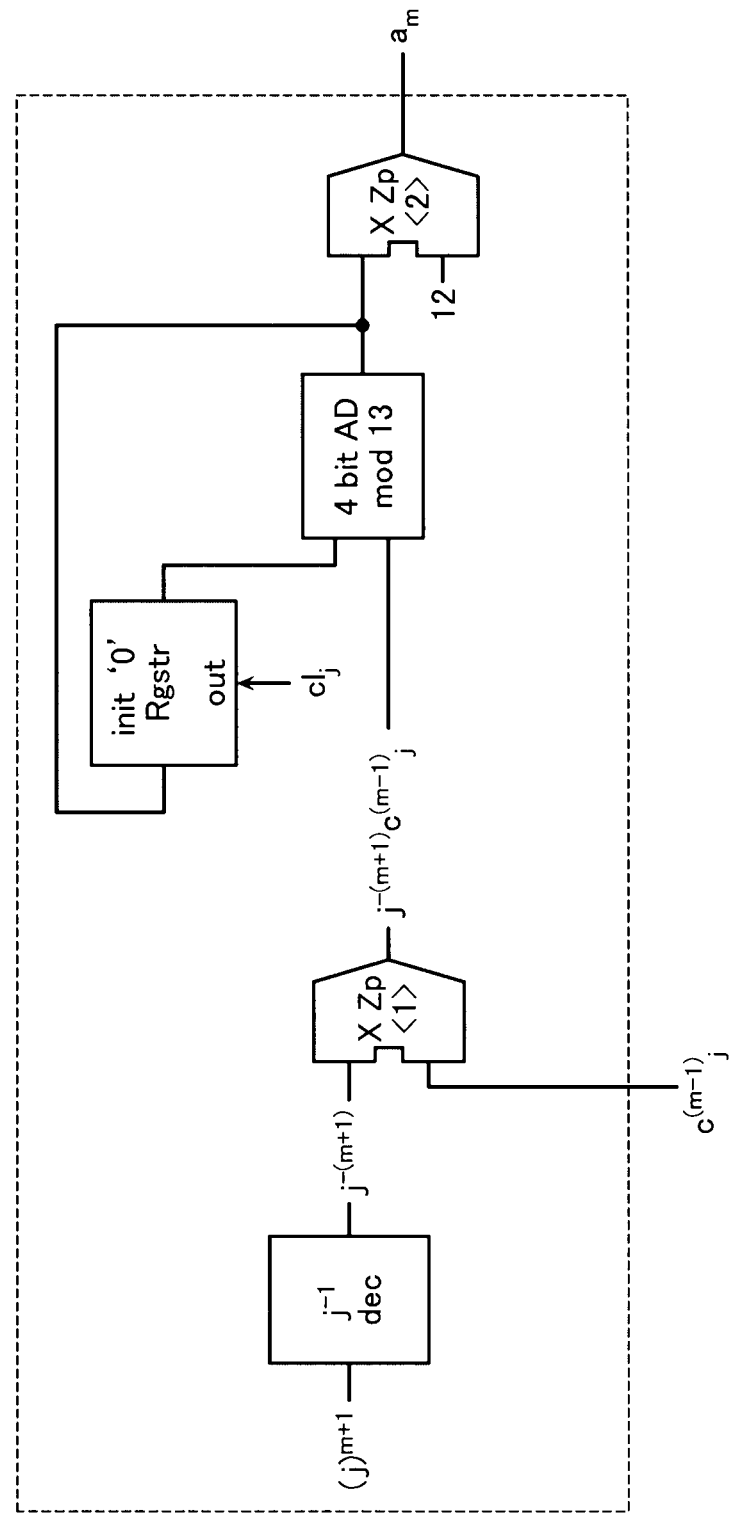
FIG. 76 is a block diagram of the "$a_m$" circuit block in the memory controller according to the present embodiment.

FIG. 75 is a diagram showing a circuit symbol of the "$a_m$" circuit block, and FIG. 76 is a block diagram of the "$a_m$" circuit block.

The "$a_m$" circuit block is operable in sync with the clock $cl_j$. It receives $(j)^{m+1}$ and $c^{(m-1)}{}_j$, and provides $a_m$.

The "$a_m$" circuit block includes a "$j^{-1}$ dec" circuit block, 2 "X Zp" circuit blocks <1>, <2>, a "4 bit AD mod 13" circuit block, and a "Rgstr" register.

The "$j^{-1}$ dec" circuit block converts $(j)^{m+1}$ to the inverse element thereof, $(j)^{-m+1}$, and provides it to the "X Zp" circuit block <1>.

The "X Zp" circuit block <1> computes the product of $(j)^{-(m+1)}$ fed from the "$j^{-1}$ dec" circuit block and $c_j$ ($=c^{(m-1)}{}_j$) output from the "$c^{(m-1)}{}_j$" circuit block, and provides the product to the "4 bit AD mod 13" circuit block.

The product output from the "4 bit AD mod 13" circuit block is summed through a loop including the "Rgstr" register having an initial value of '0' and the "4 bit AD mod 13" circuit block. The result is fed from the "4 bit AD mod 13" circuit block to the "X Zp" circuit block <2>.

The "X Zp" circuit block <2> computes the product of the sum output from the "4 bit AD mod 13" circuit block and $12^{-1} = 12$ to yield $a_m$, that is, the output from the "$a_m$" circuit block.

Next, a computing circuit is described, which includes the before-described "$c^{(m-1)}{}_j$" circuit block and "$a_m$" circuit block to obtain the data code A. Hereinafter, this computing circuit is referred to as an "inverse converting circuit".

Figure 77A:
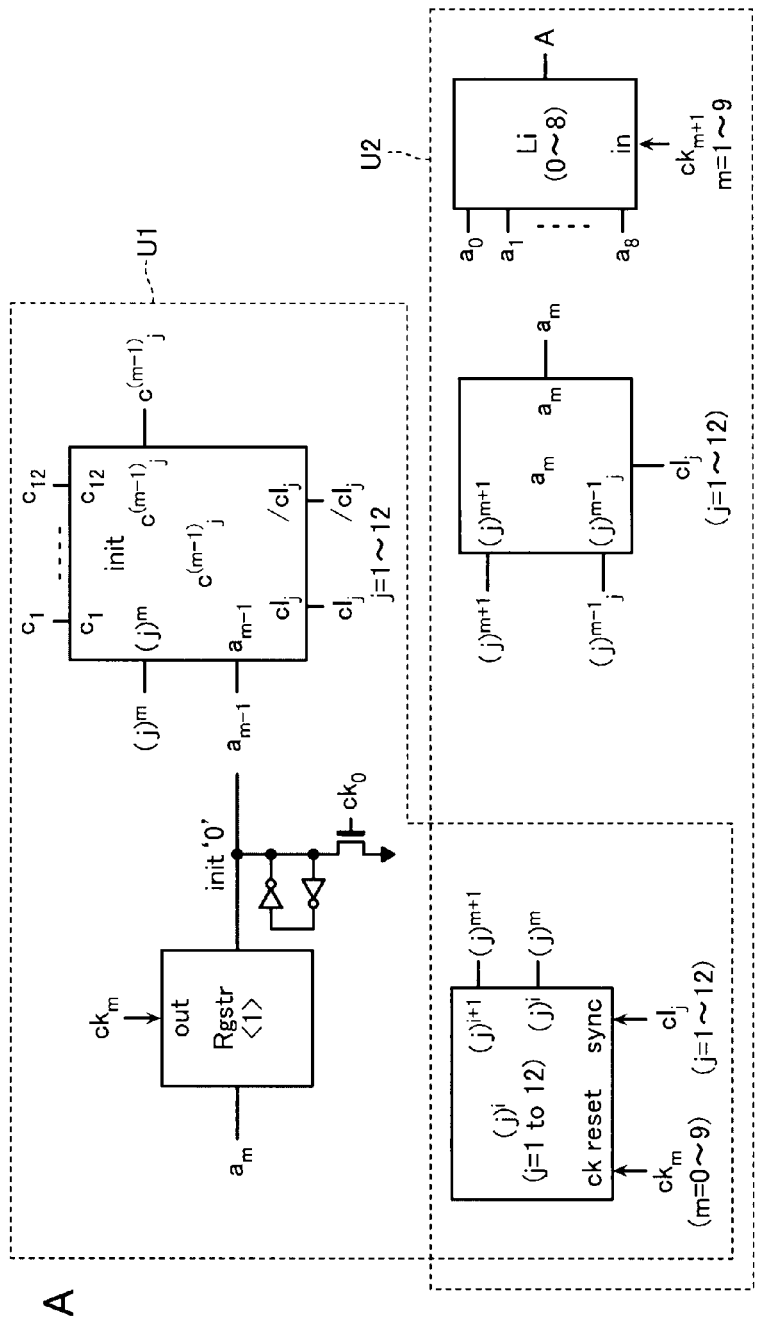
FIG. 77A is a block diagram of a computing circuit for deriving $C=CG^{-1}$ from $C=AG$ in the memory controller according to the present embodiment.
Figure 77B:
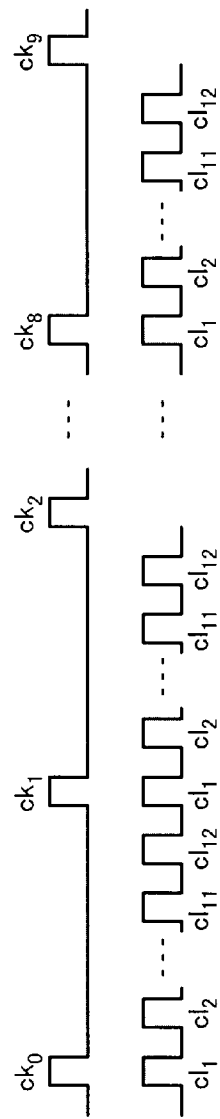
FIG. 77B is a diagram showing clocks for use in control of the computing circuit for deriving $C=CG^{-1}$ from $C=AG$ in the memory controller according to the present embodiment.

FIG. 77A is a block diagram of the inverse converting circuit, and FIG. 77B is a timing chart of the clocks ck and cl for use in control of the inverse converting circuit.

As shown in FIG. 77B, the clocks ck and cl are related such that the clock cl rises 12 times between the rise of a certain clock ck and the rise of the next clock ck.

The inverse converting circuit comprises a first part circuit U1 for converting the component of the Lee metric code C required for inverse conversion every time, and a second part circuit U2 for seeking the elements of the data code A one by one.

The first part circuit U1 includes a "$(j)^i$ (j=1 to 12)" circuit block, a "Rgstr" register, and a "$c^{(m-1)}{}_j$" circuit block.

The second part circuit U2 includes a "$(j)^i$ (j=1 to 12)" circuit block, an "$a_m$" circuit block, and a "Li (0-8)" register unit.

Among those, the "$(j)^i$ (j=1 to 12)" circuit block is shared with the first part circuit U1. The "$(j)^i$ (j=1 to 12)" circuit block is a circuit operative to generate the (m+1)-th and m-th powers of the element j in Zp for use in the "$a_m$" circuit block and the "$c^{(m-1)}{}_j$" circuit block. This circuit block uses m+1, the number of cycles of the clock ck, and, m, a 1-cycle lower number than this number of cycles, as indexes, and uses the number of cycles of the clock cl as j to provide $(j)^{m+1}$ and $(j)^m$.

The "$(j)^i$ (j=1 to 12)" circuit block provides the element in Zp itself to the "$a_m$" circuit block and '1' to the "$c^{(m-1)}{}_j$" circuit block in the 1st cycle of ck. The '1' fed to the "$c^{(m-1)}{}_j$" circuit block is originally not utilized in computation. Accordingly, it is required to put a thought in preventing '1' from exerting an influence on the operation result. Therefore, for the purpose of removing the influence of '1', the product operation in the first part circuit U1 turns the other input to '0' in the first cycle of the clock ck such that the result of the product operation becomes zero.

The "Rgstr" register in the first part circuit U1 is given a setting of $a_m$. The setting of $a_m$ is provided from the "Rgstr" register at the timing of the clock ck after the clock $ck_1$. Namely, the output $a_{m-1}$ from the "Rgstr" register is provided at the timing of the clock $ck_m$.

In the first clock cycle $ck_0$ of the clock ck, the initial value on the output node in the "Rgstr" register is set at '0' to exert no influence on the computation result as described above.

In sync with the clock $ck_m$, the "$c^{(m-1)}{}_j$" circuit block receives $a_{m-1}$ and $(j)^m$ output from the "Rgstr" register and the "$(j)^i$ (j=1 to 12)" circuit block, respectively. The "$c^{(m-1)}{}_j$" circuit block derives $c^{(m-1)}{}_j$, that is, the output from the first part circuit U1, from these inputs $a_{m-1}$ and $(j)^m$.

The initial value in the "$c^{(m-1)}{}_j$" circuit block is the restored code data C, and the setting in the "Rgstr" register at the clock $ck_0$ provides $c^{(-1)}{}_j = $ init C.

The "$a_m$" circuit block in the second part circuit U2 obtains $a_m$ at every 12 cycles of the clock cl in accordance with the computing equation shown in Expression 44. The $a_m$ created at the "$a_m$" circuit block is stored in the m-th register in the "Li (0-8)" register unit at the clock $ck_{m+1}$ that indicates the start timing of the cycles of the next 12 clocks cl.

After completion of all the clock cycles, the code data A is set and stored in the "Li (0-8)" register unit.

[CONCLUSION]

Either when 16-level MLCs are used or when 8-level MLCs are used in NAND flash memories, it has been essential to apply stable, accurate process steps for practical use.

With this regard, the memory controller and memory system according to the present embodiment makes it possible to ensure the reliability of data even if the MLC levels are set insufficiently. In accordance therewith, it is possible to develop further leveling of memory cells.

[Others]

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The above-described embodiment is described mainly assuming the memory controller in the case of h=4, p=13 though other h and p can be used to exert the similar effect as shown in FIGS. 3 and 5.

The use of the MLC NAND flash memory as the memory device is described though the memory device is not limited to this but rather can use multi-level storable memory cells (such as ReRAM), in a system accessible on a page basis, to which the present invention is similarly applicable.

What is claimed is:

1. A memory controller for controlling a memory device, said memory device including plural memory cells capable of storing d bits of data, said d being an integer of 2 or more, in accordance with plural physical quantity levels and operative to read/write data at every page composed of specific bits in certain ones of said plural memory cells,
wherein said memory controller, after reading data by said memory device, receives d pages at a time of page data stored in the same certain ones of said plural memory cells in said memory device, and then utilizes only the part corresponding to a p-value per data of d-bit, said p being a prime that satisfies $2<p<2^d$, as target data to detect and correct an error in said page data, each of bits of said data of d-bit being included in a different page.

2. The memory controller according to claim 1, wherein said memory controller, before writing data by said memory device, generates one data of d-bit per p-value from external input data to generate d pages of page data, and then sends said d pages of page data to said memory device at a time, each of bits of said of d-bit being included in a different page.

3. The memory controller according to claim 1, wherein p has the maximum value of primes of 2d or below.

4. The memory controller according to claim 1, wherein d=3, p=7.

5. The memory controller according to claim 1, wherein d=4, p=13.

6. The memory controller according to claim 1, further comprising a page buffer operative to hold page data to be read from/written in a page of said memory device and send/receive said page data to/from said memory device.

* * * * *